United States Patent [19]

Rakuljic et al.

[11] Patent Number: 5,440,669
[45] Date of Patent: Aug. 8, 1995

[54] PHOTOREFRACTIVE SYSTEMS AND METHODS

[75] Inventors: George A. Rakuljic, Santa Monica; Amnon Yariv, San Marino, both of Calif.

[73] Assignee: Accuwave Corporation, Santa Monica, Calif.

[21] Appl. No.: 908,298

[22] Filed: Jul. 2, 1992

Related U.S. Application Data

[63] Continuation-in-part of Ser. No. 736,736, Jul. 26, 1991, abandoned.

[51] Int. Cl.$^6$ .................... G02B 5/32; G03H 1/18; G03H 1/26
[52] U.S. Cl. .................................. 359/7; 359/1; 359/15; 359/22
[58] Field of Search ............... 359/1, 3, 4, 7, 10, 359/11, 22, 24, 35, 558, 566, 569, 575, 245; 365/106, 109, 117, 124, 125, 215, 216

[56] References Cited

U.S. PATENT DOCUMENTS

| | | | |
|---|---|---|---|
| 3,383,664 | 5/1968 | Chen et al. | 365/121 |
| 3,512,879 | 5/1970 | Reynolds et al. | 365/94 |
| 3,544,189 | 12/1970 | Chen et al. | 359/4 |
| 3,627,400 | 12/1971 | Caufield | 359/25 |
| 3,703,328 | 11/1972 | Glass et al. | 359/7 |
| 3,773,400 | 11/1973 | Amodei et al. | 359/7 |
| 3,799,642 | 3/1974 | Phillips et al. | 359/7 |
| 3,873,179 | 3/1975 | Burke | 359/7 |
| 3,912,391 | 10/1975 | Fleisher et al. | 355/54 |
| 3,915,549 | 10/1975 | Amodei et al. | 359/7 |
| 3,932,299 | 1/1976 | Phillips | 430/1 |
| 3,933,504 | 1/1976 | Phillips et al. | 430/2 |
| 3,997,350 | 12/1976 | Ikeo et al. | 430/2 |
| 4,052,119 | 10/1977 | Williams et al. | 359/7 |
| 4,062,618 | 12/1977 | Steensma | 359/11 |
| 4,094,575 | 6/1978 | Kellie | 359/10 |
| 4,111,524 | 9/1978 | Tomlinson, III | 385/37 |
| 4,153,330 | 5/1979 | Tomlinson, III | 385/35 |

(List continued on next page.)

FOREIGN PATENT DOCUMENTS

| | | |
|---|---|---|
| 0001714 | 5/1979 | European Pat. Off. |
| 0284908 | 10/1988 | European Pat. Off. |
| 2226127 | 6/1990 | United Kingdom |

OTHER PUBLICATIONS

WO,A 93/11589, PCT Publication (Honeywell Inc.), Jun. 10, 1993.
Patent Abstracts of Japan, vol. 9, No. 113, (P356) May 17, 1985 & JP,A,60 000 424, (Kitagawa Shiyunji) Jan. 5, 1985.
Applied Spectroscopy, vol. 39, No. 4, 1985, Baltimore US, pp. 582–586, W. B. Whitten et al., "Molecular Spectrometry with a Holographically Scanned CW Dye Laser and Supersonic Cooling".

(List continued on next page.)

*Primary Examiner*—William L. Sikes
*Assistant Examiner*—David R. Parsons
*Attorney, Agent, or Firm*—Merchant, Gould, Smith, Edell, Welter & Schmidt

[57] ABSTRACT

A new type of holographic recording in photorefractive crystals is disclosed, termed orthogonal data storage, in which counterpropagating, reflection mode holograms are wavelength multiplexed to form gratings lying along a common axis. It is shown that this configuration provides substantial improvements in data storage capacity in comparison to prior art systems and that higher coupling coefficients are achieved. In consequence, not only storage of data but a wide range of other devices including wavelength selective filters, lenses and optical correlation systems are disclosed. Further, methods of writing and processing metastable images are disclosed which substantially improve the strength of the gratings that are permanently developed in the medium. These methods include advantageous use of electrical potentials and photovoltaic properties, together with different interrelationships during processing.

55 Claims, 27 Drawing Sheets

U.S. PATENT DOCUMENTS

| | | | |
|---|---|---|---|
| 4,198,117 | 4/1980 | Kobayashi | 385/37 |
| 4,336,976 | 6/1982 | Rodemann et al. | 359/22 |
| 4,362,359 | 12/1982 | Dammann et al. | 385/37 |
| 4,420,217 | 12/1983 | Gerharz | 359/4 |
| 4,420,829 | 12/1983 | Carlson | 369/103 |
| 4,449,785 | 5/1984 | Huignard et al. | 359/3 |
| 4,452,533 | 6/1984 | Miles et al. | 356/352 |
| 4,522,462 | 6/1985 | Large et al. | 385/37 |
| 4,615,034 | 9/1986 | von Gunten et al. | 372/99 |
| 4,643,519 | 2/1987 | Bussard et al. | 385/37 |
| 4,669,811 | 6/1987 | McQuoid et al. | 359/15 |
| 4,671,603 | 6/1987 | McQuoid et al. | 359/15 |
| 4,726,655 | 2/1988 | Mahlein | 359/588 |
| 4,759,596 | 4/1988 | Po et al. | 385/37 |
| 4,770,496 | 9/1988 | Mahlein | 359/588 |
| 4,773,063 | 9/1988 | Hunsperger et al. | 370/3 |
| 4,805,185 | 2/1989 | Smith | 372/97 |
| 4,810,047 | 3/1989 | Pernick | 359/19 |
| 4,824,193 | 4/1989 | Maeda et al. | 359/34 |

(List continued on next page.)

OTHER PUBLICATIONS

Patent Abstracts of Japan, vol. 11, No. 171 (E-512) (2618) Jun. 2, 1987 & JP, A, 62,005 677 (Matsushita) 12 Jan. 1987.

Electronics Letters, vol. 21, No. 15, Jul. 1985, Enage GB, pp. 648–649, P. Mills et al., "Single–mode Operation of 1.55 μm Semiconductor Lasers Using a Volume Holographic Grating".

Electronics Letters, vol. 21, No. 20, Sep. 26, 1985, Enage GB, pp. 885–886, P. Mills et al., "Holographically Formed, Highly Selective, Infra-Red Filter in Iron-Doped Lithium Niobate".

RCA Review, vol. 33, Mar. 1972, Princeton US, pp. 71–93, J. J. Amodei et al., "Holographic Recording in Lithium Niobate".

Optics Letters, vol. 16, No. 19, Oct. 1991, Washington US, pp. 1481–1483, Henri Rajbenbach et al., "Low–Noise Amplification of Ultraweak Optical Wave Fronts in Photorefractive $Bi_{12}SiO_{20}$".

Electronics Letter, vol. 21, No. 15, Jul. 18, 1985, Enage GB, pp. 648–649, P. Mills et al. "Single-Mode Operation of 1.55 μm Semiconductor Lasers Using A Volume Holographic Grating".

Journal of Applied Physics, vol. 47, No. 12, Dec. 1976, New York US, pp. 5421–5431, Rajiv R. Shah et al., "Characterization of Iron-Doped Lithium Niobate for Holographic Storage Applications".

Topics in Applied Physics, vol. 20, 1977, Berlin, H. M. Smith, pp. 10–20, "Holographic Recording Materials".

Optics Communications, vol. 29, No. 1, Apr. 1979, Amsterdam NL, pp. 44–47, M. P. Petrov et al., "Light Diffraction From the Volume Holograms in Electrooptic Birefringent Crystals".

Xiaohui Ning, "Analysis of multiplexed-reflection holographic gratings," Journal of the Optical Society of American, vol. 7, No. 8, Aug. 1990, pp. 1436–1440.

David M. Pepper et al., "The Photorefractive Effect," Scientific American, Oct. 1990.

Vladimirtsev et al., "Optical Damage in Transition Metal Doped Ferroelectric," Ferroelectrics, vol. 22, 1978, pp. 653–654.

A. M. Glass, "The Photorefractive Effect," Optical Engineering, vol. 17, No. 5, p. 470 (Sep.–Oct. 1978).

Meyer et al., "Kinetics of Fixation of Phase Holograms in $LiNbO_3$," Phys. Stat. Sol., (a) vol. 53, p. 171 (1979).

Hertel et al., "Theory of Thermal Fixing and Application to $LiNbO_3{:}Cu^{2-}$" Phys. Stat. Sol., (a) vol. 104, p. 844, (1987).

W. Phillips et al., "Optical and Holographic Storage Properties of Transition Metal Doped Lithium Niobate," RCA Review, vol. 33, p. 94. (Mar. 1972).

Staebler et al., "Multiple Storage and Erasure of Fixed Holograms in Fe–doped $LiNbO_3$," Applied Physics Letters, vol. 26, No. 4, p. 182 (Feb. 15, 1975).

Staebler et al., "Thermally Fixed Holograms in $LiNbO_3$," Ferroelectrics, vol. 3, p. 107 (1972).

Amodei et al., "Holographic Pattern Fixing in Electro–Optic Crystals," Applied Physics Letters, vol. 18, No. 12, p. 540, (Jun. 15, 1971).

K. Blotekjaer, "Limitations on Holographic Storage Capacity of Photochromic and Photorefractive Media," Applied Optic, vol. 18, No. 1, p. 57, (Jan. 1, 1979).

W. V. Smith, "Large Capacity Holographic Memory," IBM Technical Disclosure Bulletin, vol. 15, No. 3, Aug. 1972.

Thomas Stone and Nicholas George, "Hybrid Diffractive-Refractive Lenses and Achromats," Applied Optics, vol. 27, No. 14, Jul. 15, 1988.

N. V. Kukhtarev et al., "Holographic Storage in Electrooptic Crystals. I. Steady State," Ferroelectrics, vol. 22, pp. 949–960, 1979.

Tom Parish, "Crystal Clear Storage," BYTE, p. 283, Nov. 1990.

(List continued on next page.)

U.S. PATENT DOCUMENTS

| | | | |
|---|---|---|---|
| 4,840,456 | 6/1989 | Fye | 372/97 |
| 4,879,167 | 11/1989 | Chang | 428/215 |
| 4,907,237 | 3/1990 | Dahmani et al. | 372/32 |
| 4,919,532 | 4/1990 | Mocker et al. | 356/28.5 |
| 4,923,270 | 5/1990 | Carter | 359/127 |
| 4,926,412 | 5/1990 | Jannson et al. | 370/3 |
| 4,927,220 | 5/1990 | Hesselink et al. | 359/7 |
| 4,965,152 | 10/1990 | Keys et al. | 430/1 |
| 5,026,131 | 6/1991 | Jannson et al. | 359/15 |
| 5,042,042 | 8/1991 | Hori et al. | 372/32 |
| 5,082,337 | 1/1992 | Chern et al. | 359/15 |
| 5,107,359 | 4/1992 | Ohuchida | 359/124 |
| 5,119,454 | 6/1992 | McMahon | 385/49 |

OTHER PUBLICATIONS

S. W. McCahon et al., "Hologram Fixing in $Bi_{12}TiO_{20}$ Using Heating and an AC Electric Field," *Applied Optics*, vol. 28, No. 11, Jun. 1, 1989.

G. D. Stucky et al., "Quantum Confinement and Host/Guest Chemistry: Probing A New Dimension," *Articles*, Feb. 9, 1990.

J. F. Scott et al., "Ferroelectric Memories," *Science*, vol. 246, p. 1400.

B. I. Greene et al., "All-Optical Nonlinearities in Organics," *Articles*, p. 679, Feb. 1990.

"High Resolution Volume Holography using Orthogonal Data Storage," Amnon Yariv et al., *OSA Topical Meeting on Photorefractive Materials*, Jul. 1991, pp. 130–132.

"Hologram indexing in $LiNbO_3$ with a tunable pulsed laser source," D. W. Woodbury et al., *Applied Optics*, vol. 18, No. 15, Aug. 1, 1979, pp. 2555–2558.

"Volume Phase Holographic Storage in Ferroelectric Crystals," W. J. Burke et al., *Optical Engineering*, vol. 17, No. 4, Jul.–Aug. 1978, pp. 308–316.

"Diffraction properties of fixed gratings in photorefractive media," C. Gu et al., *Journal of the Optical Society of American B: Optical Physics*, vol. 7, No. 12, Dec. 1990, pp. 2339–2346.

"Reconfigurable interconnections using photorefractive holograms," S. Wu et al., *Applied Optics*, vol. 29, No. 8, Mar. 10, 1990, pp. 1118–1125.

"Holographic Storage in Electrooptic Crystals. I. Steady State," N. V. Kukhtarev et al., *Ferroelectrics*, vol. 22, 1979, pp. 949–960.

RECORDING

READOUT

(a) $I(z) = I_0(1 + m \cos kz)$
(b) $P_{sc}$
(c) $E_{es} \sim \int P_{sc} dz$
(d) $n \sim r E_{sc}$

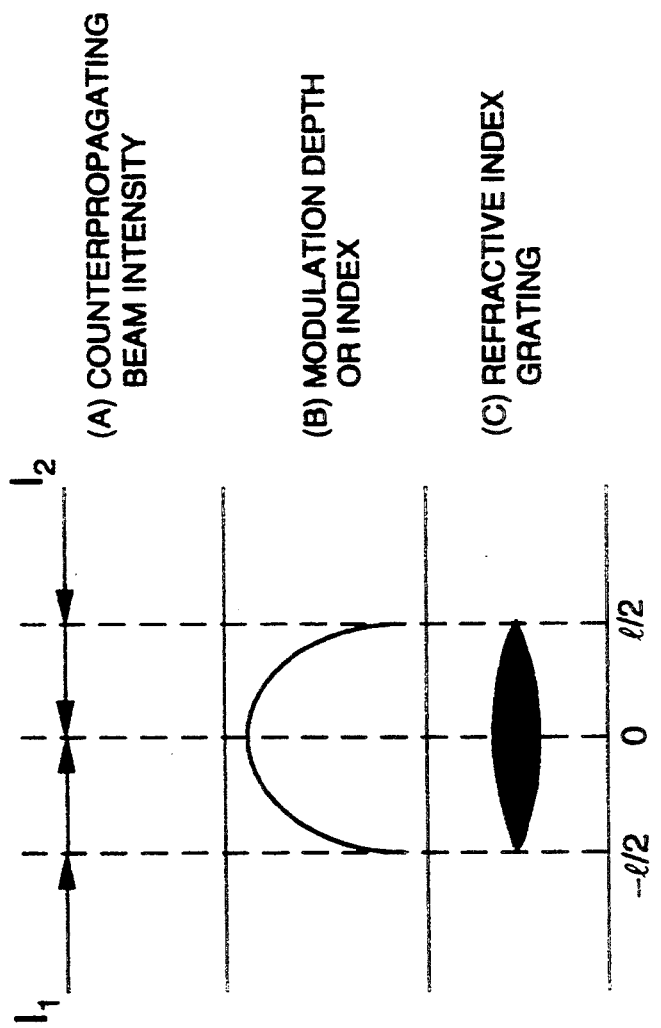
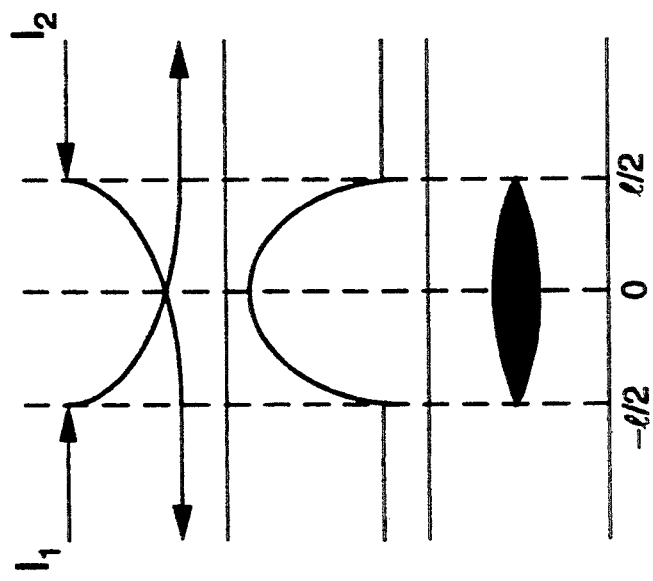

HOLOGRAPHIC GRATINGS

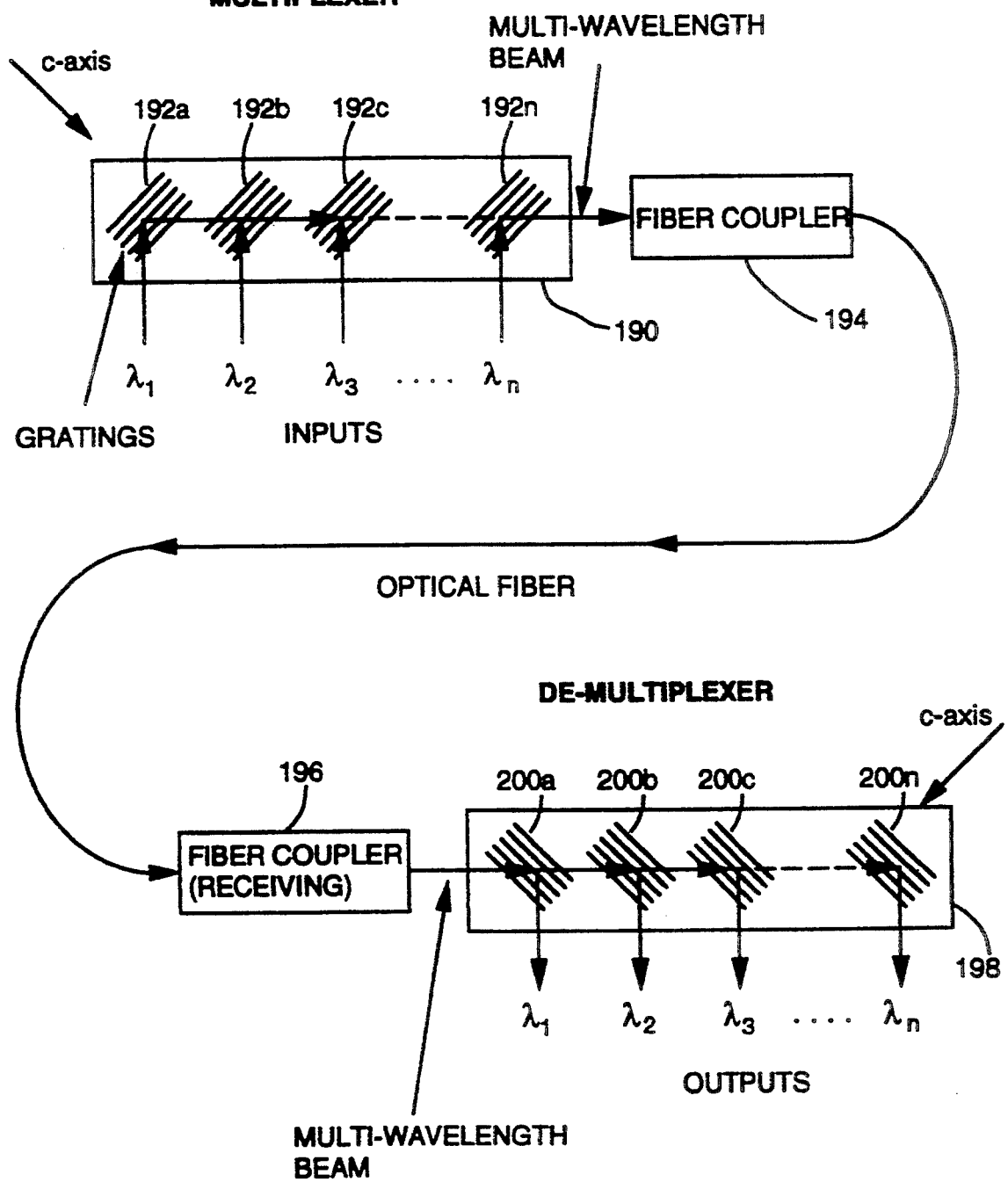

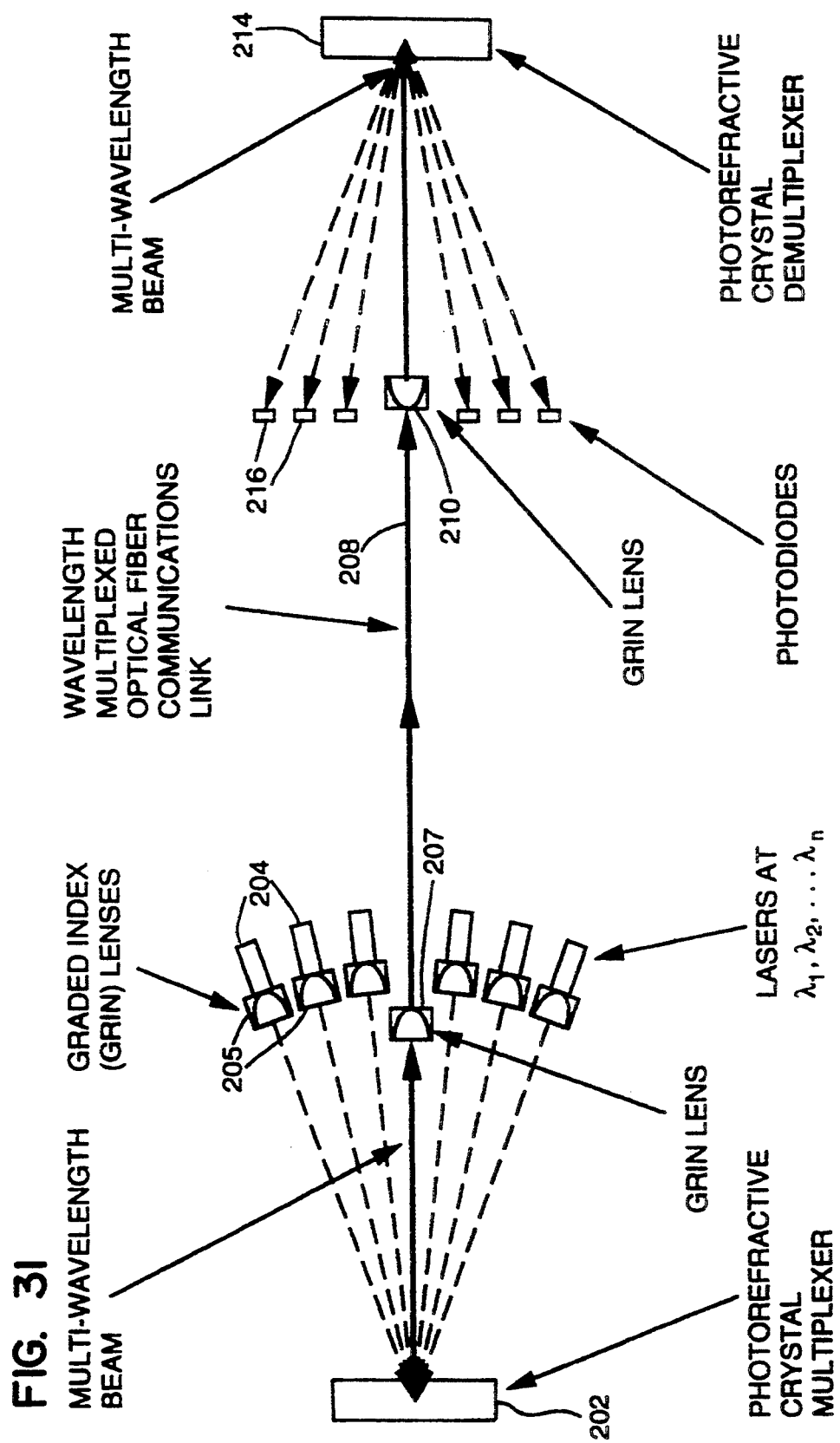

PHOTOREFRACTIVE SYSTEMS AND METHODS

CROSS-REFERENCE TO RELATED APPLICATIONS

This application is a Continuation-In-Part of application Ser. No. 07/736,736, filed Jul. 26, 1991, now abandoned by George A. Rakuljic, et al., entitled PHOTOREFRACTIVE SYSTEMS AND METHODS, which application is incorporated by reference herein.

BACKGROUND OF THE INVENTION

This invention relates to photorefractive systems and methods and more particularly to systems, devices, and methods using photorefractive media to form readable, permanent, high resolution, and high information content images, and to provide specialized optical devices.

The photorefractive effect has been known for many years, as pointed out in an article by David M. Pepper et al., entitled "The Photorefractive Effect," *Scientific American*, October 1990, pp. 62–74. The term "photorefractive" is applied to electro-optically active materials, such as what are generally referred to as the ferroelectrics, which exhibit a large response to incident electromagnetic wave energy. The useful materials are crystals of substantial thickness in contrast to films and layers, and are particularly suitable for true volume holographic applications. The role and history of the ferroelectrics in prior investigations until publication date was described in the book *Volume Holography and Volume Gratings* by L. Solymar and D. J. Cooke (New York, Academic Press Inc., 1981). This publication discusses not only theoretical considerations but also practical problems that have been encountered with volume holography in general and photorefractive holographic systems in particular.

Photorefractive materials have the property of developing light-induced changes in their index of refraction. This property can be used to store information in the form of holograms by establishing optical interference between two coherent light beams within the material. The spatial index of refraction variations are generated through the electro-optic effect as a result of an internal electric field generated from migration and trapping of photoexcited electrons. While many materials have this characteristic to some extent, the term "photorefractive" is applied to those which have substantially faster and more pronounced response to light wave energy. Examples of such materials include $LiNbO_3$ (lithium niobate), $LiTaO_3$, $Li_2B_2O_4$ (lithium borate), $KNbO_3$, $KTa_{1-x}Nb_xO_3$ (KTN), strontium barium niobate (SBN), barium strontium potassium sodium niobate (BSKNN or KNSBN), $Bi_{12}SiO_{20}$ (BSO), and $BaTiO_3$.

Soon after identification of this effect, it was recognized that by using the photorefractive effect together with holographic techniques, one can generate a volumetrically distributed pattern in the material in the form of a refractive index grating. The stored hologram can then be read out with a reference beam, as in other holographic systems. However, since the holographic gratings are distributed over a volume, the higher order diffraction terms that are present in thin holograms are suppressed.

A prominent early proposal for the use of photorefractive properties is contained in U.S. Pat. No. 3,544,189 to Fang-Shang Chen et al., entitled "Holography Using a Poled Ferroelectric Electric Recording Material." Chen, et al. described how electrons migrate along the electro-optic or c-axis in a lithium niobate crystal in response to varying light intensity, where they concentrate in low light intensity regions and define a charge distribution pattern. The localized electric fields generate local changes in the index of refraction through the electro-optic effect, creating a three-dimensional hologram in the form of an index grating distributed throughout the volume of the medium. Chen, et al. described how a multiplicity of holograms can be recorded in the same thick plane of material by using different beam angles, which can be done by turning the crystal or the beams through successive, very small angles. Using these techniques, workers in the art have calculated that a 1 $cm^3$ crystal is theoretically capable of storing $10^{12}$ to $10^{13}$ bits of information. Chen, et al. recognized that the images formed in this manner are impermanent (metastable) in the sense that they diminish with time and can be altered by incident light. They also proposed erasure of the image by heating it to at least 160° C. The technique of Chen, et al. forms transmission mode gratings or holograms because the reference and object beams are both incident on the same face of the crystal.

The concentration as well as type of dopant can be changed to achieve specific desired properties in the crystal. The photorefractive band of the crystal can be shifted, the sensitivity can be changed, and the absorption can be increased or decreased (see W. Phillips, J. J. Amodei, and D. L. Staebler, "Optical and holographic storage properties of transition metal doped lithium niobate," *RCA Review* vol. 33, pp, 94–109 (1972)). For example, the typical photorefractive band for 0.05% Fe-doped lithium niobate is in the range of 400 to 800 nm, but absorption and photorefractive properties can be shifted with higher dopant levels or by oxidation or reduction of the dopant in the crystal.

The fact that the recorded holograms are metastable, decaying even in the dark with time, has resulted in the development of techniques for fixing and developing permanent holograms. Metastable holograms formed by the electron charge patterns can be made permanent by heating the crystal to displace ions into a compensating pattern and then redistributing the electrons substantially uniformly throughout the volume. The method used was to heat the crystal containing the metastable electronic hologram so the ions redistributed themselves to cancel the space charge variation in the crystal. Then the crystal was cooled and the electronic grating erased by intense illumination, leaving only the permanent ionic grating to generate the index variation. Lifetimes of up to $10^5$ years were projected by extrapolating erase times measured at elevated temperatures (J. J. Amodei and D. L. Staebler, "Holographic recording in lithium niobate," *RCA Review* vol. 33, pp. 71–93 (1972)).

As discussed by W. Phillips et al., supra, however, the techniques currently used result in a generally inverse relation between photorefractive sensitivity and the diffraction efficiency of the holograms after fixing. The higher the dopant concentration, the more electron donors and the higher the sensitivity and refractive index change at the output up to a level of saturation, as also shown in Yu. V. Vladimirtsev et al. in "Optical Damage in Transition Metal Doped Ferroelectrics," *Ferroelectrics*, vol. 22, pp. 653–654 (1978). The known fixing techniques, however, degrade the hologram so that the fixed efficiency decreases as dopant level increases. There is therefore an inherent processing limitation on the utility of photorefractive devices that effectively limits the dopant concentration and therefore the magnitude of the photorefractive effect in fixed crystals. This must be overcome if the potential of this type of optical device is to be fully realized.

The Chen, et al. patent was preceded by an earlier patent by the same authors, U.S. Pat. No. 3,383,664, directed toward digital information storage in photorefractive media. Subsequent work has included a patent to J. J. Amodei et al., U.S. Pat. No. 3,915,549, concerning the use of iron-doped lithium niobate crystals to improve the sensitivity, followed by U.S. Pat. No. 3,932,299 to W. Phillips on the reduction of the trivalent iron ($Fe^{3+}$) to divalent iron ($Fe^{2+}$) in the Fe-doped lithium niobate crystals so as to increase the erase sensitivity and further reduce the time required for hologram formation. J. P. Huignard et al., in U.S. Pat. No. 4,449,785, titled, "Multiple Hologram Bulk Optical Storage Device" further expanded on the angle multiplex approach of Chen, et al., using the transmission mode and lithium niobate crystals. In this patent, transparent electrodes were attached to all faces of the material and electrically short circuited during writing so as to prevent saturation of the index of refraction after several storage operations. The problem here is that the amplitude of the variations in the space charge field, which are needed for high diffraction efficiency, is not increased.

Equations describing the photorefractive effect have been derived by N. V. Kukhtarev et al., "Holographic storage in electro-optic crystals. I. Steady state," *Ferroelectrics* vol. 22, pp. 949–960 (1979). For a one carrier, single dopant type model, with electrons being the sole charge carrier, which is true in general for many of the previously mentioned materials, this process is described in the steady state by:

$$\frac{1}{e} \nabla \cdot J = \frac{\partial}{\partial t} (n - N_D^+) = 0 \text{ (Continuity Equation)} \quad (1a)$$

$$\frac{\partial N_D}{\partial t} = - \left( \frac{sI}{\hbar\omega} + \beta \right) N_D + \gamma n N_D^+ = 0 \text{ (Rate Equation)} \quad (1b)$$

$$J = e\mu n E + k_B T \mu \nabla n \text{ (Current Equation)} \quad (1c)$$

$$\nabla \cdot E = -\frac{e}{\epsilon} (n + N_A - N_D^+) \text{ (Poisson's Equation)} \quad (1d)$$

$$N_D + N_D^+ = N_0 \text{ (Conservation Equation)} \quad (1e)$$

In the preceding equations, $N_D$ is the electron donor density, $N_D^+$ is the trap density, $N_A$ is the density of non-photoactive ions, $N_0$ is the total dopant density, J is the current density, E is the electric field, I is the light intensity, $\beta$ is the dark decay constant, $\gamma$ is the recombination rate, $\mu$ is the mobility, , n is the electron density, $k_B$ is Boltzmann's constant, s is the photoionization cross section, $\epsilon$ is the permittivity, e is the electron charge, $\hbar\omega$ is the photonic energy of the light, T is the temperature (in degrees K), and t is the time.

In the prior art, the holograms were usually written in transmission mode with angular multiplexing, which is storing different holograms with different object to reference beam angles (F. H. Mok, M. C. Tackitt, and H. M. Stoll, "Storage of 500 high resolution holograms in a $LiNbO_3$ crystal," *Opt. Lett.* vol. 16, pp. 605–607 (1991)), or by rotating the crystal for each new exposure while keeping the object to reference beam angle constant (W. Phillips et al., supra). Lithium niobate has often been used because of its long dark lifetime and the capability to fix the gratings. Most photorefractive work in $LiNbO_3$ has been done with Fe-doped crystals with dopant concentrations of up to 0.015%. F. H. Mok et al. demonstrated storing 500 image-bearing holograms, each with an unfixed diffraction efficiency of approximately 0.01 in a 1 $cm^3$ crystal (F. H. Mok et al., supra).

One would perhaps superficially assume that the earlier angle multiplexing techniques would be combined with the subsequent fixing and development methods to create high density holographic storage media capable of optical readout. However, useful three-dimensional information storage systems have not yet been implemented, as far as is known. There are many interrelated factors that explain why this is the case, and these are included in the publication *Volume Holography and Volume Gratings* and in the *Scientific American* publications, supra. The dopant level should be high for fast response time, sensitivity, and to generate substantial electrical fields, but as noted above a metastable image of relatively high diffraction efficiency cannot be made permanent at that same efficiency. In addition, there are wave mixing and coupling effects that must be taken into consideration. The hologram being generated in a photorefractive crystal, as noted by Solymar, et al., itself can affect and interact with the incident wave energy, causing the initially sinusoidal grating pattern to become highly non-sinusoidal. Waves incident at different angles relative to the preferential migration path along the c-axis introduce scattering and also generate holograms of different diffraction efficiency. Further, when holograms are written serially but coextensively within the same volume, the later holograms non-uniformly reduce the diffraction efficiencies of the previous ones under the present methodology. Study of the angle multiplex type of data storage system using what is known as "K-space" analysis (K being the "grating vector" of Solymar, et al.) shows that such factors dictate that the crystal volume cannot be utilized with optimum efficiency. A hologram, especially one with high data content, recorded at one angle will have crosstalk with a hologram at another angle unless the angles are adequately separated or the information is bandwidth limited.

Prior investigations have established a number of useful individual techniques without, however, resulting in material benefit in terms of the final product. For example, it is known that if writing and fixing simultaneously take place at high temperature, a larger electronic grating can be formed, which leads to an increase in fixed hologram diffraction efficiency. However, as will be shown later, the shortcoming of fixed gratings lies in the fixing process itself and not in the original writing process, as shown by the large effects obtained by Vladimirtsev, supra. Moreover, the holograms cannot be read out in an equally high temperature environment, and readout at ambient temperature requires compensation for thermal expansion effects which are considerable. Also, angle multiplexing by itself requires an extremely precise positioning system for both writing and reading, since the field of view of such holograms is extremely small. The present invention incorporates features applicable to this very high temperature method to obtain very large fixed photorefractive effects.

Using the simultaneous writing and fixing method just described, the RCA group had succeeded in storing up to 100 holograms with diffraction efficiencies of up to 30% in a 0.02% Fe-doped LiNbO$_3$ crystal (D. L. Staebler, W. J. Burke, W. Phillips, and J. J. Amodei, "Multiple Storage and Erasure of Fixed Holograms in Fe-doped LiNbO$_3$," *Appl. Phys. Lett.* vol. 26, pp. 182-184 (1975)). These results were considerably better than have been subsequently obtained by other groups attempting to duplicate the experiment. Through private communication with W. Phillips and reconstruction with him of the experimental setup, it is believed that they unknowingly used their heating system while the holograms were being written in a manner which is now understood to be advantageous in one respect in writing and fixing high resolution, high diffraction efficiency holograms.

The photorefractive effect produces only small changes of refractive index, of the order of $10^{-4}$ as shown by the RCA work, because of the limited extent of internal physical dislocation which it can induce. Therefore, if a recorded hologram is not efficiently readable with devices affording currently available signal-to-noise ratios, the potential of the photorefractive medium cannot be efficiently utilized or much more sensitive and expensive signal detectors must be used.

Therefore, there are a number of specific factors that must be considered in devising improved photorefractive devices and systems. These include the amount and nature of the incorporated dopant, the susceptibility tensor, the photovoltaic properties of the medium, the wavelength of the light and range within which the medium is photorefractive, the beam directions, the thickness of the medium, and diffusion and drift effects. Any and all of these factors can affect the resolution of the hologram and the ability to detect or respond to information or patterns contained within the medium.

Nonetheless, the theoretical capabilities of photorefractive media, combined with modern imaging technology, offer unique potential for data storage and processing. Media of comparable size to video, CD (audio), and mixed audio and video discs, but with orders of magnitude greater storage capacity, would then become feasible. Further, the greater bandwidths demanded by high definition television can be accommodated within a single photorefractive storage medium. For practical use, however, the system for reading this information out should not only be economical, but electronically controllable for high data rate, wide bandwidth responses.

The *Scientific American* article describes a variety of new and surprising applications of photorefractive media that are now being studied and developed. Photorefractive materials are in the general class of nonlinear optical devices, which are relatively recent subjects of investigation and implementation. Improved understanding of the phenomenon and improved processing methods offer possibilities for many new devices and systems for controlling or utilizing propagation of wave energy, whether it be in imaging, communication, or data processing systems. The great amount of research directed to the subject of photorefractive properties and holographic systems, in contrast to the relatively limited number of devices using photorefractivity, shows that a disparity exists between theory and practice. This was further affirmed by the observations of Solymar et al., supra as to the decline in optimism that new applications would be implemented. Solymar et al., supra, discuss some of the many possible photorefractive devices using volume holography that had been considered up to the time of publication, such as mass memories, couplers, lenses and multiplexers, but to the present there do not appear to be commercially suitable versions of such devices. When one considers that photorefractive materials function at the submicroscopic scale of electrons and ions, in contrast to the much larger microscopic resolution of optical contour variations, or magnetic or magneto-optic patterns on memory disks, it is evident that a great potential exists for high capacity memories. Moreover, as noted by Solymar et al., supra, there are now many other possibilities that arise from the ability to generate and modify monochromatic wave energy and optical images. Given the volumetric properties of photorefractive crystals, the different materials now available and the ever continuing demand for performance and lower cost in modern technology, a unified approach to the formation of high resolution, high density, essentially permanent holograms that are easily readable affords significant opportunity for expansion of the field.

SUMMARY OF THE INVENTION

Systems and methods in accordance with this invention take advantage of either or both of two independent, significant concepts. One is that the interaction between coextensive and volumetrically distributed holograms is minimized by establishing orthogonality between the two dimensional image or data plane and the holographic grating wavevectors. This is accomplished by recording the holograms in reflection mode with counterpropagating object and reference beams and using a different wavelength for each hologram. The writing beams impinge on the storage medium from opposite sides, and in the precisely counterpropagating case the two beams are exactly 180° apart. The other concept is that holograms written in photorefractive crystals are permanently stored or "fixed" without significant loss of diffraction efficiency by controlling internal and external electric fields as well as temperature during the fixing process.

For many applications using photorefractive materials, there is a synergism between these two concepts. Reduced crosstalk between holograms, derived from the combined use of orthogonality, and permanent fixing significantly contribute to expansion of photorefractive devices to a wide variety of applications such as mass data storage devices, optical processors, correlators, and filters.

Information in the form of images is stored as holograms in volume photorefractive materials, with each hologram being written by the interference between an object beam, which is spatially modulated with data in the form of an image, and a plane or slightly spherical reference beam. In accordance with the present invention, reflection mode geometry was selected to take advantage of the properties of the material, with best results being obtained with the object and reference beams in direct opposition in a counterpropagating configuration. For maximum grating strength, the grating wavevector K is disposed parallel to the optical or c-axis of the crystal. Non-collinearity between the I vector and the c-axis can still be used for holographic storage but with some reduction of efficiency although there can be certain system design advantages. Different holograms are separated by using a different narrowband wavelength for each image, with the wavelengths very closely spaced if desired. The object beam can carry digital data or analog images in the form of pattern variations. When unmodulated uniform waves are used as the object beam, the low crosstalk and narrow bandwidth feature of the holographic grating are highly useful in providing wavelength specific reflection filters for applications such as spectroscopy, imaging filters, wavelength multiplexing or demultiplexing, and optical tuners.

The low crosstalk features of this orthogonal optical data storage scheme enable large amounts of digital data to be stored with fast parallel readout, and many separate holograms to be stored within a narrow wavelength range. To reconstruct a stored holographic image, the crystal is illuminated by a readout beam of the appropriate wavelength which is incident along the axis of the original writing beam. The entire body of information stored in the crystal can be read out very quickly by scanning the illumination source over the total wavelength range but leaving its direction fixed.

The materials used in this invention are selected photorefractive crystals, with the crystals having sufficient concentrations of electron donor sites, electron traps, and thermally mobile ions. The ions are necessary for fixing, or converting the metastable electron grating into a permanent, ionic grating. While a variety of different photorefractive materials can be used, it is preferable to use a material where the internal diffusion field is roughly comparable to the limiting electronic space charge field. In addition, a large photovoltaic effect is also desired to enhance the writing, fixing, and developing processes used in this invention. Materials suitable for this invention include lithium niobate with dopant levels as large as 0.1% or more. The counterpropagating reflection mode geometry allows use of these higher dopant levels which increases the photorefractive sensitivity of the crystal.

After the electronic grating is written, the electron distribution reverts back to a uniform distribution due to thermal excitation and erasure upon illumination during readout. For this reason, fixing the holograms by replacing the metastable electronic grating with a permanent ionic grating is a necessary step for practical devices. In accordance with this invention, substantial improvement in the ratio of fixed to pre-fixed grating strength (fixing efficiency) has been demonstrated by a combined use of reflection mode (counterpropagating) geometry, appropriate dopant concentration, and electric field control. These process improvements are verified by the underlying physical equations, which are developed later in this disclosure.

The following is a brief summary of the steps used in a method for obtaining a high diffraction efficiency, permanent holographic grating in a photorefractive material. Note that some of the steps may be omitted or modified for specific applications or if less than optimum results are acceptable. Before writing any gratings, the crystal is completely erased by heating to approximately 230° C. for at least 30 minutes while electrically shorted by wrapping in metal foil. This process serves to neutralize internal and surface space charge fields and redistribute all charge carriers out of trapping sites. At this point, the crystal has uniform electronic and ionic spatial distributions.

Prior to writing, the crystal is covered by a transparent, electrically conductive material, as for example an anti-static fluid or thin film of carbon or metal, on all surfaces. The crystal is then exposed by the object and reference beams to write the holograms while electrically shorted. The crystal was oriented with the grating wavevector parallel to the c-axis to maximize the diffraction efficiency, although other orientations can be used if a less than maximum effect suffices. The exposure energy for optimum diffraction efficiency varied with the material characteristics of the crystal. After exposure, the crystal contains an electronic space charge grating that follows the spatial distribution of the light interference pattern that was established within the crystal.

The anti-static coating is then carefully removed as a precaution so that it will not contaminate the crystal when heated in the fixing step to follow. The crystal is again shorted by wrapping it in metal foil and heated to its fixing temperature, which is typically on the order of a few minutes at 160° C. In this stage the ions migrate to compensate the electronic space charge field, so the ionic grating mimics the spatial distribution of the electronic grating. The crystal is then cooled back to ambient temperature, removed from the metal foil, and developed by erasing the electronic grating which is accomplished by exposing the crystal to intense light.

During the development process, where the original electronic grating in the crystal is erased, leaving only the permanent ionic grating, improved results can be obtained in the presence of a large dc field. One method is by applying an external dc field while the electronic grating is being erased. Another preferred method is holding the crystal open circuited and allowing the photovoltaic field in materials with a photovoltaic effect to build up during its exposure to the intense illumination. The result of these steps is a permanent, ionic volume holographic grating stored in the crystal.

The procedure of writing the gratings while shorted, fixing while shorted, and developing with a field, which are described in the preceding paragraphs, independently yield improvements over the prior art. In most of these experiments lithium niobate doped with at least 0.01% Fe was used. The improvements demonstrated by this invention were most pronounced for reflection mode, counterpropagating gratings, although increases over the prior art were observed for non-counterpropagating reflection and also transmission mode gratings. Other crystal types (such as lithium tantalate) have been found to be suitable materials for this process as well.

Digital and analog storage systems in accordance with this invention enable storage with data densities greater than in the current art. A photorefractive crystal can be used to store multiple wavelength-multiplexed holograms in a counterpropagating geometry with sub-Angstrom wavelength separation. Each hologram can contain a high spatial resolution image (with feature size on the order of microns), or the image can be a 2-dimensional array of digital 1 or 0 bits, also micron sized. In the digital case, the data can be recorded sequentially with a wavelength scanning beam or in parallel using a flood beam spatially modulated with the desired pattern.

For readout, a source is employed that directly illuminates the crystal at one or more of the recorded wavelengths. This source need not be coherent, although the high spectral resolution of the holograms makes using a coherent source desirable. This readout source may be a single tunable source or a bank of switchable, individual sources for each desired wavelength. If the images have pixel resolutions of 1,000×1,000 (from a large CCD array, for example), and 1,000 holograms are stored at different wavelengths, one gigabit of data can be stored in the crystal with parallel access at speeds unattainable in an electromechanical system. In such a system, the access speed is limited only by the scanning or switching speed of the readout illumination wavelength, and the associated processing electronics.

The data storage potential of volumetric holographic devices in accordance with the invention is so high (theoretically $10^{13}$ bits per cm$^3$) that they greatly exceed the capacities of available high speed parallel writing and reading devices. Spatial light modulators and readout matrix arrays are currently limited to about $10^6$ bits. Although these are constantly being expanded, they are not likely to approach the image density of the photorefractive medium. Thus it is within the concept of the invention to record and reproduce images in multiple sectors, employing relative motion of the medium or of the beams, by electronic or electro-mechanical means. In consequence entertainment programs can be recorded and reproduced that have vast data content. High-definition television signals can be recorded that cover several hours of programming, for example, especially if video compression and decompression techniques are used.

In addition to memory applications, another example of a system in accordance with this invention is a correlator for image analysis. Holograms of the Fourier transform of images are stored in a photorefractive crystal. By reflecting the Fourier transform of an object (in a beam of the appropriate wavelength) off the stored transform, the product of the two Fourier transforms is obtained. The Fourier transform of this product gives the desired correlation result. Many reference holograms can be stored in this manner at different wavelengths and their correlation to an object image can be obtained simply by tuning the object image wavelength and selecting the best match.

Another application of the narrow bandwidth holographic storage properties of this invention is in holographic optical filters. Such filters, with bandwidths of less than an Angstrom, offer significant new possibilities in such fields as astronomy, optical communications, and computers. These filters are fabricated by recording unmodulated, counterpropagating geometry holograms in a volume photorefractive crystal at the desired wavelength. The filter reflects only at the design wavelength, with bandwidths measured in tenths of Angstroms, depending on the thickness of the filter. By changing the beam orientations during writing, these holographic filters can reflect incident light in any direction. Multiple wavelengths filters can also be constructed by storing more than one wavelength multiplexed hologram in the crystal, either in a superimposed or spatially separated configuration.

The filter described above has a specific application in improved telescopes for solar astronomy. For example, solar activity at the $H_\alpha$ line (6562.8 Å in air), or any another absorption wavelength of interest, can be viewed using this holographic filter to reflect light as part of an optical imaging system. The center wavelength of the crystal can be tuned by changing its incident angle, temperature, or electric field in the case of piezoelectric or electro-optic crystals. This enables viewing of solar activity at the specified wavelength in real time with higher efficiency, spectral resolution, and overall performance than is currently available (e.g. Lyot filters).

While plane reflection filters have been mentioned above, a variation of this approach extends the application. By using a spherical wave as one of the writing beams when recording the holographic filter, a frequency selective reflector that also focuses or defocuses the incident wave can be fabricated. In addition, multiple reflectors can be written in the same crystal with different wavelengths, with each having its own focal point and length.

Narrow linewidth filters as set forth in this invention are a significant contribution to wavelength division multiplexing and demultiplexing in optical telecommunications systems. A number of holograms, each reflecting a different wavelength, are positioned serially and at angles relative to a principal optical path. A polychromatic light beam can be divided into its separate wavelength components with such a device, or the reverse can be done by reversing the beam directions. The high selectivity of holographic filters enables the wavelength channels to be placed very close together, significantly increasing the number of channels that can be simultaneously carried in a single optical fiber.

The selective filter properties of the holographic gratings written in accordance with this invention are also useful in laser systems and instrumentation. These very high resolution, high accuracy reflectors enable construction of lasers with corresponding high resolution and high accuracy emission wavelengths. In particular, such a filter can be used as the reflector in an external cavity configuration to precisely control the lasing wavelength of a semiconductor laser. The filter can also be used as the tuning elements in spectrometers, imaging spectrometers, and tuners for wavelength division multiplexing systems.

BRIEF DESCRIPTION OF THE DRAWINGS

A better understanding of the invention can be gained by reference to the following description, taken in conjunction with the accompanying drawings, in which:

FIG. 15 comprises two sets of three waveforms (A), (B), and (C) each, useful in describing (FIG. 15(a)) how apodization effects are realized in Orthogonal Data Storage due to absorption and (FIG. 15(b)) the apodization effects which arise in Orthogonal Data Storage from partial incoherence;

FIG. 30 is a simplified representation of an optical wavelength division multiplexer and demultiplexer system with spatially separated holographic gratings for each wavelength channel in accordance with this invention; and FIG. 31 is a simplified representation of an optical wavelength division multiplexer and demultiplexer system where the multiplexer contains angularly separated holograms corresponding to the wavelength channels in a common volume and the demultiplexer consists of holographic converging mirrors in a common volume to focus each wavelength channel beam onto its corresponding detector.

DETAILED DESCRIPTION OF THE INVENTION

High Efficiency Reflection Mode Holograph Systems

Introduction

The following description and examples of techniques and approaches in accordance with this invention will be best and fully understood by reference to the articles and patents alluded to in the Background of the Invention section. While the examples of methods and devices are self explanatory, the differences from the prior art and the potential ramifications can be better appreciated by comprehensive analysis of the equations governing solid state and optical physics. In this context, the following Glossary of Terms is provided to define the quantities commonly used in the sections to follow:

| Glossary of Terms | |
|---|---|
| K | Grating wavevector |
| K | Magnitude of the grating wavevector |

-continued

| | Glossary of Terms |
|---|---|
| $\Lambda$ | Grating wavelength |
| $\lambda$ | Wavelength of incident radiation |
| $N_D$ | Density of donor sites |
| $N_D^+$ | Density of acceptor sites (traps) |
| n | Density of electrons |
| $N_A$ | Density of non-photoactive compensatory ions |
| $N_0$ | Total dopant density |
| J | Current density |
| E | Electric field |
| I | Intensity of light (spatially varying) |
| m | Modulation index |
| $\rho$ | Charge density |
| $\beta$ | Dark decay (thermal decay) constant |
| $\gamma$ | Electron-trap recombination rate |
| $\mu$ | Mobility of the electrons |
| $\mu_A$ | Mobility of ions |
| $k_B$ | Boltzmann's constant |
| s | Photoionization cross-section |
| $\epsilon$ | Permittivity of the material |
| $\hbar\omega$ | Energy per photon of the incident light |
| $\sigma_p$ | Photoconductivity |
| $\sigma_d$ | Dark conductivity (generally much less than the photoconductivity) |
| T | Temperature in degrees K |
| t | Time |
| $E_d$ | Diffusion field at ambient temperature |
| $E_d(T)$ | Diffusion field at elevated fixing temperature T. |
| $E_q$ | Limiting space charge field (maximum space charge field that can be supported in the crystal) |
| $E_0$ | DC electric field |
| $E_1$ | Sinusoidal electric field variation, which is the space-charge field |
| $\kappa$ | Coupling constant |
| l | Thickness of the photorefractive crystal |
| $J_{PV}$ | Photovoltaic current density |
| $E_{PV}$ | Photovoltaic field |
| $\kappa_{PV}$ | Photovoltaic constant |
| $\alpha$ | Absorption constant of the crystal |
| $n_0$ | Bulk index of refraction |
| $n_1$ | Sinusoidal index of refraction modulation due to the photorefractive effect |
| e | Charge of the electron |
| $r_{eff}$ | Effective electro-optic coefficient |

Image Storage and Readout Example

Figure 1A:
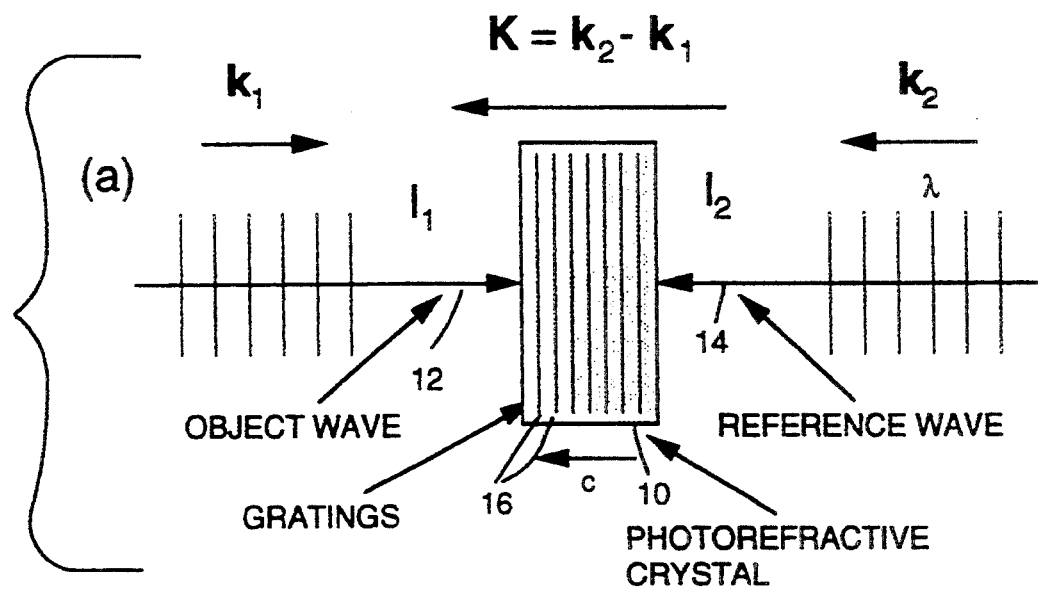
FIG. 1 is a generalized schematic view of a volumetric photorefractive crystal comprising FIGS. 1(a) and 1(b); in which gratings are recorded (FIG. 1(a)) with counterpropagating beams at a given wavelength in reflection mode, and wherein on readout (FIGS. 1(b)) the gratings reflect a reproduction of the original reference beam when illuminated by an object beam.
Figure 1B:
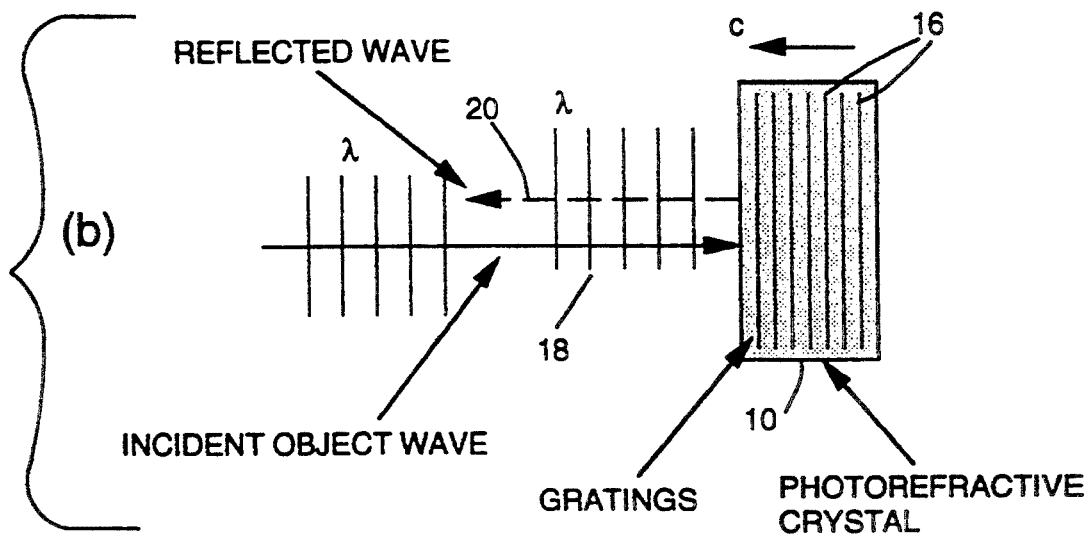

FIG. 1 is an example of the general case of image storage and readout in photorefractive materials in accordance with this invention. In FIG. 1, a photorefractive crystal 10 is shown that is cut in a geometry with its broad faces perpendicular to its preferred electron migration direction (the c-axis) and with a limited thickness (i.e. approximately 2 mm in this example). A material that is below its Curie temperature, or cubic to ferroelectric phase transition, at room temperature, such as LiNbO₃, is used in this example. The material has a significant dopant level, such as 0.025% or greater of iron, with a balance between two ionization states to establish photorefractive sensitivity over a given wavelength range, such as 400 to 800 nm. Such a material has the desired fundamental properties such as transparency, high concentrations of electron donors and traps, thermally mobile ions, and the capability of generating substantial internal photovoltaic fields.

Figure 2:
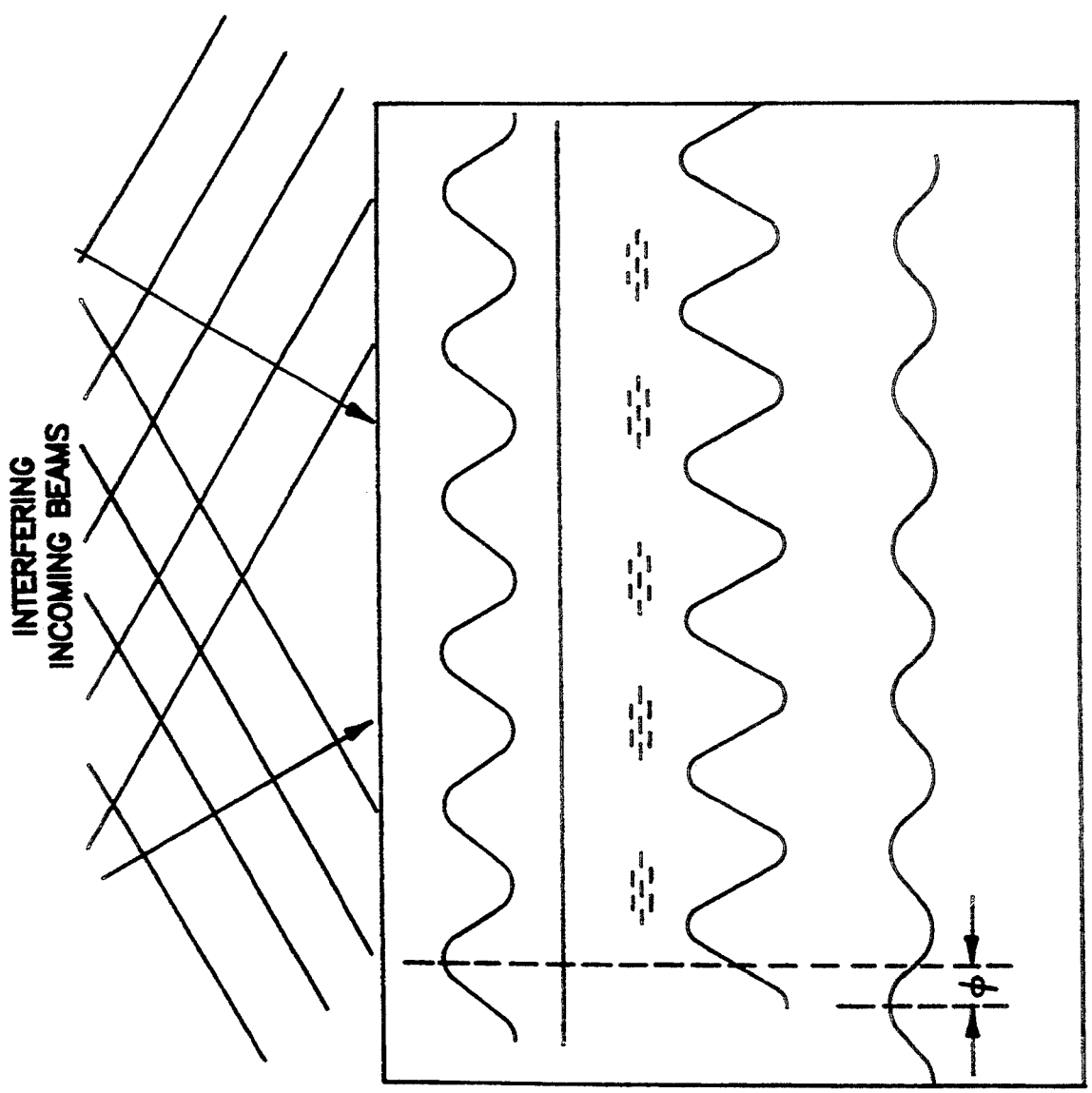
FIG. 2 is a schematic diagram of grating formation in a photorefractive crystal, useful in explaining the manner in which a light interference pattern causes charge migration resulting in localized space charge electric fields and consequently an index of refraction variation through the electro-optic effect.

To write a hologram in the crystal 10 of FIG. 1, an expanded object beam 12, forming an essentially planar wavefront in this example, is directed against one broad face of the crystal 10, while a reference beam 14 which is also planar is directed against the opposite broad face in a counterpropagating configuration. The two beams 12 and 14 are monochromatic, that is at the same wavelength $\lambda$, and parallel to the c-axis of the LiNbO₃ crystal 10 in this example. With other photorefractive materials, the optimum direction of the c-axis may not necessarily be parallel to the two counterpropagating writing beams. The two writing beams interfere and form a sinusoidal interference pattern in the crystal, which is given by $$I(z) = I_0[1 + m\cos(K_z)], \quad (2)$$

where $I_0$ is the dc intensity, m is the modulation index, K is the magnitude of the wavevector K of the interference pattern, and z is along the direction of the interference pattern wavevector, as shown at curve (a) in FIG. 2. More complex spatial intensity modulations in the object beam can be decomposed as an angular spectrum of plane waves, as discussed in a later section.

Referring back to FIG. 1, the interference pattern of the two writing waves is stored as an index grating hologram 16 in the photorefractive material. When the material 10 with the grating 16 is illuminated with a beam 18 of the same wavefront and direction as one of the writing beams, the other beam is reproduced as a reflected wave 20. This holographic grating is fixed, or made permanent, using the techniques set forth in this application.

Figure 3:
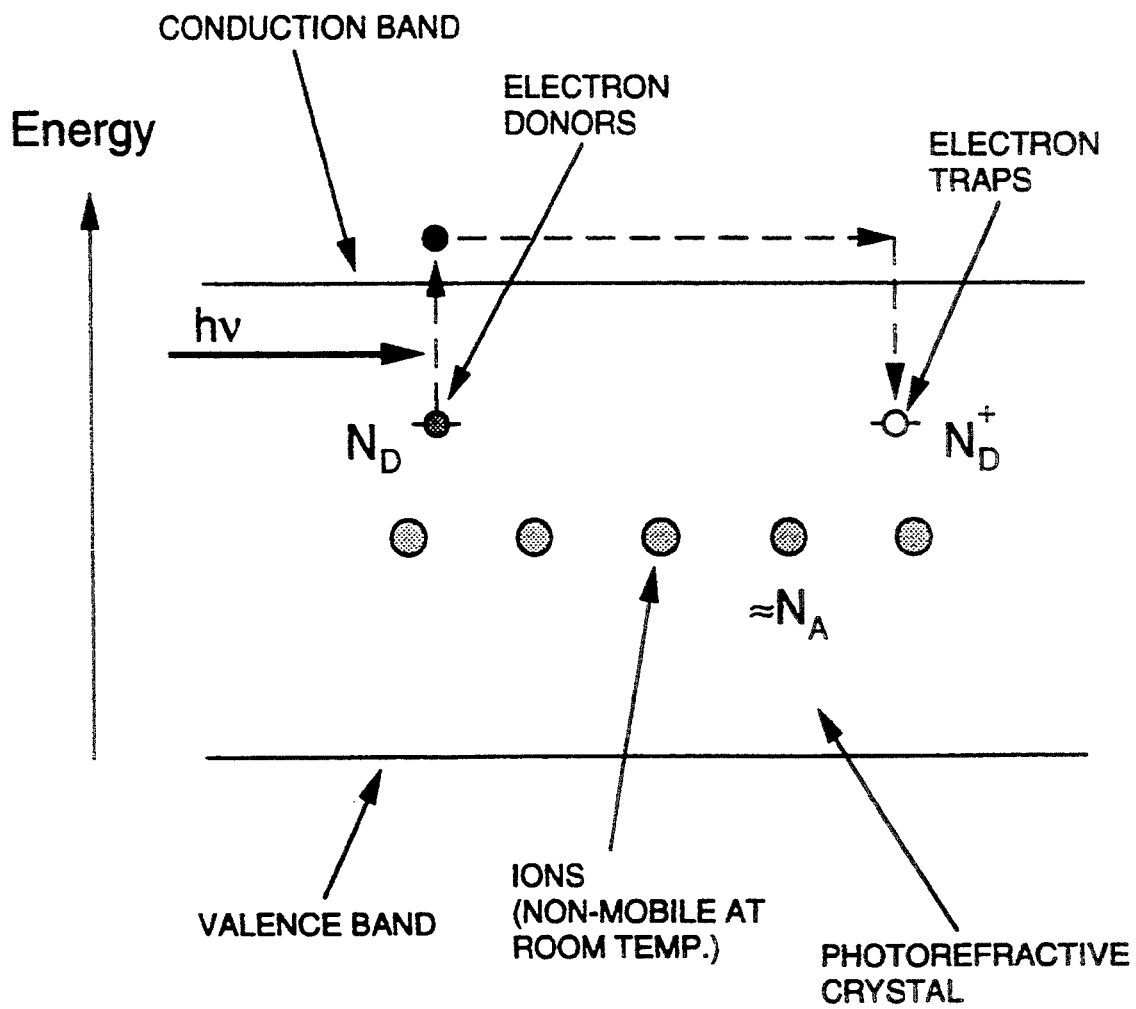
FIG. 3 is an idealized diagram of energy levels in photorefractive materials, depicting the manner in which electrons are photoexcited from donor sites into the conduction band, where they drift or diffuse until they are retrapped into trapping sites.

The photorefractive crystal 10 contains electron donor and trapping sites, which are usually formed by ionization or reduction of dopant ions, as shown in the energy level diagram of FIG. 3. The electrons are photoexcited out of the donor sites $N_D$ into the conduction band, where they can drift or diffuse until retrapped in acceptor sites $N_D+$. This process continues until the electrons collect with maximum density in the dark regions and have the lowest density in the illuminated regions. Referring back to FIG. 2, there is now a spatial distribution of electrons within the crystal following the same spatial variation as the light interference pattern of waveform (a). Since a charge distribution generates an electric field, the crystal develops an internal space charge field (c) which is proportional to the line integral of the charge distribution (b) along the K direction, i.e. along the direction perpendicular to the interference planes or surfaces:

$$E_{sc} \sim \int \rho_{sc} dz. \tag{3}$$

where $\rho$ sc is the space charge density (b). This space charge field acts through the linear electro-optic effect of the crystal to generate $n_1$, a spatially varying index of refraction $$n(z) = n_0 + n_1 e^{iKz} + n_1 * e^{-iKz} + \tag{4}$$

where $n_1$ is proportional to $E_{SC}$ as shown by waveform (d) in FIG. 2. Typically $n_1$ is very small, on the order of $10^{-4}$. This index variation, or phase grating, contains all of the information from the original object and reference beams. The object beam can be reconstructed by re-illuminating the grating with the reference beam.

Because of the large concentration of donors and traps in these materials, multiple holograms can be stored in the same volume by using different angles and/or wavelengths for each hologram. The holograms can also be used to store digital information, allowing storage of large amounts of information that can be read out quickly by wavelength scanning through the various holograms.

By the same principle that forms the electronic space charge grating in these materials, (uniformly) illuminating the crystal to read out a stored hologram will also tend to erase it by redistributing the electrons towards a uniform distribution. Even though the readout beam intensity can be much lower than that used for writing, the grating eventually decays to an unusable level. Also, thermal effects will tend to cause the grating to decay even if it is kept in the dark. Therefore, for these holograms to be useful for many applications, there needs to be a way to "fix" the holograms, i.e. making the holograms permanent so they cannot be erased by illumination.

Experiments by W. Phillips, et al. supra showed that LiNbO$_3$ lends itself well to fixing because of the presence of thermally mobile ions. However, the conversion efficiency, or the ratio of pre-fixed to post-fixed diffraction efficiencies, was low, usually around 1%. This severely limited the number of holograms that could be stored and the signal-to-noise ratios that could be obtained for large optical memory and related applications.

Procedure for Writing, Fixing, Developing

Full realization of the potential of the reflection mode approach for data storage and other applications utilizes successive processing steps that provide high coupling constants and "fix" the gratings permanently with at least a significant fraction of their original values. Principal efforts were conducted in Fe-doped LiNbO$_3$, although the following procedure may also be used with other materials, in whole or in part. In addition, the steps independently offer improvement in generating permanent holographic gratings or in overall diffraction efficiency of holograms. These procedures work best with the reflection mode geometry, although appreciable improvements have been observed in transmission mode as well. Two processing sequences are shown in summary form in FIG. 4.

Figure 4:
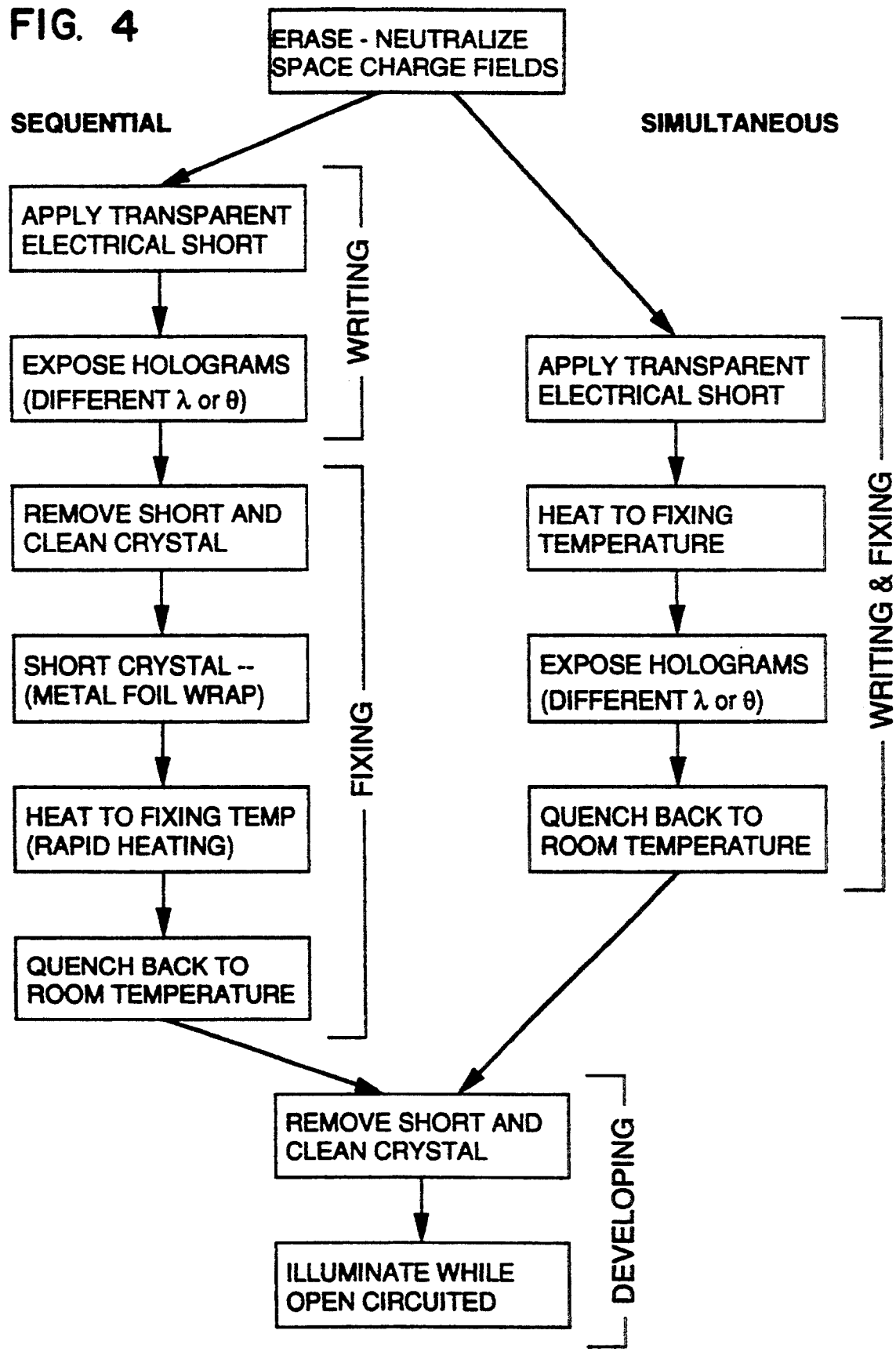
FIG. 4 is a block diagram of the steps of two advantageous methods for writing, fixing, and developing holographic images in a photorefractive medium in accordance with this invention.

The three major elements of this process (writing, fixing, and developing) outlined in FIG. 4 independently contribute to enhancing the process of generating permanent ionic gratings from a light interference pattern. Any combination of these steps can be used to obtain usable results. For example, the first shorting while writing step has often been omitted in experiments where the extra improvement from this step was not needed.

WRITING

The amplitude of the electronic space charge pattern for each hologram is maximized by using the following procedure with a clean, untreated crystal such as LiNbO$_3$ with 0.1% Fe dopant. Prior to any writing, any residual gratings in the photorefractive crystal are erased by electrically shorting the crystal and heating it to about 230° C. for at least 10 minutes. The crystal is shorted by wrapping it tightly in metal foil before heating.

(a) At room temperature, the crystal is completely coated with an optically transparent and electrically conductive film. In the examples described here, antistatic fluid was used to form the transparent conducting film. Other coating materials can be used, such as a thin carbon or metallic film. This coating electrically short circuits the crystal to prevent buildup of large internal fields but still allows holograms to be written. A thin coating is sparingly applied by wiping the crystal with a swab dipped in the liquid. The coated crystal is then allowed to dry.

(b) The holograms (one or many) are then written at ambient temperature in the optically transparent but shorted crystal. If more than one wavelength multiplexed hologram is to be written with roughly equal diffraction efficiencies, the exposures of each are varied following an appropriate schedule which is a function of intensity so that the exposure times are successively shorter. Typically, using a 1 W/cm$^2$ beam intensity and an exposure of 10 seconds, the saturation level is attained for each hologram.

(c) The anti-static fluid or other conductive coating is then removed by wiping, as with acetone, to minimize possible chemical reactions in the steps to follow.

Although the full benefits of this step are realized for fixed, reflection mode holograms, this step in itself can be used to increase the diffraction efficiency of metastable holograms if permanent gratings are not needed. Also, gains in diffraction can be realized in transmission mode as well with higher percentage increases, as predicted in Table 1.

FIXING

Permanent although non-readable holograms are generated from the metastable gratings by use of electrical field control as well as controlled heating. In the prior art with LiNbO$_3$, holograms written usually in transmission mode were converted to permanent ionic gratings by heating to approximately 150°-200° C. Using the steps described below for this invention, the conversion efficiency, that is the ratio of the permanent vs. metastable grating space charge fields, can be improved significantly. The procedure in this invention has yielded best results for counterpropagating reflection mode holograms in highly Fe-doped LiNbO$_3$, although it has also produced improved conversion efficiencies for transmission mode gratings in LiNbO$_3$ and other crystals with lower dopant levels. The procedure is as follows:

(a) The crystal is cleaned as a precaution to avoid any chemical reactions or contamination, then electrically shorted by wrapping tightly in metal foil.

(b) The shorted crystal is then quickly heated to a fixing temperature where the ions become mobile (about 160° C. yielded the best results for the materials used in these experiments) for a time period depending on the thermal conductivity of the shorting substance. For an aluminum foil wrap, about 2 to 3 minutes were sufficient to obtain internal thermal stabilization in the crystal. This heating step allows the thermally mobile ions to redistribute themselves so they neutralize the electronic space charge distribution, providing a duplicate grating of opposite charge which is insensitive to illumination. With the limiting ionic space charge field $E_q^A$ comparable to the diffusion field $E_d^{(T)}$, the ions can redistribute to fully neutralize the electronic, metastable space charge. Because the crystal is charge balanced at all localities, there is no net change in the refractive index and the holograms are unreadable.

(c) The shorted crystal is then quenched by quickly removing it from the heat source and air cooling back to ambient temperature. The maximum cooling rate is dictated only by the thermal shock tolerance of the crystal. Excessive heating will introduce thermal erasure of the metastable grating, reducing the overall photorefractive effect that can be observed after the fixing process.

SIMULTANEOUS WRITING AND FIXING

The writing and fixing steps can be combined by writing the gratings at the elevated fixing temperature of the material. The crystal is prepared by erasing any residual gratings by heating to 230° C. while shorted for at least 10 min. as described earlier. The procedure for recording and fixing the holograms is as follows:

(a) At room temperature, the crystal is completely coated with an optically transparent, electrically conducting film such as anti-static fluid or a thin carbon or metal film. This material must be able to withstand heating to the fixing temperature of approximately 160° C.

(b) The crystal is heated to the fixing temperature of 130° to 160° C. in a vacuum chamber to reduce grating motion and phase instabilities during writing due to thermal convection.

(c) The holograms (one or many) are written in the shorted crystal.

(d) The crystal is immediately cooled back to room temperature.

DEVELOPING

After fixing, the crystal has both its metastable grating in the form of an electronic space charge field and a permanent, complementary charge ionic grating. During developing, the metastable field is neutralized, leaving only the permanent ionic grating. In the prior art, the crystal was simply flooded with illumination to bring the electronic grating back to a uniform distribution.

Enhancing the development process so the residual electronic grating is erased as completely as possible is done by either applying an external field while illuminating the crystal or allowing the illumination to generate a large photovoltaic field. The second method, which has primarily been used in conjunction with this invention, involves choosing a photorefractive material with a large photovoltaic effect, such as LiNbO$_3$ crystals with a high dopant concentration. For efficient and optimum development, the limiting electronic space charge field $E_q$ should be less than the sum of the photovoltaic field $E_{PV}$ and the diffusion field $E_d$. Both the material property (electron trap concentration of less than $10^{18}$ cm$^{-3}$) and the electrical potential relationships contribute to this objective.

(a) After the fixing step, the crystal is carefully and completely cleaned so that it is electrically insulating. It is also held open circuited to allow large photovoltaic fields to develop in the material.

(b) The open-circuited crystal is then uniformly illuminated with an intense light source to which the electrons in the donor sites are sensitive. The light source is essentially uniform and need not be coherent. The exposure is for a sufficient time to redistribute the electrons, erasing the metastable, electronic distribution, and at the same time form a large photovoltaic field, approaching 50 to 100 kV/cm along the c-axis of the crystal. This is best accomplished by the counterpropagating, reflection mode geometry, open-circuited illumination, and limited electron trap concentration. The total exposure of this step is at least the exposure used to write the initial gratings. After the development process, only the stable, ionic patterns representing the stored holograms remain in the photorefractive crystal, and these act through the electro-optic effect to generate a refractive index pattern which can be read out using a readout beam as in conventional holography.

A significant result of the procedures disclosed herein is that a greater than order of magnitude improvement in the conversion efficiency from the metastable to fixed grating has been achieved over the prior art. Whereas diffraction efficiency after fixing in the past has been only about 10% of the metastable electronic grating efficiency, the present technique raises this to 80% or more. Therefore, for a given application, thinner material suffices to produce the same diffraction efficiency, with the advantage of correspondingly less absorption loss. With increased thickness, higher diffraction efficiency fixed holograms can be obtained. With such results, unique products and applications become feasible. This process also provides what is believed to be the first opportunity to take advantage of highly doped materials with their increased photorefractive sensitivity.

Figure 5:
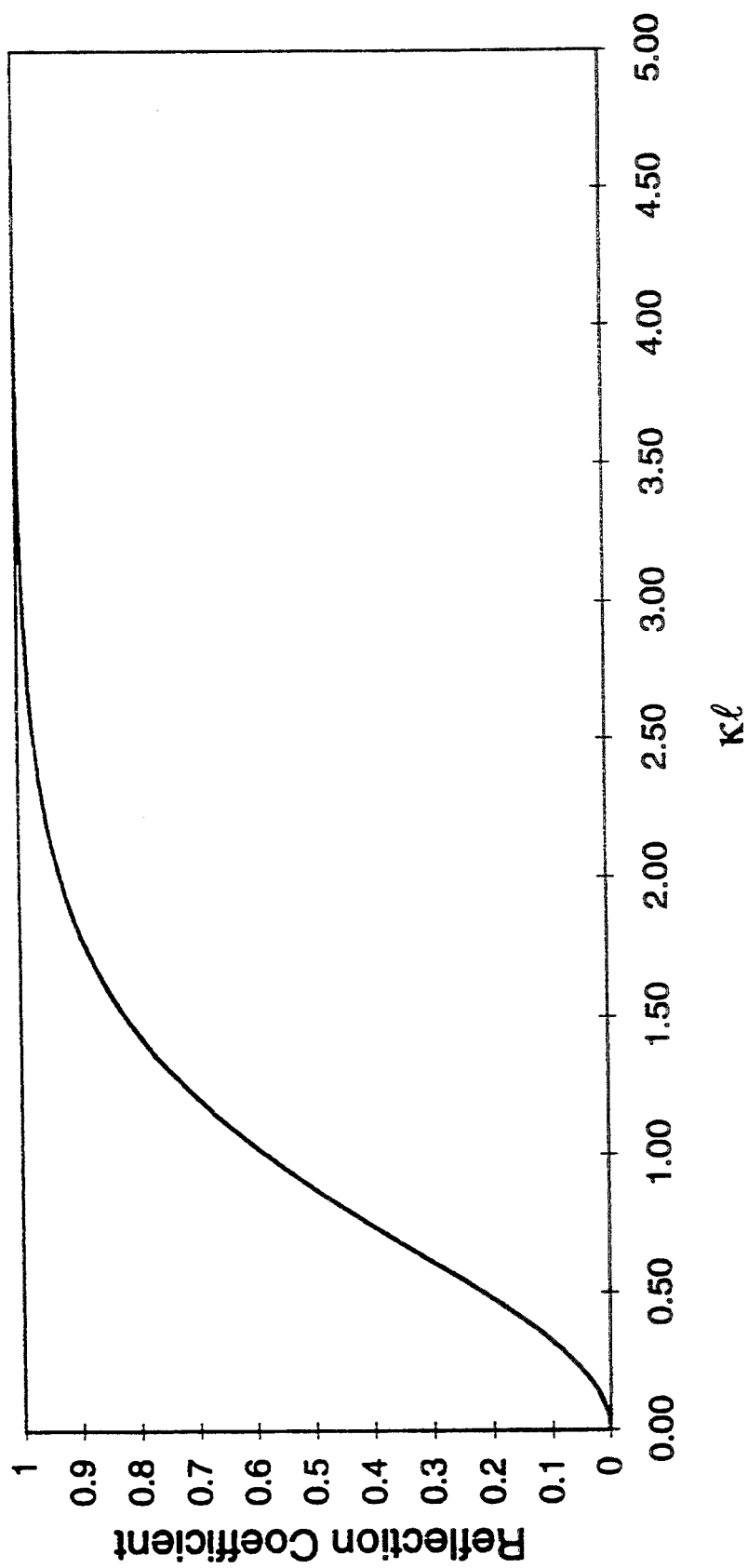
FIG. 5 is a graph of theoretical reflectivity (diffraction efficiency), for counterpropagating reflection mode holograms as set forth in this invention, as a function of the product of coupling coefficient $\kappa$ times the crystal thickness l.

This can be better appreciated by referring to FIG. 5, which shows the reflection coefficient (which is the diffraction efficiency) as a function of the product of $\kappa$ and the crystal thickness l, assuming no absorption. A major increase in $\kappa$ of the fixed grating is achieved by following the procedure in accordance with this invention, where $\kappa_{FIXED}$ values in the range of 5 to 20 cm$^{-1}$ have been achieved, whereas these values in the prior art were less than 1 cm$^{-1}$. Reflection coefficients approaching unity, or 100% diffraction efficiencies, are realized with a $\kappa$l product of about 3.0, and this can now be obtained with a reasonable thickness of material, say, a few mm.

In discussions comparing the grating strengths of different materials or processes, it is preferable to compare the coupling constant $\kappa$ instead of diffraction efficiency since $\kappa$ is independent of the crystal thickness. For counterpropagating reflection mode holograms in absorption-free crystals, the diffraction efficiency, or reflection coefficient, relates to the coupling constant as $$\eta = R = \tanh^2(\kappa l), \quad (5)$$

where l is the thickness of the crystal. This result is derived in a later section. Note that the diffraction efficiency goes as $(\kappa l)^2$ for small $\kappa l$, so small increases in coupling constant $\kappa$ result in large gains in diffraction efficiency for a fixed crystal thickness.

Verification of the Process Steps in Mathematical Terms

Analysis of the phenomena emphasized in writing, fixing, and developing, and extension of the equations developed by Kukhtarev, supra, and others, defines the crucial parameters involved and confirms the benefits, separately and cumulatively, derived by procedures in accordance with the invention.

WRITING

In the steady state and linearized approximation, with negligible thermal (dark) conductivity, any of the spatially varying quantities (denoted as A(z)) defined by Kukhtarev, supra, can be expanded in a linearized Fourier expansion of the form $$A(z) = A_0 + A_1 e^{iKz} + c.c. \quad (6)$$

where K is the grating wavenumber, the (0) subs the (1) subscript is the amplitude of the sinusoidal variation. Solving for the electric field variation $E_1$, of the electronic space charge field $E_{SC}$ resulting from the light interference pattern in the crystal, gives $$E_1 = imE_q \frac{E_0 + iE_d}{E_0 + i(E_q + E_d)} \quad (7)$$

where $E_0$ is the dc field, m is the modulation index, $E_d$ is the diffusion field, and $E_q$ is the limiting space charge field. $E_d$ and $E_q$ are defined as $$E_d = \frac{k_B T K}{e} \quad (8a)$$

and $$E_q = \frac{eN_A}{\epsilon K}\left(1 - \frac{N_A}{N_0}\right), \quad (8b)$$

where $N_A$ is the ion density, which is spatially uniform at this point, and K is the grating wavenumber which equals $2\pi/\Lambda$, where $\Lambda$ is the wavelength of the grating. The index of refraction variation $n_1$ is given approximately by $$n_1 \approx \frac{n_0^3}{2} r_{eff} E_1 \quad (9)$$

where $n_0$ is the index of refraction of the bulk crystal and $r_{eff}$ is the effective electro-optic coefficient.

For single carrier, single dopant materials with a photovoltaic effect as well, such as $LiNbO_3$, Eqn (1c) gains another term, so it becomes $$J = e\mu nE + k_B T \mu \nabla n + \kappa_{PV} \alpha Ic \quad (10)$$

where I is the light intensity, $\alpha$ is the absorption, $\kappa_{PV}$ is the photovoltaic constant, and c is a unit vector along the direction of the photocurrent. Now the space charge field is given by $$E_1 = -im\left[\frac{\sigma_p(E_0 + iE_d) + J_{PV}}{(\sigma_p + \sigma_d)}\right]\left[\frac{E_q}{E_0 + i(E_d + E_q)}\right] \quad (11)$$

$$= -im\frac{\sigma_p}{\sigma_p + \sigma_d}\left[(E_0 + iE_d) + \frac{J_{PV}}{\sigma_p}\right]\left[\frac{E_q}{E_0 + i(E_d + E_q)}\right]$$

where $J_{PV} = \kappa_{PV}\alpha I_0$ is the photovoltaic current density, $I_0$ is the dc level of the light interference pattern I(z), $\sigma_p$ is the photoconductivity, $\sigma_d$ is the dark conductivity, and $\sigma_p$ is usually $>>\sigma_d$ (preferred and obtained by using large $I_0$).

For the open circuited case, $J_0 = (\sigma_p + \sigma_d)E_0 + J_{PV} = 0$, so by defining the photovoltaic field $E_{PV} = J_{PV}/(\sigma_p + \sigma_d) \approx J_{PV}/\sigma_p$, $$E_1 = m\frac{E_d E_q}{-E_{PV} + i(E_d + E_q)} \quad (12)$$

In the counterpropagating geometry for $\lambda = 500$ nm, K is approximately $6 \times 10^5$ cm$^{-1}$, so $E_d = 15$ kV/cm at T=20° C., as shown in Table 1 below. Also, $E_q \approx 10$ kV/cm for $N_A = 10^{17}$ cm$^{-3}$, so assuming $E_{PV} = 5$ kV/cm, $E_1 = 5.7$ kV/cm. By increasing the dopant level an order of magnitude so $N_A = 10^{18}$ cm$^{-3}$, $E_q = 100$ kV/cm and $E_{PV} = 50$ kV/cm, since both scale as $N_A$ to first order. Therefore, for the factor of 10 higher dopant level, $E_1 = 12$ kV/cm.

In the short circuit case, $E_0 = 0$, so $J_0 = J_{PV}$. Using the definition of $E_{PV}$ from above, $$E_1 = m\frac{\sigma_p}{\sigma_p + \sigma_d}\frac{E_q(E_{PV} + iE_d)}{(E_d + E_q)} \quad (13)$$

so for the values given above, $E_1$ will be 6.2 kV/cm at $N_A = 10^{17}$ cm$^{-3}$ and 45 kV/cm for $N_A = 10^{18}$ cm$^{-3}$. Therefore, by shorting the crystal during recording, significantly higher space charge fields, and therefore larger coupling constants, are obtained, especially for higher dopant concentrations. The numerical examples given are for counterpropagating reflection mode gratings, but as shown in Table 1 below, this technique also enhances the coupling constants in transmission mode holograms as well. Since $E_q >> E_d$ in transmission mode, the unshorted space charge fields are much lower than for reflection mode, resulting in even larger percentage improvements in $E_1$.

If the crystal has a small or negligible photovoltaic effect, the optimum condition for writing a high efficiency grating changes. The sinusoidally varying electric field $E_1$ from the space charge field $E_{SC}$ is now given by $$E_1 = -im(E_0 + iE_d)\frac{E_q}{E_0 + i(E_d + E_q)} \quad (14)$$

Now $E_1$ is maximized by not shorting the crystal in any way and applying an external field $E_0 >> E_d$, $E_q$, and $E_{PV}$ so that $E_1$ approaches $E_q$, the maximum space charge field.

FIXING

In fixing, the space charge field remains unchanged and the crystal is heated to a temperature where ions become mobile but the trapped electrons remain immobile. Therefore, the non-photoactive ion distribution $N_A(z)$ is no longer uniform, but instead compensates the electronic distribution for overall charge balance so that $$N_A(z) = N_{A0} + N_{A1} e^{iKz} + c.c. \tag{b 15}$$

where $N_{A0}$ is the dc ion density and $N_{A1}$ is the ion density variation. Therefore, Eqns. (1a), (1c), and (1d) become $$\nabla \cdot J = 0 \tag{16a}$$

$$J = e\mu_A N_A E + k_B T \mu_A \nabla N_A \tag{16b}$$

$$\nabla \cdot E = -\frac{e}{\epsilon}(N_A - N_D^+) \tag{16c}$$

Solving the linearized equations now gives $$E_1 = -\frac{N_{A1}}{N_{A0}}(E_0 + iE_d^{(T)}) \tag{17}$$

where $E_0$ represents all (i.e. internal as well as external) dc fields and $E_d^{(T)}$ is the diffusion field at the elevated fixing temperature T. Substituting the result in Eqn. (16c), and using $E_q^A \equiv e N_{A0}/\epsilon K$ gives $$N_{A1} = \frac{N_{D1}^+}{\left(1 + \frac{E_d^{(T)}}{E_q^A}\right) - i\left(\frac{E_0}{E_q^A}\right)} \tag{18}$$

Therefore, to maximize the ionic fixing efficiency, the crystal is shorted so $E_0 = 0$, eliminating one denominator term in Eqn. (18). This maximizes the amplitude of the sinusoidally varying ion grating $(N_{A1})$ for a given metastable grating magnitude $(N_{D1}^+)$.

SIMULTANEOUS WRITING AND FIXING

An alternate method of generating fixed gratings is the simultaneous writing and fixing approach. As seen in FIG. 4, the crystal is heated to a temperature where the ions become mobile, and it is then exposed to the writing beams for the hologram. For non-photovoltaic materials, there are contradictory factors in that a field is preferred during writing, but not during fixing. For photovoltaic crystals, such as lithium niobate, a short across the crystal is desired for both writing and fixing. Therefore, the holographic gratings are written at an elevated temperature with the crystal shorted by a transparent conducting film or coating. As the electronic grating is written, the ions concurrently compensate the electronic charge distribution. Therefore, one expects a stronger process, since the built up electronic charge now does not lead to a space charge field that opposes more electron migration. The stored holograms are held by quenching the crystal back to ambient (room) temperature, and the developing steps are completed as described above.

For simultaneous writing and fixing, denoted by the superscript (SIM), the equations describing the process in the steady state are given by $$\nabla \cdot J = 0 \tag{19a}$$

$$\gamma n N_D^+ = \frac{sI}{\hbar\omega} N_D \tag{19b}$$

$$J = e(\mu n + \mu_A N_A) E + k_B T (\mu_e \nabla n + \mu_A \nabla N_A) + \kappa p \gamma \alpha Ic \tag{19c}$$

$$\nabla \cdot E = -\frac{e}{\epsilon}(n - N_D^+ + N_A) \tag{19d}$$

-continued $$N_D + N_D^+ = N_0 \tag{19e}$$

Using linearized expansions for $N_D$, $N_D^+$, I, n, E, and $N_A$, defining ionic conductivity and photovoltaic current as $$\sigma_d \equiv e\mu_A N_{A0} = \sigma_A \tag{20a}$$

$$J_{PV} = \kappa p \gamma \alpha I_0 \tag{20b}$$

and introducing the boundary condition $$e \frac{\partial N_A}{\partial t} = \nabla \cdot J_{ion} = 0. \tag{21}$$

the result is $$E_1^{(SIM)} = -\frac{N_{A1}^{(SIM)}}{N_{A0}}(E_0 + iE_d^{(T)}), \tag{22}$$

where $$N_{A1}^{(SIM)} = imN_{A0} \frac{E_q[(E_0 + E_{PV}) + iE_d^{(T)}]}{(E_0 + iE_d^{(T)})[E_0 + i(E_d^{(T)} + E_q^A + E_q)]}. \tag{23a}$$

and $$E_q^A = \frac{eN_{A0}}{\epsilon K} \tag{23b}$$

Note that as for the sequential case, the maximum ionic grating strength is obtained for the crystal being shorted because of the $1/E_0$ dependence of $N_{A1}$.

For sequential writing and fixing, Eqn. (23a) is given by $$N_{A1}^{(SEQ)} = imN_{A0} \frac{E_q[(E_0 + E_{PV}) + iE_d]}{[E_0 + i(E_d + E_q)][E_0 + i(E_d^{(T)} + E_q^A)]}. \tag{24}$$

In the above equations, the superscript (T) denotes quantities at the elevated fixing temperature. Comparing the sequential to simultaneous cases, the fixing efficiencies in the shorted case are given by $$\gamma_{FIX}^{(SEQ)} = \left| \frac{E_q(E_{PV} + iE_d)}{(E_d + E_q)(E_d^{(T)} + E_q^A)} \right| \tag{25a}$$

and $$\gamma_{FIX}^{(SEQ)} = \left| \frac{E_q(E_{PV} + iE_d)}{E_d^{(T)}(E_d^{(T)} + E_q + E_q^A)} \right|. \tag{25b}$$

The fixing efficiency is the ratio of $N_{A1}$ after fixing to $N_{A0}$ before fixing, indicating how deeply the ionic population is modulated by the fixing process. Equations (25a) and (25b) show that for $E_d \approx E_q \approx E_q^A$, the fixing efficiency is indeed larger for simultaneous writing and fixing. However, simultaneous writing and fixing introduces a new problem of wavelength shift due to thermal expansion, with the wavelength shifting approximately 1 Å per 30° C. in LiNbO$_3$. This requires compensation in grating wavelength during the original recording step so that the desired grating period is obtained at the readout temperature. For final grating adjustment, temperature control is incorporated to fine tune the grating wavelength of the device.

DEVELOPING

During developing, an incoherent, uniform light beam exposes the crystal, and this process can also be described by Eqns. (1a), (1b), (1d), (1e), and (10). However, $N_A$ is now sinusoidally varying instead of being a constant approximately equal to $N_D^+$, so referring back to Eqn. (15), $N_A(z)$ is given by $$N_A(z) = N_{A0} + N_{A1} e^{iKz} + c.c. \quad (15)$$

with $N_{A0} \approx N_{D0}^+$. Also, $N_{D1} = -N_{D1}^+$, so $$E_1 = i\frac{eN_{A1}}{\epsilon K} \cdot \frac{E_0 + iE_d}{E_0 + i(E_d + E_q)} = i\frac{eN_{A1}}{\epsilon K} \gamma_{DEV} \quad (26)$$

where $$E_q = \frac{eN_{A0}}{\epsilon K}\left(1 - \frac{N_{A0}}{N_0}\right). \quad (27)$$

where

As can be seen from Eqn. (26), the condition $$|E_0 + iE_d| > E_q \quad (28)$$

is sufficient for high development efficiency. This can be satisfied by applying a large voltage to the crystal or using an open-circuited crystal with sufficiently large internally generated fields (such as from the photovoltaic or pyroelectric effect) so $E_0 > E_q$. The requirement for small $E_q$ calls for counterpropagating reflection mode geometry (see Eqn. 27).

For high dopant levels (where large photorefractive sensitivity is desired), $E_q$ increases, which is detrimental to development efficiency. This is compensated by using reflection mode geometry to increase K, since $K_{Refl} > K_{Trans}$, so that up to 100 times the dopant level of the prior art can be used while still realizing $\gamma_{DEV} \approx 1$. Therefore, a much higher coupling constant $\kappa$ can be obtained after development.

Tables 1 and 2 compare the fixing and developing efficiencies for the transmission and reflection mode cases. These fixing and developing efficiencies indicate what fraction of the maximum possible space charge field (i.e. $E_q^A$) is preserved in the permanent, fixed product. In Table 1, the characteristic fields and electronic (i.e. metastable) space charge field magnitudes for typical values obtained for the transmission and reflection (counterpropagating) cases are compared for $N_{A0} = 10^{17}$ and $10^{18}$ cm$^{-3}$:

TABLE 1

Electronic (Metastable) Gratings
Reflection vs. Transmission Mode

|  | $N_{A0}$ (cm$^{-3}$) | $E_{PV}$ (kV/cm) | Transmission | Reflection |
|---|---|---|---|---|
| $\Lambda_g$ |  |  | 1.0 µm | 0.109 µm |
| K |  |  | 6.28 × 10$^4$ cm$^{-1}$ | 5.78 × 10$^5$ cm$^{-1}$ |
| $E_d$ |  |  | 1.59 kV/cm (20° C.) | 14.6 kV/cm (20° C.) |
| $E_d^T$ |  |  | 2.35 kV/cm (160° C.) | 21.6 kV/cm (160° C.) |
| $E_q \approx E_q^A$ | 10$^{17}$ | 5 | 89.9 kV/cm | 9.77 kV/cm |
| ($N_0 \gg N_{A0}$) | 10$^{18}$ | 50 | 899 kV/cm | 97.7 kV/cm |
| $E_1^{open}$ | 10$^{17}$ | 5 | 1.56 kV/cm | 5.73 kV/cm |
|  | 10$^{18}$ | 50 | 1.58 kV/cm | 11.6 kV/cm |
| $E_1^{short}$ | 10$^{17}$ | 5 | 5.16 kV/cm | 6.19 kV/cm |
|  | 10$^{18}$ | 50 | 49.9 kV/cm | 45.3 kV/cm |

The resulting theoretical fixing and developing efficiencies are summarized in Table 2:

TABLE 2

Theoretical Fixing and Developing Efficiency $N_{A0} = 10^{17}$ cm$^{-3}$

|  |  |  | Transmission | | | Reflection | | |
|---|---|---|---|---|---|---|---|---|
| | $E_{PV}$ (kV/cm) | | 1 | 5 | 10 | 1 | 5 | 10 |
| $\gamma$FIX | Short | SEQ | 0.020 | 0.056 | 0.108 | 0.187 | 0.197 | 0.226 |
| $\gamma$FIX | Short | SIM | 0.536 | 1.000 | 1.000 | 0.238 | 0.244 | 0.262 |
| $\gamma$dev | Short | n/a | 0.017 | 0.017 | 0.017 | 0.599 | 0.599 | 0.599 |
| $\gamma$dev | Open | n/a | 0.021 | 0.057 | 0.110 | 0.600 | 0.620 | 0.672 |
| $\gamma$Final | Sh,Sh | SEQ | 0.0003 | 0.001 | 0.0019 | 0.112 | 0.118 | 0.135 |
| $\gamma$Final | Sh,Sh | SIM | 0.009 | 0.017 | 0.017 | 0.142 | 0.146 | 0.157 |
| $\gamma$Final | Sh,Op | SEQ | 0.0004 | 0.003 | 0.012 | 0.112 | 0.122 | 0.152 |
| $\gamma$Final | Sh,Op | SIM | 0.011 | 0.057 | 0.110 | 0.143 | 0.151 | 0.176 |

$N_{A0} = 10^{18}$ cm$^{-3}$

|  |  |  | Transmission | | | Reflection | | |
|---|---|---|---|---|---|---|---|---|
| | $E_{PV}$(kV/cm) | | 10 | 50 | 100 | 10 | 50 | 100 |
| $\gamma$FIX | Short | SEQ | 0.0112 | 0.0554 | 0.111 | 0.129 | 0.380 | 0.737 |
| $\gamma$FIX | Short | SIM | 1.000 | 1.000 | 1.000 | 0.496 | 1.000 | 1.000 |
| $\gamma$dev | Short |  | 0.0018 | 0.0018 | 0.0018 | 0.130 | 0.130 | 0.130 |
| $\gamma$dev | Open |  | 0.011 | 0.055 | 0.110 | 0.157 | 0.424 | 0.672 |
| $\gamma$Final | Sh,Sh | SEQ | 2 × 10$^{-5}$ | 0.0001 | 0.0002 | 0.017 | 0.049 | 0.096 |
| $\gamma$Final | Sh,Sh | SIM | 0.0018 | 0.0018 | 0.0018 | 0.065 | 0.130 | 0.130 |
| $\gamma$Final | Sh,Op | SEQ | 0.00013 | 0.0031 | 0.0122 | 0.020 | 0.161 | 0.495 |

TABLE 2-continued

| | | Theoretical Fixing and Developing Efficiency | | | | | |
|---|---|---|---|---|---|---|---|
| $\gamma$Final | Sh,Op | SIM | 0.011 | 0.055 | 0.110 | 0.078 | 0.424 | 0.672 |

Photovoltaic field values of 1, 5, and 10 kV/cm were used for the lower ion density and assumed to increase linearly with $N_{A0}$, so their values were 10, 50, and 100 kV/cm for the more heavily doped crystal. Values greater than unity were defined as being at saturation, i.e. $\gamma = 1$. From the theoretical results here, the following conclusions can be derived:

- Reflection mode geometry generally yields better conversion efficiencies $\gamma_{Final}$ than transmission mode (typically 100 times, depending on conditions during developing).
- In transmission mode, developing efficiencies are very sensitive to whether the crystal is shorted or not. Reflection mode gratings are approximately 10 times less sensitive to whether the crystal is shorted or not than for transmission mode gratings.
- Generally, in reflection mode, $\gamma_{Final}$ increases as the dopant level (and therefore $N_A$) is increased, provided the photovoltaic effect is large. For transmission mode, $\gamma_{Final}$ decreases for increasing dopant concentration. Crystals with higher dopant concentrations may be desired in certain applications because of their improved photorefractive sensitivity in the red, i.e. around 650 nm.

An important point to note is that with the combination of using the counterpropagating, reflection mode geometry with the new fixing technique of shorting the crystal, the conversion (fixing and developing) efficiency from the metastable electronic grating to the permanent ionic grating is greatly improved over the prior art method of using transmission mode geometry and no electrical field control during fixing. Transmission mode recording inherently limits diffraction efficiency after fixing, while reflection mode does not suffer from the same limitation.

Results and Alternative Expedients

Measurements have confirmed the tremendous potential of this new recording, fixing, and developing method. $LiNbO_3$ crystals with their c-axes parallel to the writing beams were used to record the counterpropagating, reflection mode holograms. During development, the crystals were electrically isolated and exposed with a uniform illumination to allow the internal photovoltaic field to build up. Using an anti-reflection coated, 0.05% Fe-doped $LiNbO_3$ crystal only 2 mm thick, diffraction efficiencies of up to 43% after fixing were obtained. The pre-fixed diffraction efficiency, written in the crystal without shorting, was 50%, which means 86% of the original grating strength was retained during the fixing process. Beam coupling at these large diffraction efficiencies tends to reduce the maximum pre-fixed diffraction efficiency that can be measured. These holograms were written at approximately 640 nm, which is considerably removed from the peak sensitivity of the crystal at around 500 nm. The total power was approximately 0.6 W in an unexpanded Gaussian beam from the laser, for an intensity of approximately 20 W/cm². With an exposure time of 20 sec. the exposure energy was approximately 380 J/cm².

When the crystal was shorted during its original writing phase by applying an anti-static spray coating to the crystal, an increase in the diffraction efficiency was observed. With similar conditions as in the previous experiment, the pre-fixed and fixed diffraction efficiencies were approximately 52.5% and 50%, respectively. Again, at these large diffraction efficiencies, significant beam coupling was observed, which depletes power from the writing beams and generates multiple reflections during readout, draining power from the desired signal beams. In addition, more effective shorting techniques such as using a conductive anti-reflection coating, for example SnO, or immersing the crystal in a conductive fluid, may yield better results.

The simultaneous writing and fixing scheme was also investigated experimentally. The $LiNbO_3$ crystal was coated with a transparent conductive fluid and heated in an oven to the fixing temperature of 160° C. The crystal was illuminated with counterpropagating 635 nm Gaussian beams of 250 mW each for 30 seconds and allowed to cool back to room temperature. After developing, the diffraction efficiency was measured to be approximately 50%.

The lifetimes of the fixed gratings were estimated by extrapolating decay times measured at elevated temperatures, consistent with the techniques used by others in the field. These experiments have shown that reflection mode gratings fixed with techniques in accordance with this invention have room temperature half-lives of over 75 years.

Although the previous experiments all utilized the reflection mode geometry, where theory predicts the most significant gains over previously reported methods, the advances from this new fixing method can be applied to transmission mode gratings as well. Two 5×5×2 mm $LiNbO_3$ crystals with transverse c-axes and dopant levels of 0.02% and 0.03% were used. The exposures were approximately 360 J/cm² with modulation index of approximately unity at 639 nm. Developing of the transmission mode gratings was for approximately 5 min. using a 4 W/cm² beam from the Ar-ion laser. For the 0.03% crystal, fixing without shorting resulted in $\eta = 0.64\%$ before and 0.08% after fixing for a conversion efficiency of 12%. With the 0.02% crystal, the diffraction efficiencies were 0.61% and 0.07%, respectively. When the new fixing technique of shorting while fixing was used, the diffraction efficiencies were 0.64% and 0.13% for a conversion efficiency of 20% in the 0.03% crystal.

Lithium niobate doped with about 0.05% Fe was used in most of the preceding experiments because it is readily available and has been found to be an excellent material for writing and fixing holograms. Other materials can be substituted for Fe-doped $LiNbO_3$ as the photorefractive medium for the technique of writing and fixing high coupling constant holograms. One of these alternate materials investigated was Fe-doped lithium tantalate, which has been shown to be photorefractive (E. Krätzig and R. Orlowski, "$LiTaO_3$ as holographic storage material," *Appl. Phys.* vol. 15, pp. 133–139 (1978)). The crystal was 2 mm thick and doped with approximately 0.05% Fe.

The conversion efficiency of the Fe-doped $LiTaO_3$ was compared using the prior art method (unshorted fixing) and the technique set forth in this invention. The gratings were written in transmission mode at 488 nm with an incidence angle of 57° with the same exposure (approximately 560 J/cm$^2$) for each experiment. The diffraction efficiency of the grating was measured before and after the hologram was fixed by heating to 160° C. for 2 minutes and developed. The conversion efficiency (ratio of the diffraction efficiencies of the permanent to metastable gratings) increased from 0.56% to over 4% when the crystal was shorted during fixing as set forth in this invention.

In the step of writing the metastable grating, the method in this invention yielded significantly improved results for the same Fe-doped LiTaO$_3$ crystal. Using the identical setup as in the previous experiments, a metastable grating was written at 488 nm, where the crystal was shorted by coating it with anti-static fluid. The measured diffraction efficiency for a 560 J/cm$^2$ exposure was over 30%, compared to 6% without the short but otherwise identical conditions. These results, measured at 488 nm, showed even larger improvements in grating magnitude as a result of using the procedures set forth in this invention than those at 640 nm because of the larger photovoltaic effect at the shorter wavelengths.

The results from these experimental investigations are summarized in Table 3:

TABLE 3

Measured Results

Reflection Mode (Fe-doped LiNbO$_3$)

| Dopant Conc | λ(nm) | Short/Open (Fixing) | Sim/Seq | η:Prefix | η:Fixed | γ$_{Conv}$ |
|---|---|---|---|---|---|---|
| 0.05% Fe | 640 | Short | SEQ | 50% | 43% | 86% |
| 0.05% Fe | 640 | Short | SIM | — | >50% | — |

Transmission Mode (Fe-doped LiNbO$_3$ and LiTaO$_3$)

| Dopant Conc | Crystal | λ(nm) | Short/Open (Fixing) | η:Prefix | η:Fixed | γ$_{Conv}$ |
|---|---|---|---|---|---|---|
| 0.03% Fe | LiNbO$_3$ | 640 | Open/Open | 0.64% | 0.08% | 12% |
| 0.03% Fe | LiNbO$_3$ | 640 | Open/Short | 0.64% | 0.13% | 20% |
| 0.02% Fe | LiNbO$_3$ | 640 | Open/Open | 0.61% | 0.07% | 12% |
| 0.02% Fe | LiNbO$_3$ | 640 | Open/Short | 0.064% | 0.014% | 22% |
| 0.05% Fe | LiTaO$_3$ | 488 | Open/Open | 6.0% | 0.033% | 0.56% |
| 0.05% Fe | LiTaO$_3$ | 488 | Open/Short | 8.7% | 0.36% | 4.14% |
| 0.05% Fe | LiTaO$_3$ | 488 | Open | 6.0% | (not fixed) | |
| 0.05% Fe | LiTaO$_3$ | 488 | Short | 31.7% | (not fixed) | |

The choice of a suitable crystal with sufficient donor and trap concentrations is essential for optimization of the fixing and developing efficiency. If the trap density is too low, perhaps due to reduction during growth, the conversion efficiency to a fixed grating is greatly reduced. Therefore, crystals with low trap (ion) concentrations may be oxidized by heating in an oxygenated atmosphere containing water vapor to reduce the donor density and increase the trap concentration. Crystals which had very low (5% or so) fixing and developing efficiencies showed improvements to 10% or larger conversion efficiencies after an oxidation process at approximately 600° C. for several hours,

Orthogonal Data Storage

One of the most promising applications of photorefractive materials is using them as the storage media for volume holograms containing digital information. By recording digital information as an image (from a transparency, spatial light modulator, or similar means), up to 1 Megabit of information (using a 1000×1000 array) can be stored in a single hologram, with a large number of individual holograms stored in the medium with parallel accessibility. This storage capacity is currently limited by low spatial light modulator capacities, but with one capable of 10$^8$ bits per plane, the maximum capacity of 10$^8$ bits per 1 cm$^2$ hologram in a photorefractive crystal can be realized.

A fundamental issue for optical data storage using volume holograms is the number of independent, high resolution holograms that can be stored in a given volume without interaction between adjacent holograms. Prior schemes stored each distinct hologram with the crystal being rotated through a small angle after each exposure or with a different angle between the object and reference beams (angular multiplexing). The Orthogonal Data Storage technique disclosed here keeps the same angular separation but uses different wavelengths for each hologram (wavelength multiplexing). In either case, the separation, either in angle or wavelength, must be large enough to avoid interaction between holograms (crosstalk). Over 1,000 image-bearing holograms have been stored in photorefractive crystals, but the diffraction efficiency of each hologram was low and the bit content of the information was many orders of magnitude below the theoretical diffraction limited maximum of $V/\lambda^3$, where V is the physical volume of the crystal and λ is the wavelength of light used to record the hologram.

Figure 10:
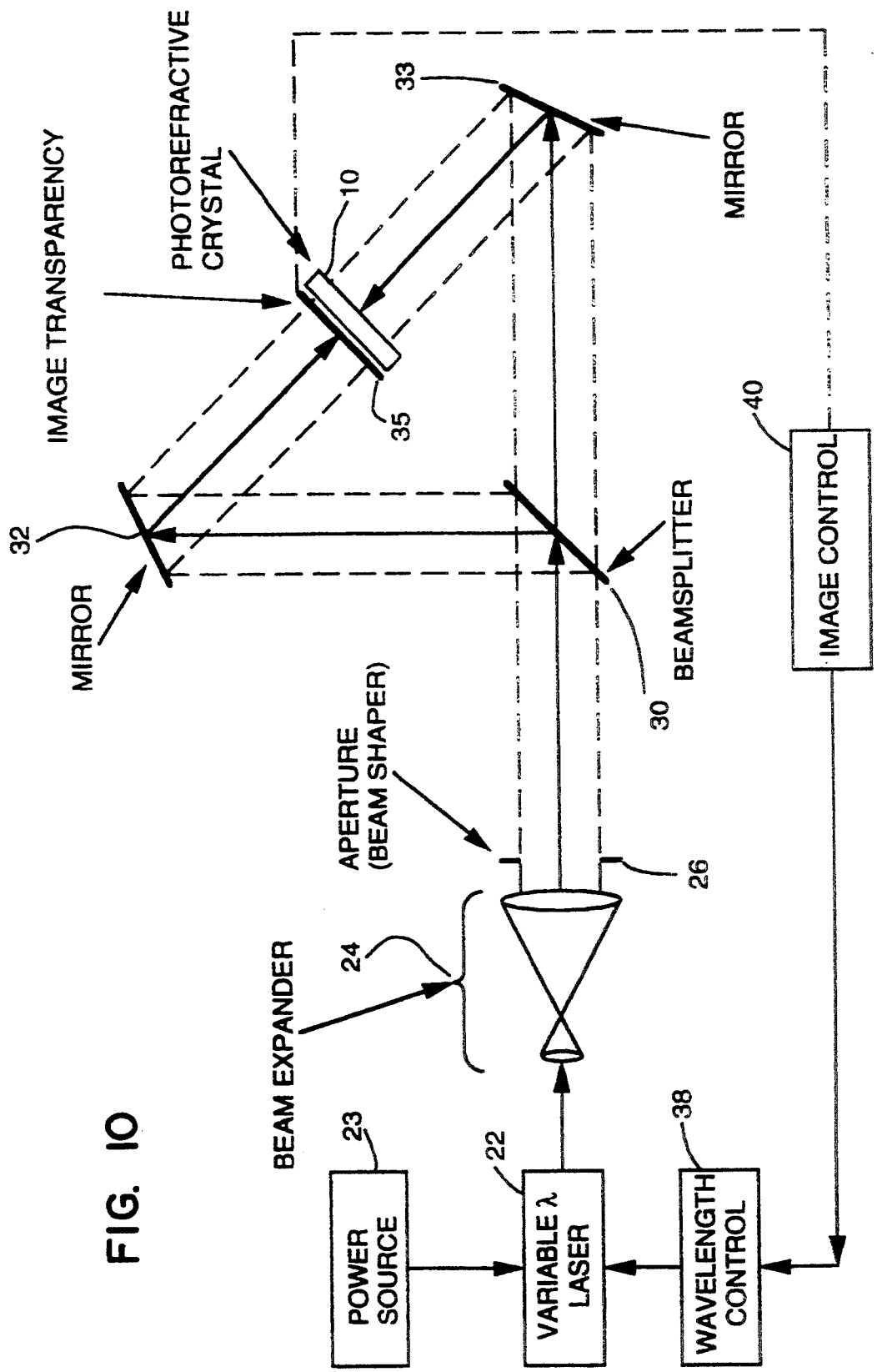
FIG. 10 is a block diagram of a system for writing holographic images in a photorefractive crystal using the Orthogonal Data Storage technique in accordance with this invention.

FIG. 10 illustrates a system for writing data in a photorefractive crystal using the orthogonal data storage method. This system allows recording multiple high resolution, wavelength multiplexed holograms in a photorefractive material. The photorefractive crystal 10 is chosen in this example to be LiNbO$_3$ doped with about 0.05% Fe, and is oriented with its c-axis along the direction of the grating wavevectors to maximize the photorefractive index grating strength. The light from a variable wavelength laser 22, such as a computer controlled dye laser, driven by a power source 23, is expanded and collimated so its wavefronts are planar by a beam expander 24, shaped by an aperture 26, and divided into two beams by a beamsplitter 30. The two beams are directed in counterpropagating directions to the crystal 10 by the angled mirrors 32, 33, with the path lengths of both beams from the beamsplitter 30 to the center of the crystal 10 being equal in length. An image transparency 35 containing the information to be recorded is placed close to the crystal in the path of the object beam to modulate the beam. Multiple images may be recorded by using such systems as a mechanical transparency loader or a spatial light modulator system in which the images are stored and loaded electronically, but these may be conventional and are not shown in detail. A wavelength controller 38 changes the wavelength of the laser by an increment as each new image is recorded, as governed by an image controller 40 which also controls the exposure of each hologram and the loading of the appropriate images.

Successive images, each modulated by a different two-dimensional transparency and at a different wavelength, are thus stored in the photorefractive crystal 10 using this orthogonal data storage system. In this way, wavelength multiplexing constitutes the third dimension for storing two-dimensional images in the photorefractive crystal. With wavelengths from 4000 to 8000 Å available, with 0.5 Å bandwidths and less than 2 Å center to center wavelength spacing, thousands of images can be stored with no crosstalk. In practice the wavelength range of the dye laser 22 used as the variable wavelength source will set a practical limit to the number of holograms that can be stored.

Figure 11:
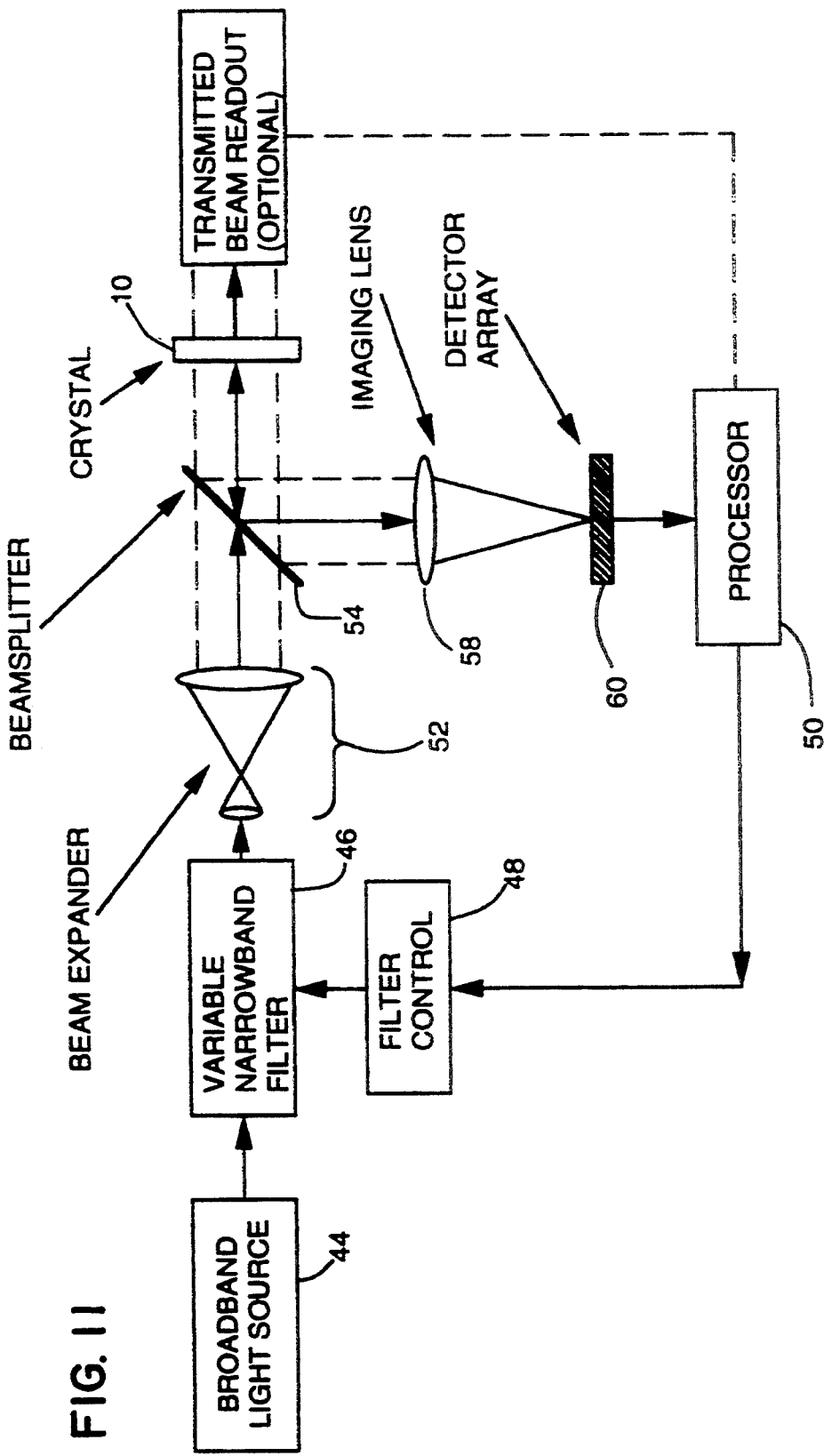
FIG. 11 is a block diagram of a system for reading images stored in a photorefractive medium prepared in accordance with this invention.

For readout, FIG. 11 illustrates an example of a system for extracting the holographic information stored in a photorefractive crystal 10, containing data images in the orthogonal data storage approach of FIG. 10. Light from a broadband source 44 is passed through a variable narrowband filter 46, the bandpass of which is determined by a wavelength control 48 operated by a processor 50. The bandpass of the filter 46 is sufficient to encompass the bandwidth of any individual hologram in the crystal, and the intensity of the source 44 after passing through the filtering optics provides sufficient coherence to reflect off the hologram recorded in the crystal 10 at that particular wavelength. The light passing the filter is expanded by a beam expander 52 and directed through a beamsplitter 54. If the incident wavefront is wavelength matched to one of the stored holograms, the stored image is reflected back to the beamsplitter 54, which reflects the signal to an imaging lens 58, which focuses it onto a detector array 60. High density charge coupled device (CCD) or charge injection device (CID) arrays can be used as the detector array 60, and these are available with at least 1,000×1,000 pixel resolution. A transmitted readout beam 62 passing through the crystal 10 in FIG. 11 provides the complement to the image reflected by the hologram.

Figure 12:
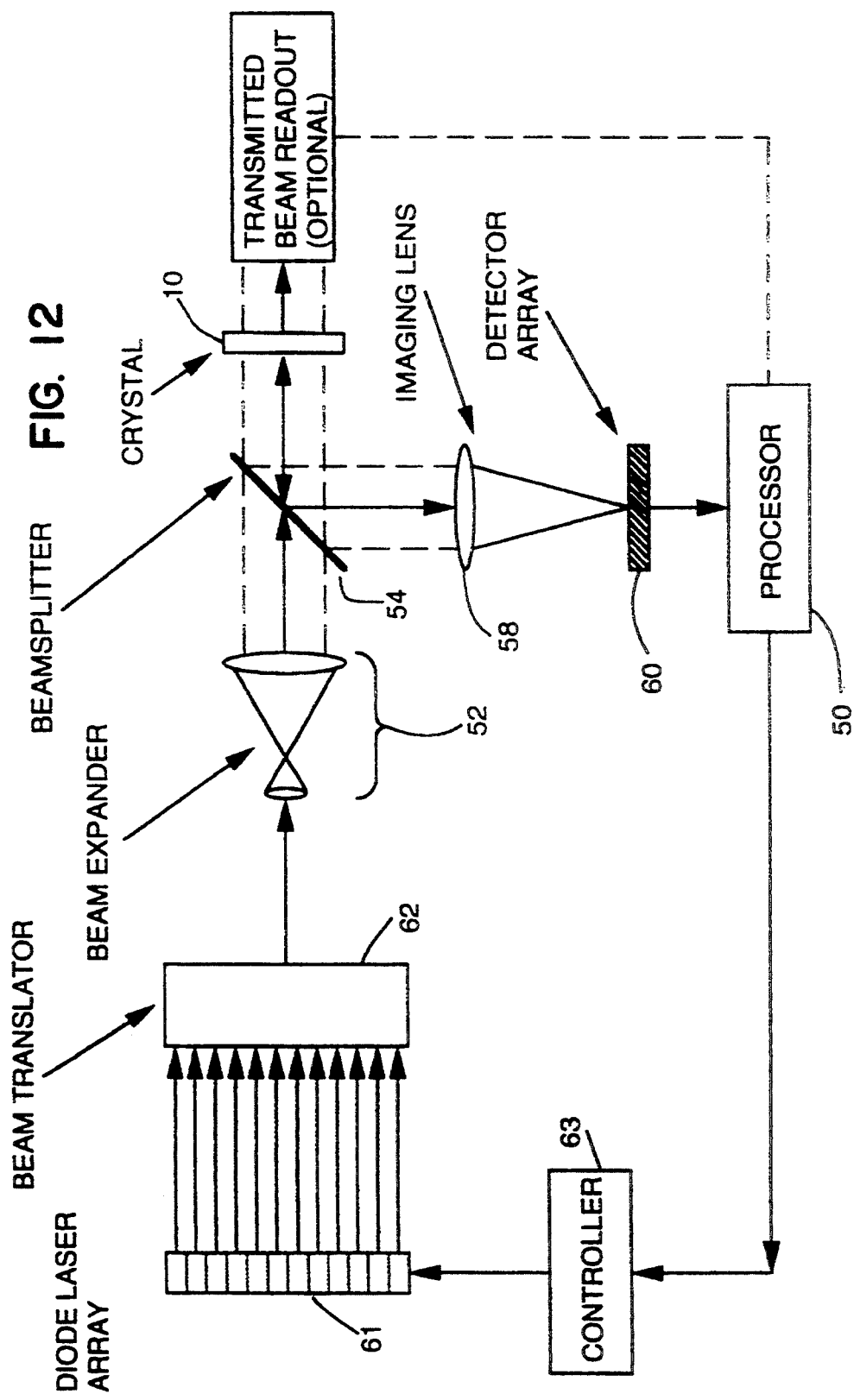
FIG. 12 is a block diagram of a system for reading images using an array of switched lasers in accordance with this invention.

In lieu of the broadband light and filter combination, the source can be a tunable laser, or as shown in FIG. 12, a system of individual switched lasers at the different wavelengths desired. An array of individual diode lasers 61 at wavelengths corresponding to those of the stored holograms in the crystal 10 is directed through a beam translator 62 to the beam expander 24. A controller 63 switches the lasers with wavelengths corresponding to the desired hologram on and off. Such a system has the advantage of highly parallel access to the stored information. Information contained in the holograms can be accessed at a speed limited only by the tuning speed of the variable source (or the switching speed if individual discrete wavelength sources are used).

Figure 6A:
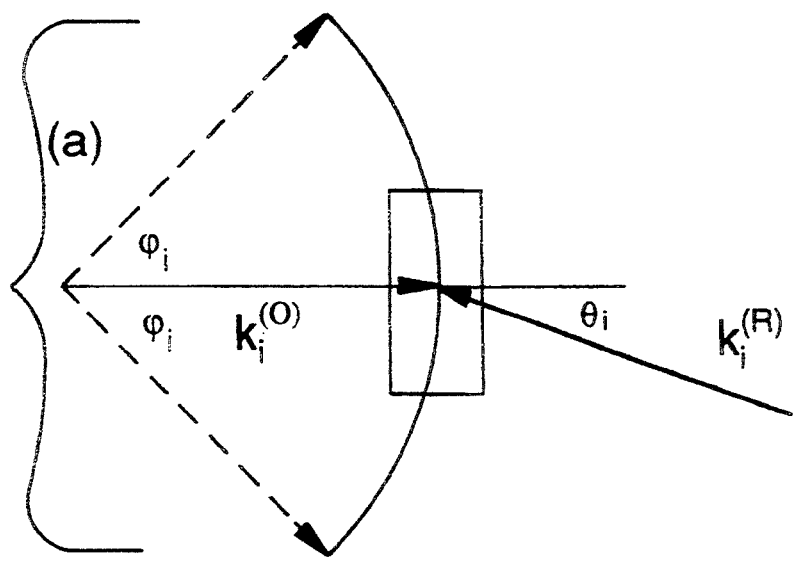
FIG. 6 comprises two K-space diagrams, with FIG. 6(a) being a diagram of a reflection mode hologram with a high resolution object beam occupying a half cone angle $\phi_i$ in K-space, and FIG. 6(b) showing the resulting grating wavevector $K_i$ of the ith high resolution image-bearing hologram written using the configuration of FIG. 6(a)
Figure 6B:
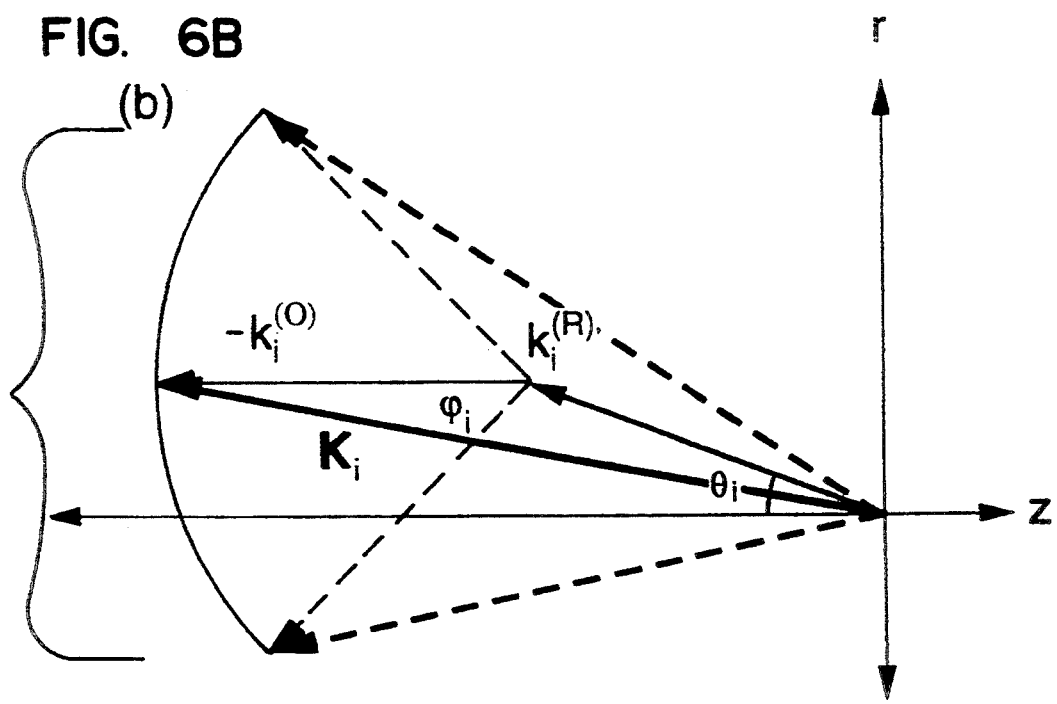

In order to analyze the fundamental process in data storage, a useful known method is that of K-space analysis, which is illustrated in FIGS. 6a and 6b. A wavefront of light has a wavevector k directed perpendicular to the wavefront in the direction of propagation and with magnitude $2\pi/\lambda$, where $\lambda$ is the wavelength of the light. In analogous manner, a holographic grating stored inside a crystal has a grating wavevector K pointing normal to its grating planes and of length $2\pi/\Lambda$, where $\Lambda$ is the "wavelength" of the stored holographic pattern. Let $K_i$ be the grating wavevector resulting from interfering an object and reference beam with wavevectors $K_i^{(O)}$ and $k_i^{(R)}$, respectively, as shown in FIG. 6a, where the grating wavevector is given by $$K_i = k_i^{(R)} - k_i^{(O)} \qquad (29)$$

For a plane wave, the transverse component of the object beam (denoted $K_r^{(O)}$ in cylindrical coordinates) will be zero. For an image-bearing wave, this object wavevector will also have a set of perpendicular components arising from the spatial information content of the image, with its full angular range being $2\phi_i$. The angle of the reference beam from the z-axis is given by $\theta$, so for the object beam being nominally on axis as illustrated, the object to reference beam angle is $\pi - \theta_i$. The grating K-vector, which is the vector difference between the two writing k-vectors and is shown in FIG. 6b for a high resolution object, has a magnitude of $$K_i = k_i \sqrt{2[1 + \cos(\phi_i - \theta_i)]} \qquad (30)$$

where $k_i$ is the magnitude of both the image and reference beam k-vectors, $\theta_i$ is the angular spacing between the reference beam and the image free (or plane) object beam. The object wavevector angle $\phi$ ranges over the full angular bandwidth $\phi_{max}$ of the object. The full angular bandwidth of an object is related to its smallest feature size w by $$w = \frac{\lambda_0}{2\sin\phi_{max}} . \qquad (31)$$

Figure 7:
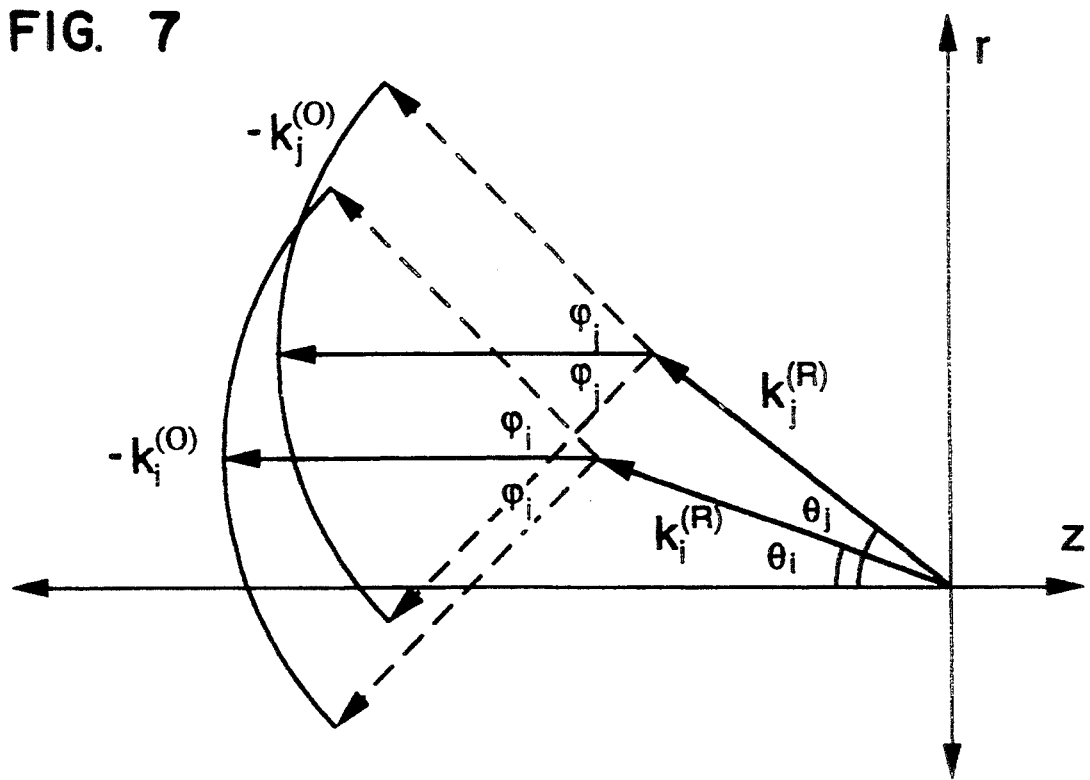
FIG. 7 is a K-space diagram useful in understanding how crosstalk and interference problems arise in angle multiplexed holograms of the prior art.

To avoid crosstalk, each arc swept by the grating wavevectors must be non-overlapping and separated. This is illustrated graphically in FIG. 7, which shows a fundamental limitation of angular multiplexing in data storage. Increased angular separation (which reduces the number of individual holograms that can be stored) is necessary to avoid crosstalk between holograms, which results from insufficiently separated (or overlapping) holograms in K-space. As the spacing between shells in K-space decreases, coupling between holograms increases. To minimize this problem, the cone angle needs to be reduced, which limits the maximum resolution of the image. Alternately, a larger wavelength separation or a larger angular separation between holograms is needed to avoid coupling.

Figure 8:
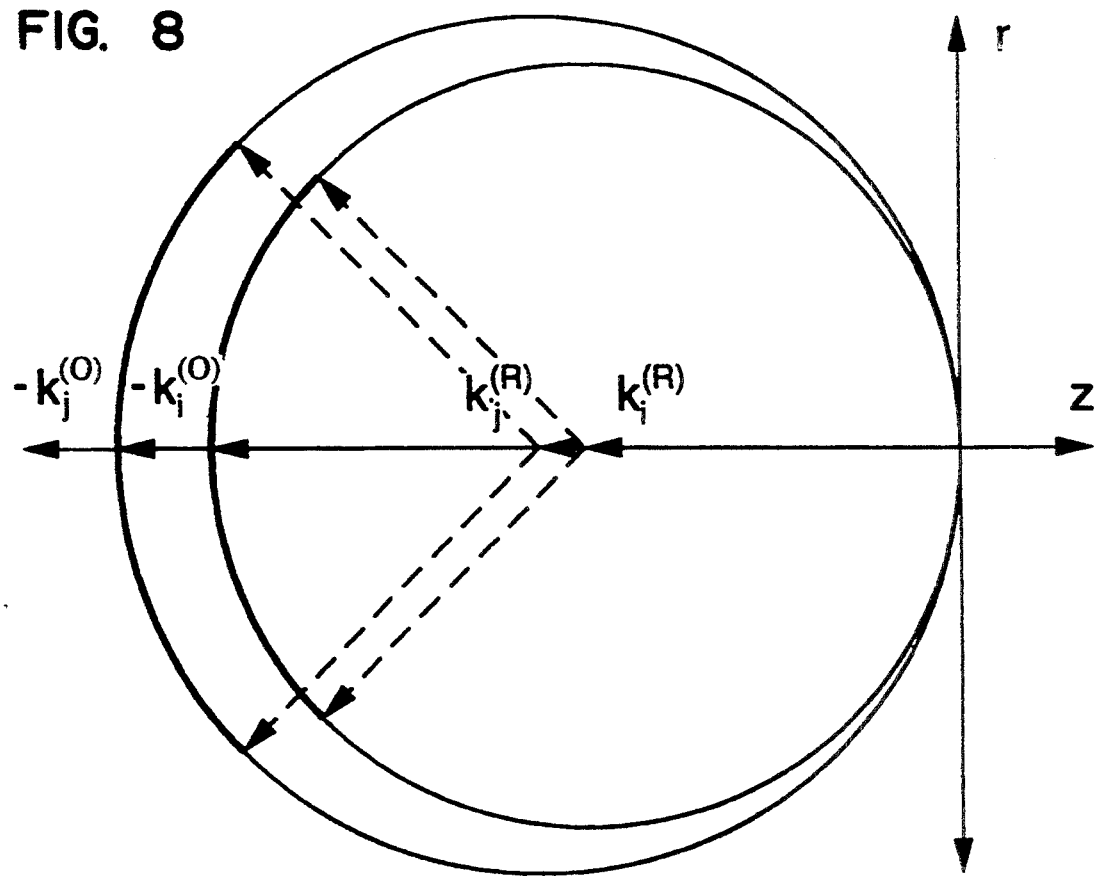
FIG. 8 is a K-space diagram showing how crosstalk is minimized and recording capacity is improved by orthogonal data storage in accordance with the present invention.

To confront this problem as set forth in this invention, one can use the counterpropagating reflection mode geometry to write image-bearing holograms. Now $K_i^{(O)} = -K_i^{(O)}$ unmodulated (plane waves). As can be seen from FIG. 8, the holograms are distributed volumetrically in a manner that most efficiently uses the available volume of the crystal in K-space. Different holograms are multiplexed in this scheme by recording at different wavelengths, which introduces $\lambda$, or $k = 2\pi/\lambda$, as the third orthogonal dimension of the memory. Successive images occupy spherical surfaces in K-space with radii $k_i$ and with their centers offset $k_i$ from the origin as illustrated in FIG. 8. The shells never intersect except at the origin which is of no practical interest, so the only limitation on $\Delta K$ is the spectral bandwidth of the hologram, which is derived below and measured experimentally later in this section.

Combining Eqns. (30) and (31), and using $$\Delta k = -\frac{2\pi n_0}{\lambda^2} \Delta\lambda \text{ and } \Delta k' = -\frac{2\pi n_0}{\lambda^2} \Delta\lambda', \quad (32a)$$

where $$\Delta\lambda' = \Delta\lambda + \delta\lambda, \text{ and} \quad (32b)$$

$\Delta\lambda$ is the wavelength separation for plane waves and $\Delta\lambda'$ is the corresponding wavelength separation for an image bearing wave with minimum resolution w, one can show that $\Delta\lambda'/\Delta\lambda$ and w are related by $$w = \frac{\lambda}{2}\left\{ 1 - \left[\frac{1}{(\Delta\lambda'/\Delta\lambda)^2} - 1\right]^2 \right\}^{-1/2}. \quad (33)$$

Figure 9:
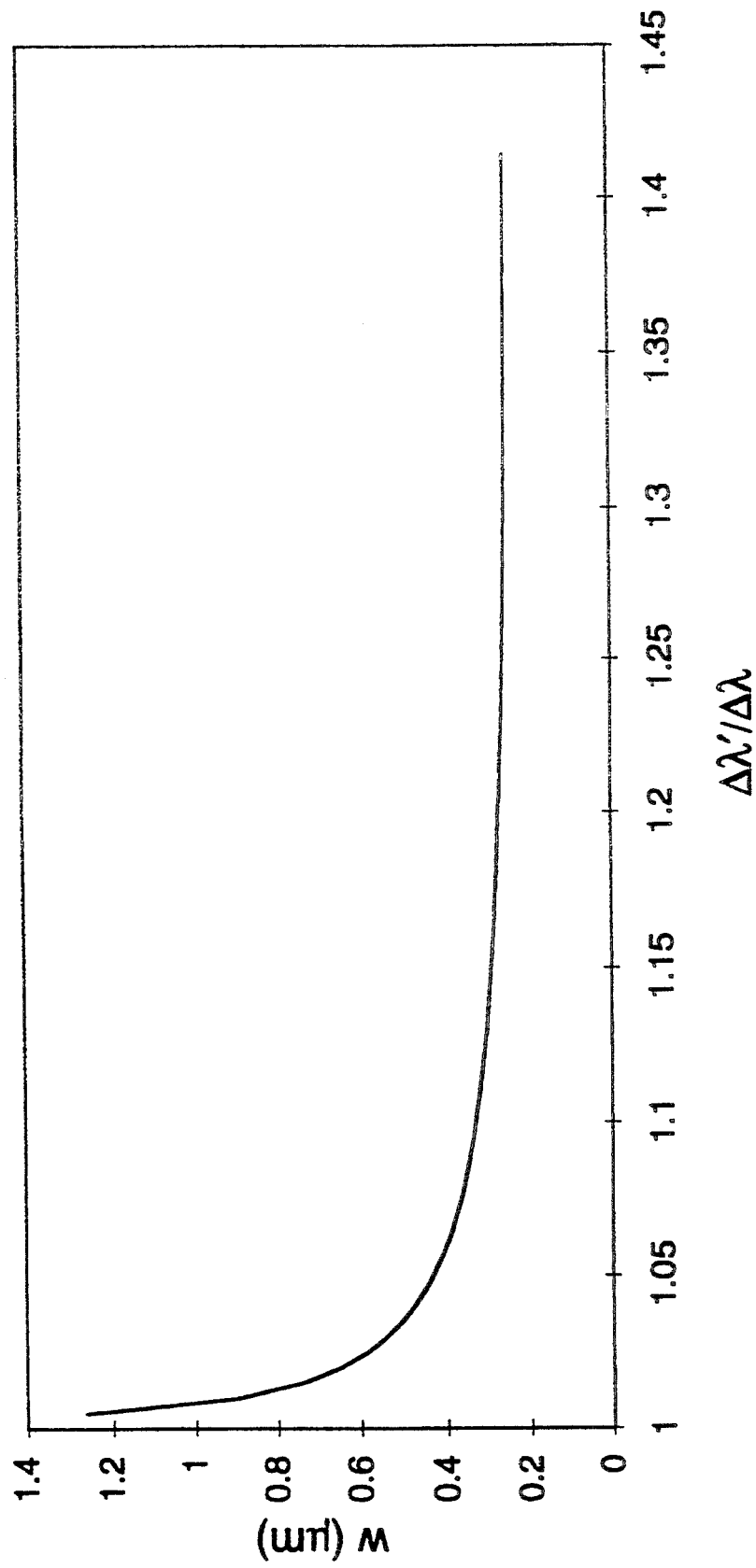
FIG. 9 is a graph of spot size as the ordinate vs. wavelength separation as the abscissa showing the theoretical minimum resolvable spot size in the object beam needed to retain the same sidelobe supression level in orthogonal data storage.

Note that the minimum resolution possible is $\lambda/2$. The numerical results of w as a function of wavelength separation are plotted in FIG. 9 for $\lambda = 500$ nm. This shows that for very small wavelength separation between holograms, very high resolution images can be stored using this orthogonal data storage technique.

For example, consider the case where $0 \leq \phi \leq \pi/4$, which according to Eqn. (31) corresponds to minimum image resolutions down to $0.7\lambda$, or about 0.35 μm in size for an illumination wavelength of 0.5 μm (or 500 nm). In Eqn. (30), $\theta = 0$ for the counterpropagating mode, so $\Delta K$ can be calculated at $\phi = 0$ and $\pi/4$, with the result being that Air, at $\Delta K$ at $\phi = \pi/4$ is approximately 0.924 times $\Delta K$ at $\phi = 0$. This means that for this very high resolution image, the minimum separation $\Delta K$ in K-space at $\phi = \pi/4$ is 8% less than that for unmodulated plane waves where $\phi = 0$. Therefore, the wavelength separation needs to be increased by only 8% to maintain the same low crosstalk level as in the plane hologram case. The minimum spacing for no crosstalk is dependent on the spectral bandwidth of the holograms, which is a function of the hologram thickness as given below.

Using the coupled wave analysis developed by H. Kogelnik, (in "Coupled wave theory for thick hologram gratings," *Bell Syst. Tech. J.* vol. 48, pp. 2909–2947 (1969)) for two plane waves interacting in a counterpropagating geometry in a photorefractive medium, the reflection coefficient, which is the diffraction efficiency for a reflection hologram, is given by $$R = \left| \frac{\kappa \sinh(-Sl)}{-\frac{\Delta K}{2}\sinh(Sl) + iS\cosh(Sl)} \right|^2 \quad (34)$$

where $$\kappa = \frac{\pi |n_1|}{\lambda_0} \quad (35a)$$

$$S = \sqrt{\kappa^2 - \left(\frac{\Delta K}{2}\right)^2} \quad (35b)$$

$$\Delta K = 4\pi n_0\left(\frac{1}{\lambda} - \frac{1}{\lambda_0}\right) = 2\Delta k \quad (35c)$$

where $\kappa$ is the coupling coefficient, l is the thickness of the crystal, $\lambda_0$ is the wavelength of light used to write the grating, $n_0$ is the index of refraction of the material, and $n_1$ is the amplitude of the index modulation, $$n_1(z) = n_1 e^{iKz} + c.c. = n_1 \exp\left(i\frac{4\pi n_0 z}{\lambda_0}\right) + c.c. \quad (36)$$

The bandwidth scales approximately inversely with crystal thickness and as $$\Delta k = \frac{\pi}{l} \text{ or } \Delta\lambda = \frac{\lambda_0^2}{2n_0 l}. \quad (37)$$

Recall from Eqn. (5) that for $\Delta K = 0$, which corresponds to zero detuning from the Bragg condition when the reading wavelength $\lambda$ equals the writing wavelength $\lambda_0$, the reflectivity is given by $$R = \tanh^2(\kappa l), \quad (5)$$

which is shown graphed as a function of $\kappa l$ in FIG. 5. This shows that as $\kappa l$ is increased to the saturation regime, the number of holograms that can be stored at high efficiencies also increases.

The storage capacity of a medium is defined as the number of gratings which can be stored in a given volume without crosstalk. The number of bits $N_{Bits}$ that can be stored in a given volume is given by $$N_{Bits} = \frac{L_x L_y}{w^2} N_{Holograms} \quad (38)$$

where $L_x$ and $L_y$ are the transverse dimensions of the storage medium. The spectral range for wavelength multiplexing in practice is limited from $\lambda$ to $\lambda/2$ to avoid scattering from second order gratings. Using Eqn. (37), the number of holograms for a thickness d is given by $$N_{Holograms} = \frac{\lambda/2}{\Delta\lambda} = \frac{n_0 d}{\lambda} \quad (39)$$

By limiting $\phi_{max}$ in Eqn. (31) to $\pi/4$ (which corresponds to an f-number of 0.5), the storage capacity in terms of the number of bits is given by $$N_{Bits} = 4n_0 \frac{V}{\lambda^3} \quad (40)$$

This result is consistent with prior theoretical investigations (P. J. van Heerden, "Theory of optical information storage in solids," *Appl. Opt.* vol. 2, p. 393 (1963)). Consequently, orthogonal data storage is able to make full use of a volume storage medium. It allows high resolution, high signal-to-noise ratio storage of images at low exposure energies due to the high sidelobe suppression.

Figure 13:
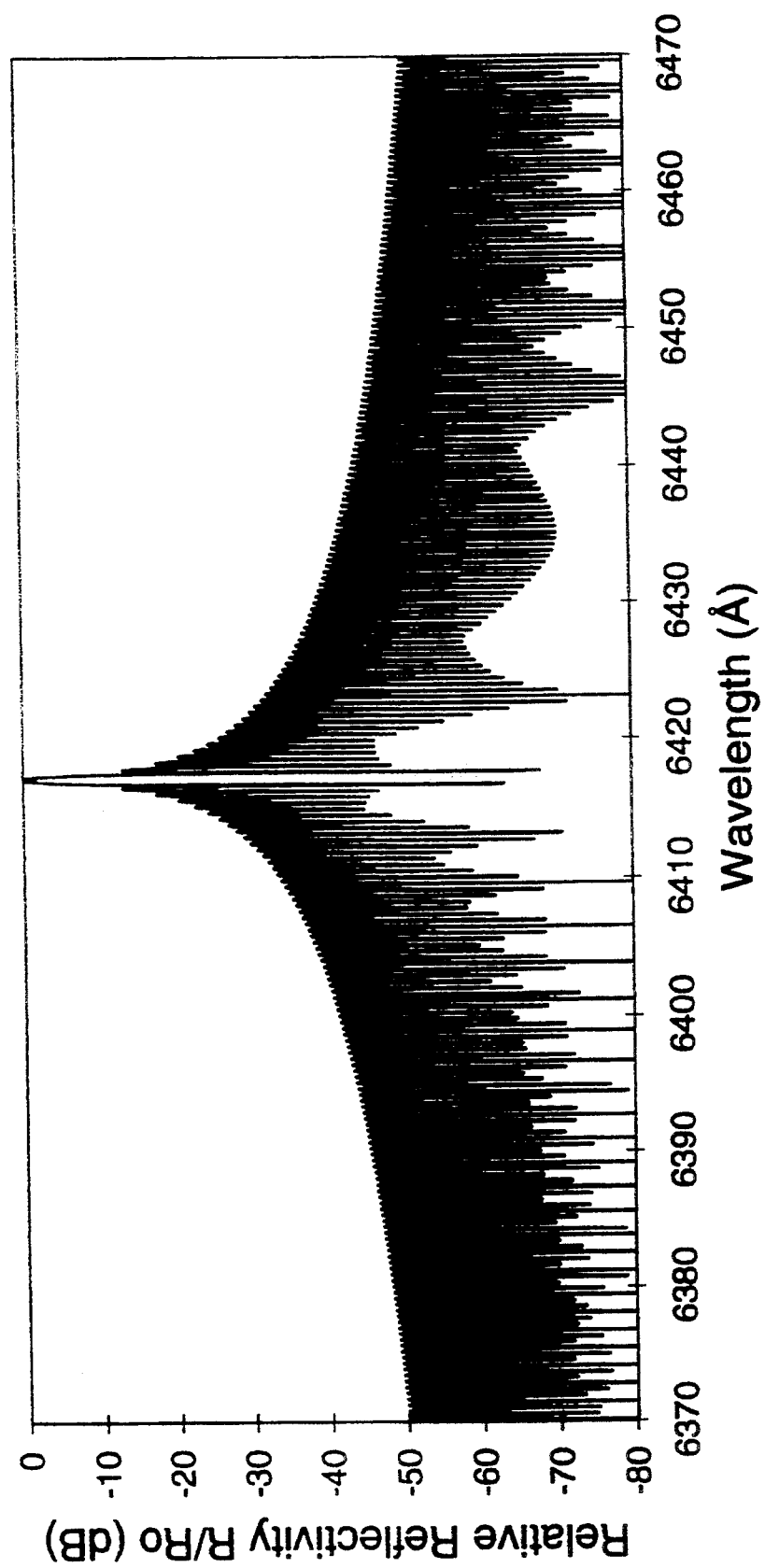
FIG. 13 is a graph of the theoretical reflectivity (diffraction efficiency) versus wavelength of a single hologram recorded at 6417 Å in a 2 mm thick photorefractive (lithium niobate) crystal using the counterpropagating reflection mode geometry set forth in this invention.
Figure 14:
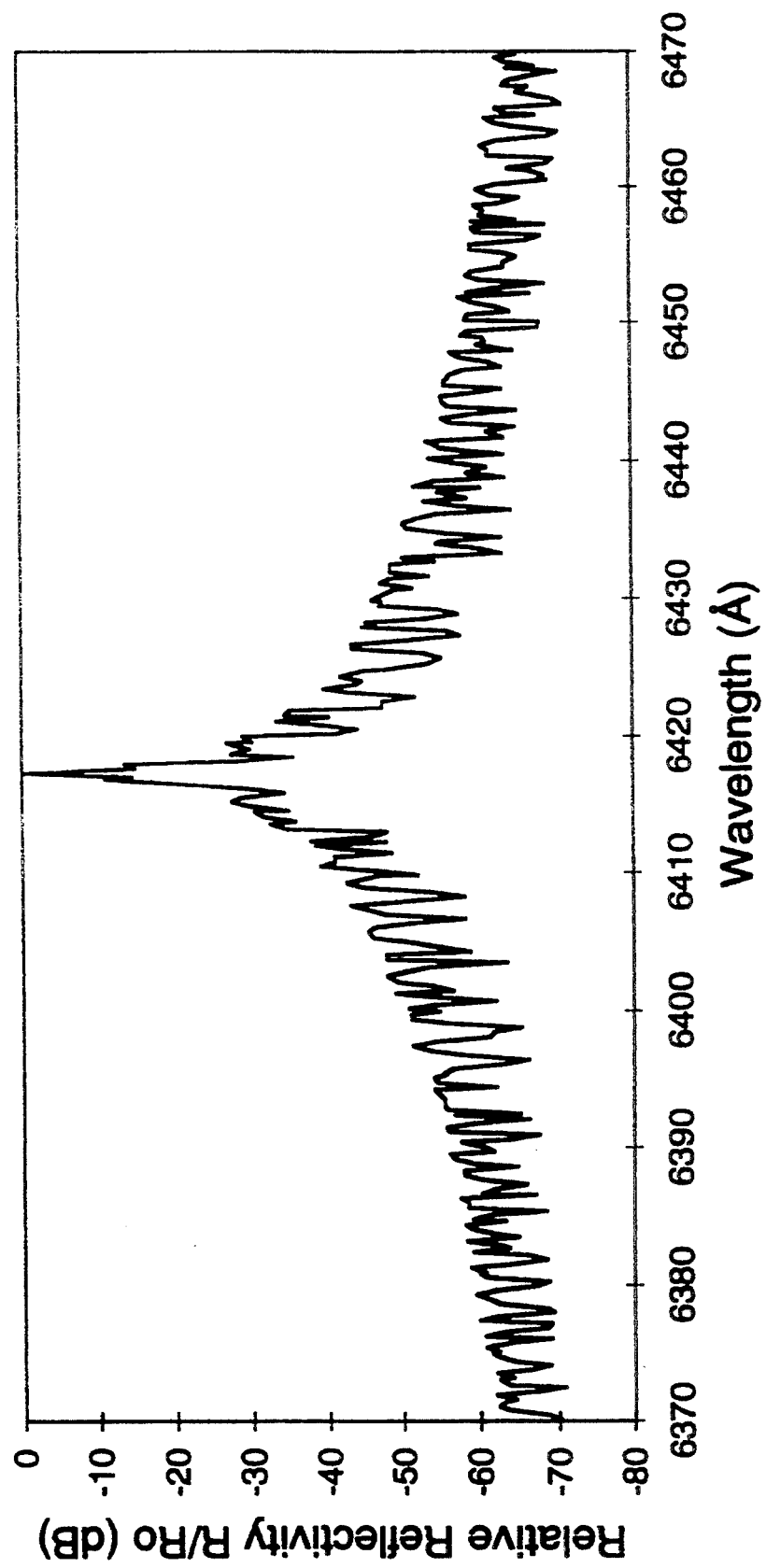
FIG. 14 is a plot of the measured reflectivity vs. wavelength for a single hologram recorded at 6417 Å in a 2 mm thick lithium niobate crystal using the counterpropagating reflection mode geometry.

FIGS. 13 and 14 compare the theoretical and actual response of a single, unmodulated 2 mm thick plane holographic grating. In theory, at least a 6 Å separation is required for $-30$ dB sidelobe suppression, although experimentally (FIG. 14) only a 2.5 Å separation was needed for the same sidelobe level. Two apodization effects arising from the orthogonal data storage concept may in part contribute to this experimentally observed sidelobe reduction.

The first apodization effect, illustrated in FIG. 15(a), is from the absorption in the material attenuating the amplitudes of the counterpropagating waves nonlinearly so they are equal only at the center (assuming the incident intensities are equal). This means the modulation index m is maximum at the center and drops off at the surfaces. Consequently, the modulation index varies in strength, being strongest in the center, so it shapes or apodizes the grating, thereby modifying the spectral response of the reflection to reduce the side-lobes.

The second effect, shown in FIG. 15(b), arises from the inherent partial coherence properties of the laser, which has a finite wavelength spectrum centered on the center wavelength. With equal optical path lengths, the waves at the center wavelength interfere precisely and uniformly at the center of the crystal. Near the surfaces, the path differences increase, reducing the modulation indices, and again creating an index grating that peaks in amplitude at the center of the crystal. The result of these effects is that since these holograms have extremely narrow bandwidth (less than 0.5 Å), they can be closely spaced, e.g. 2 Å center to center or less, with low crosstalk, enabling large numbers of high resolution images to be stored over the wavelength range of $\lambda$ to $\lambda/2$ (avoiding second harmonics).

Extremely low crosstalk and high signal-to-noise ratios were measured in experiments using this new orthogonal data storage method. Up to 100 plane wave or 50 high resolution holograms of greater than 1% diffraction efficiency have been stored in a $LiNbO_3$ crystal less than 2 mm thick (A. Yariv et al., "High resolution volume holography using orthogonal data storage," paper MD-3, OSA Topical Meeting on Photorefractive Materials, July 1991). Because diffraction efficiency to first order scales as the crystal thickness squared for small $\eta$, larger effects should be observable with thicker crystals.

Figure 16:
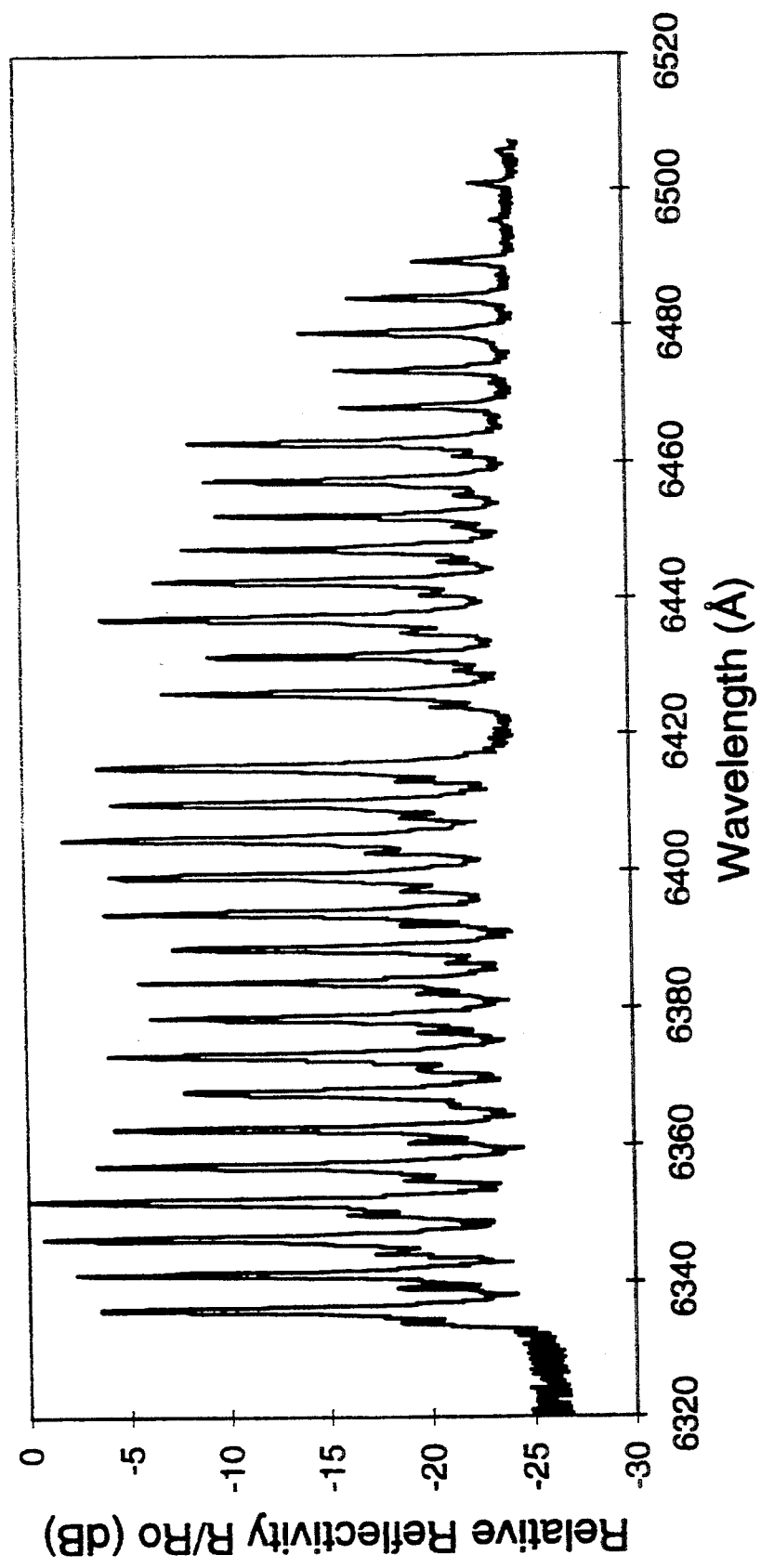
FIG. 16 is a plot of the measured reflectivities of 32 high resolution holograms stored in a 2 mm thick lithium niobate crystal with 5 Å wavelength separation between holograms using the Orthogonal Data Storage method set forth in this invention.

FIG. 16 shows the results of storing 32 high resolution images of an integrated circuit mask with 2 $\mu m$ lines and spaces in a 2 mm thick, 0.2 $cm^3$ $LiNbO_3$ crystal using the orthogonal data storage technique. Optical signal-to-noise ratios of over 24 dB were obtained with 5 Å separation between adjacent holograms. (See Table 4 below). Moreover, these experiments were performed at around 640 nm, where the response is expected to be considerably lower than at the peak sensitivity wavelength of $LiNbO_3$ at around 488 nm. At one bit per smallest resolution element, the 32 holograms represented approximately $10^{10}$ bits of data being stored in a 2 mm thick crystal. Since diffraction efficiency increases and bandwidth decreases with crystal thickness, storage capacity can be increased by using thicker crystals, for example using a 1 cm thick crystal.

TABLE 4

| Signal-to-noise Ratio in Orthogonal Data Storage | | |
|---|---|---|
| Number of Holograms | Channel Separation (Å) | Optical Signal-to Noise Ratio (dB) |
| 2 | 10 | 44 |
| 4 | 10 | 44 |
| 8 | 10 | 43 |
| 16 | 10 | 33 |
| 32 | 5 | 24 |

Figure 17:
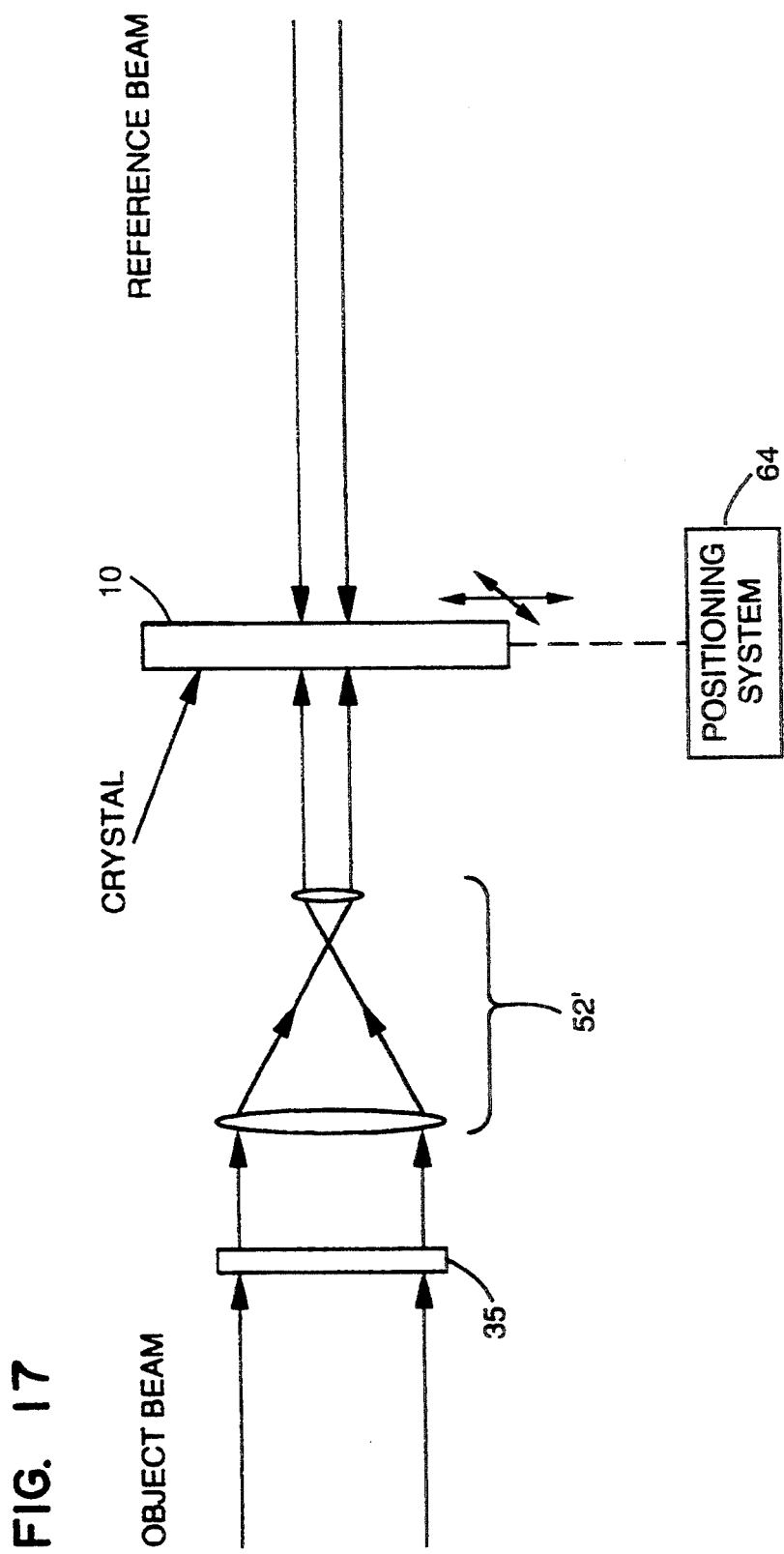
FIG. 17 is a diagram showing how a number of high resolution, orthogonal data storage holograms can be multiplexed over a grid across the surface of the crystal.

The orthogonal data storage method allows the theoretical storage of data densities beyond the resolution capability of current input and output devices, i.e. spatial light modulators and CCD/CID arrays. At image resolutions of 1 $\mu m$, which is within the theoretical storage capability of the Orthogonal Data Storage technique, the corresponding pixel density for a 1 $cm^2$ crystal surface area is $10^4 \times 10^4$, which is about two orders of magnitude greater than the size of current spatial light modulators. However, this limitation is circumvented by spatially multiplexing the holograms over, for example, a 10×10 grid across the surface of the crystal, where each 1 $mm^2$ element takes full advantage of the resolution limit at 1,000×1,000 pixels from the spatial light modulator by matching it to the resolution limit of the writing system, as shown in FIG. 17. This spatial multiplexing can be accomplished mechanically with mirrors and translation stages, or electro-optically through the use of electro-optic beam deflectors. In the Figure, an object beam is passed through a spatial light modulator 35 and a beam reducer 52' to reduce its diameter to the desired spot size before it is directed to the crystal 10. A two axis translation stage 64 is used to move the crystal 10 to the correct position for each exposure. A small dead band or guard band may be used between adjacent images to preclude image interference.

This orthogonal data storage scheme, in addition to the reduced crosstalk, has a number of other important advantages over angular multiplexed storage techniques:

- Using conterpropagating geometry takes advantage of the enhanced fixing scheme discussed earlier.
- The field of view during readout is maximum for counterpropagating mode, allowing ease of alignment and maximum resolution with minimal crosstalk. Therefore, the need for a precision positioning system to direct the reference beams with angular resolutions of 0.01° or less is eliminated.
- With $LiNbO_3$ or similar photorefractive crystals, the preferred growth direction or the c-axis is in the z-direction, which simplifies growth and preparation of the crystals and reduces cost. Thicker crystals can be grown by simply increasing boule length instead of being limited by its diameter.
- Faster access times are possible during readout because of wavelength multiplexing, with readout speeds limited only by the switching or tuning speed of the readout source.

In this invention, a true orthogonal data storage method has been developed with the capability of storing large numbers of high resolution holograms with little or no crosstalk. Its wavelength multiplexing scheme can eventually store thousands of images Angstroms apart in a photorefractive crystal. Used in conjunction with the enhanced fixing and developing procedure developed in the previous section, permanent, high density data storage with rapid, parallel access is now possible.

Applications

Optical Correlator

Optical image correlation is an important operation that has numerous applications in pattern and character recognition, image analysis, associative memories, and optical computing. The technique of multiplying the Fourier transforms of two different images and taking the Fourier transform of their product (which is equivalent to the inverse Fourier transform operation) is well known as a technique for correlation. This enables coincident or like images to be more readily identified. Most current correlation techniques are based on digitization of the sample and reference images, and the use of complex algorithms for finding the best match. Such techniques require extensive memory and processing power and even so are limited in speed and capacity.

Figure 18:
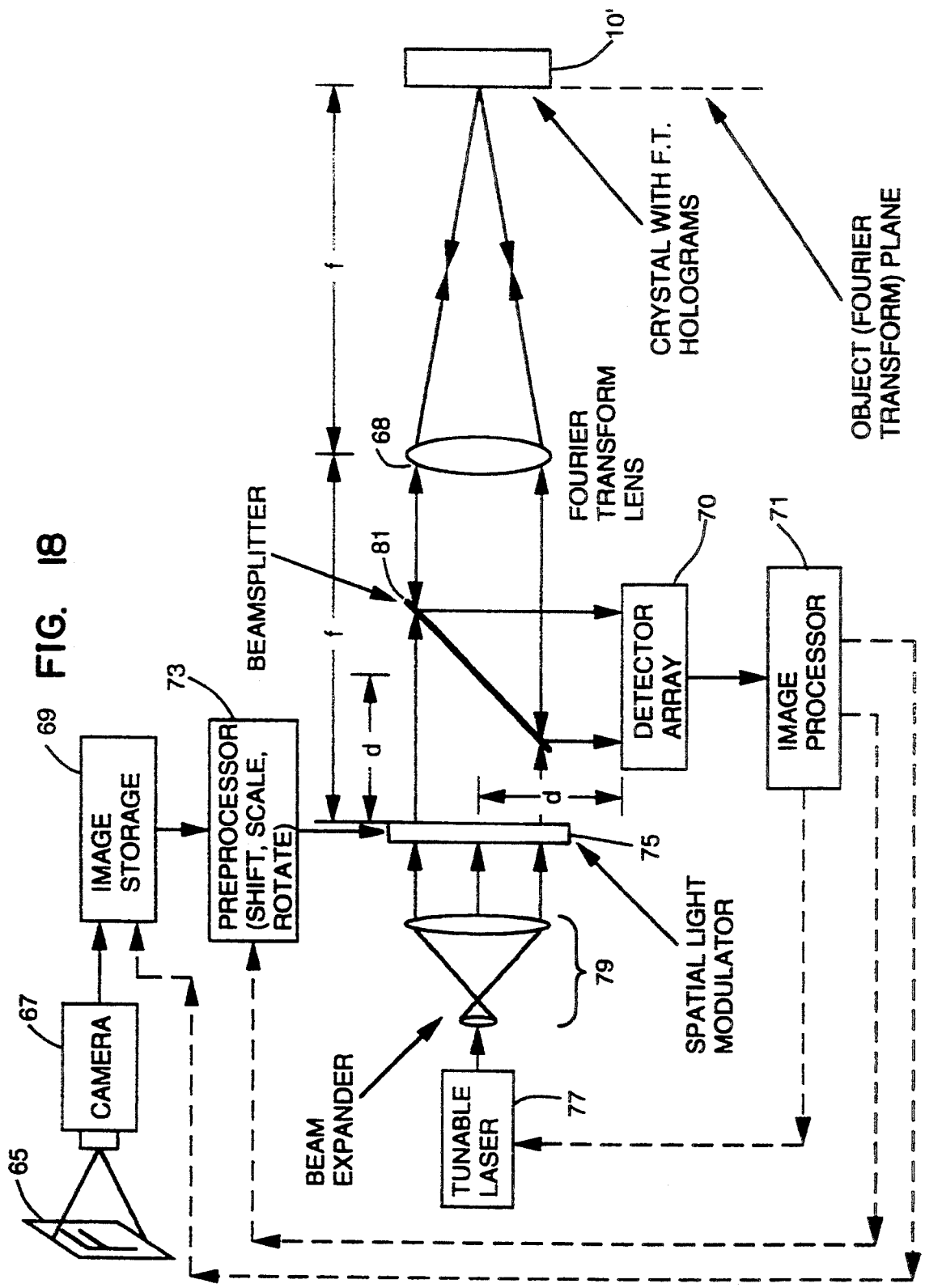
FIG. 18 is a block and schematic diagram representation of an optical correlator system using a photorefractive medium as the storage element in accordance with this invention.
Figure 19A:
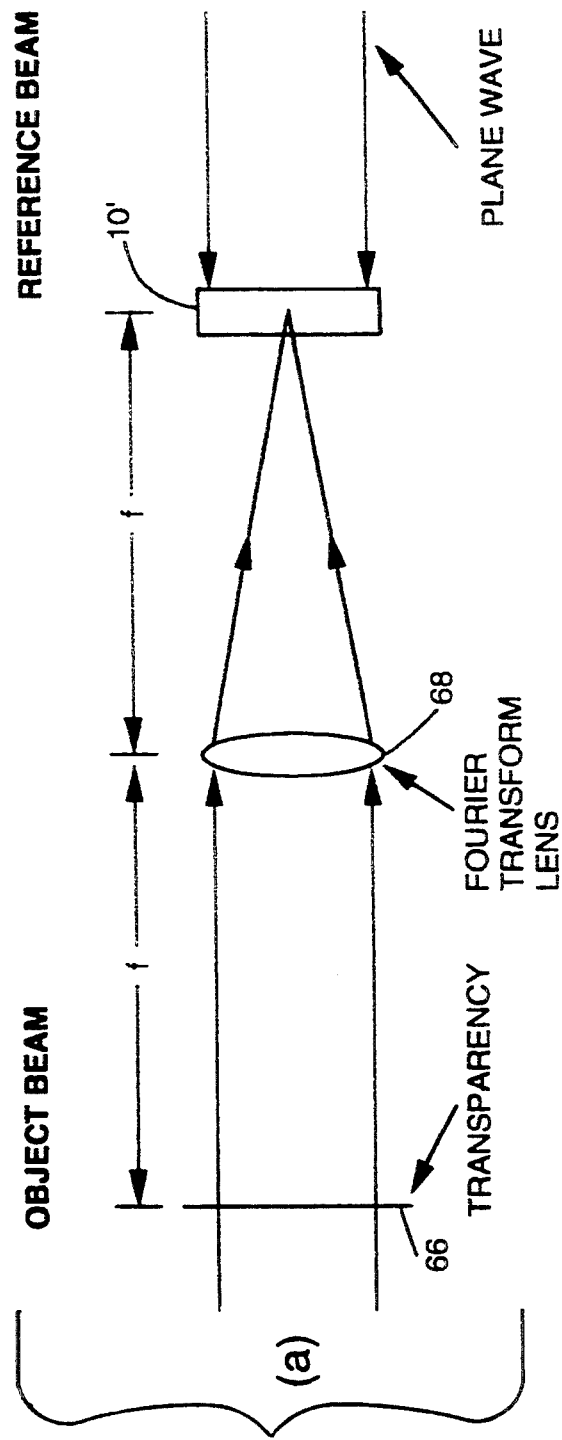
FIG. 19 comprises two idealized beam path depictions of recording (FIG. 19(a)) and readout (FIG. 19(b)) functions in an optical correlation operation.

An optical correlator system utilizing the advantages of orthogonal data storage is shown in FIG. 18. The crystal and holographic writing and readout system are configured for storing and reading counterpropagating, reflection mode holograms as generally described above. However, the multiple reference images are prerecorded in a photorefractive crystal 10' in the form of Fourier transform images, simply by passing the object or sample image through a Fourier transform lens. A multiplicity of holograms, each reflective at a different closely-spaced wavelength, are fixed and developed. This recording operation is depicted in FIG. 19(a), where a reference image, here shown as recorded on a transparency 66, is illuminated by an object beam thereafter directed through the Fourier transform lens 68. The object beam is focused on the photorefractive crystal 10' from one side, while the reference beam is a plane wave of like wavelength counterpropagated into the crystal 10' from the opposite side.

In the illustrated configuration of FIG. 18, the image to be correlated, as represented by a scene 65, is scanned in real time by a video camera 67 and transferred to a storage medium 69 for analytical sequence as controlled by an image processor 71. Typically, an image preprocessor 73 is utilized to shift, scale, or rotate the image detected by the camera 67. However, the preprocessor 73 and image storage 69 elements are optional and need not be used in all instances. The image data is subsequently used to control a spatial light modulator 75 which generates the processed image in a beam of selected wavelength. To this end, the beam from a tunable laser, such as a dye laser 77, which is operated at an output wavelength set by the image processor 71, is fed to a beam expander 79 so a planar wavefront of suitable cross section is incident on the spatial light modulator 75, which modulates the planar wave with the image data from the preprocessor 73. The image passes through a beamsplitter 81, is Fourier transformed by the lens 68, and is incident on the photorefractive crystal 10'. Since the Fourier transform of the input image is used to read out the hologram in the crystal, which itself is a Fourier transform hologram, only the product of the two Fourier transforms is reflected back. In the reflection direction, this product of Fourier transforms is again Fourier transformed by the lens 68 and is reflected by the beamsplitter 81 onto the detector array 70, which for example can be a charge-coupled device (CCD) or charge injection device (CID).

Figure 19B:
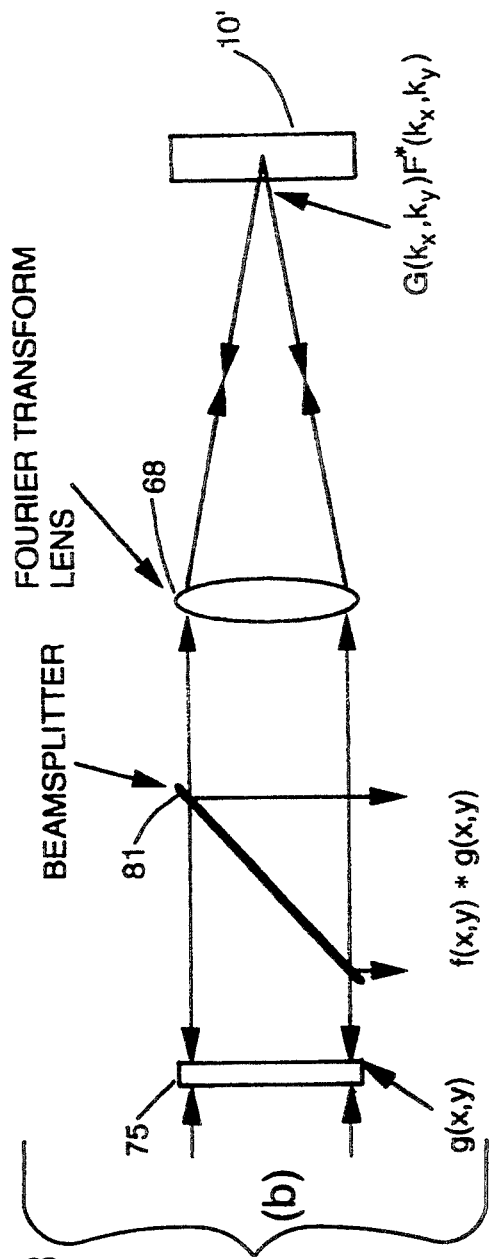

The readout operation is illustrated in FIG. 19(b) in schematic form. The reflection off the crystal 10' passing through the Fourier transform lens 68 is the Fourier transform of a product of two Fourier transforms, or the correlation of the two original images:

$$h(x,y) = FT^{-1}[F^*(k_x,k_y)G(k_x,k_y)] \quad (41)$$
$$= \frac{1}{(2\pi)^2} \int_{-\infty}^{\infty} \int_{-\infty}^{\infty} F^*(k_x,k_y)G(k_x,k_y)e^{i(k_xx+k_yy)}dk_xdk_y$$
$$= f(x,y)*g(x,y)$$

where $$F(k_x,k_y) = FT[f(x,y)] = \int_{-\infty}^{\infty} \int_{-\infty}^{\infty} f(x,y)e^{-i(k_xx+k_yy)}dxdy \quad (42)$$

$$G(k_x,k_y) = FT[g(x,y)] = \int_{-\infty}^{\infty} \int_{-\infty}^{\infty} g(x,y)e^{-i(k_xx+k_yy)}dxdy$$

where

This correlation result h(x,y) is almost instantaneously available to the image processor.

In the prior art, conventional holographic techniques such as angular multiplexing have been used to store the reference Fourier transform images, or templates, in the crystal. By using the counterpropagating, wavelength multiplexed scheme of orthogonal data storage for the correlator, higher resolution templates can be stored with reduced crosstalk in the crystal. In addition, wavelength scanning considerably simplifies the system because, unlike the angular multiplexing scheme, the output signal beams are all in the same direction, where they can be directed to the detector array without requiring angular motion or beam positioning.

Narrow Linewidth Filters

In a different example of a class of devices in accordance with the invention, the narrow wavelength selectivity feature of holograms stored with the orthogonal data storage technique is used to provide narrow linewidth filters for a variety of applications such as solar astronomy, spectroscopy, and laser wavelength control. The effective filter element is simply a photorefractive crystal containing a single, high efficiency, counterpropagating hologram at the desired wavelength. This hologram is preferably fixed and developed using the techniques described earlier to retain the gratings permanently. Metastable images have, however, been used with satisfactory results where only short term operation is involved.

The Full Width at Half Maximum (FWHM) bandwidth of a 2 mm thick holographic grating was measured to be less than 0.5 Å. Preferably, the grating is written with the beam from a wavelength controlled laser, although the image can be planar or curved, for different purposes as described below. With measured reflection (diffraction) efficiencies of approximately 50% for holographic gratings using $LiNbO_3$ as the photorefractive material, filters using this technology have performances exceeding the best of those of the current art (such as the Lyot filters, which are used in astronomical research). Moreover, by recording additional holograms in the same crystal, these holographic filters have the capability of supporting multiple wavelengths in the same crystal, with each having its own predetermined reflection direction, which is a feature that is not available in the prior art filters.

Figure 20:
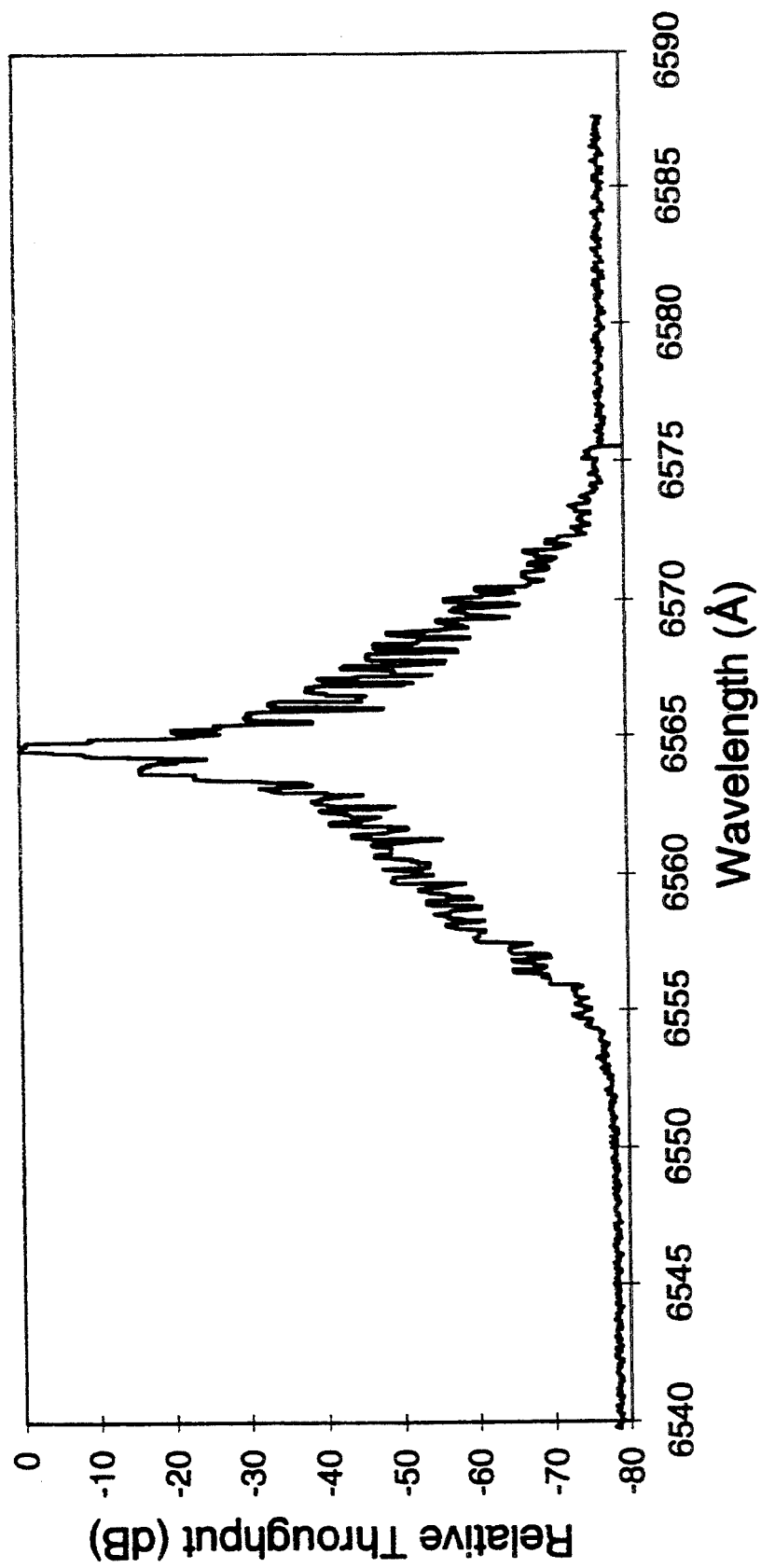
FIG. 20 is a plot showing the measured spectral response of a holographic filter at the $H_\alpha$ wavelength (6562.8 Å in air) written in a 2 mm thick disk of lithium niobate in accordance with this invention.
Figure 21:
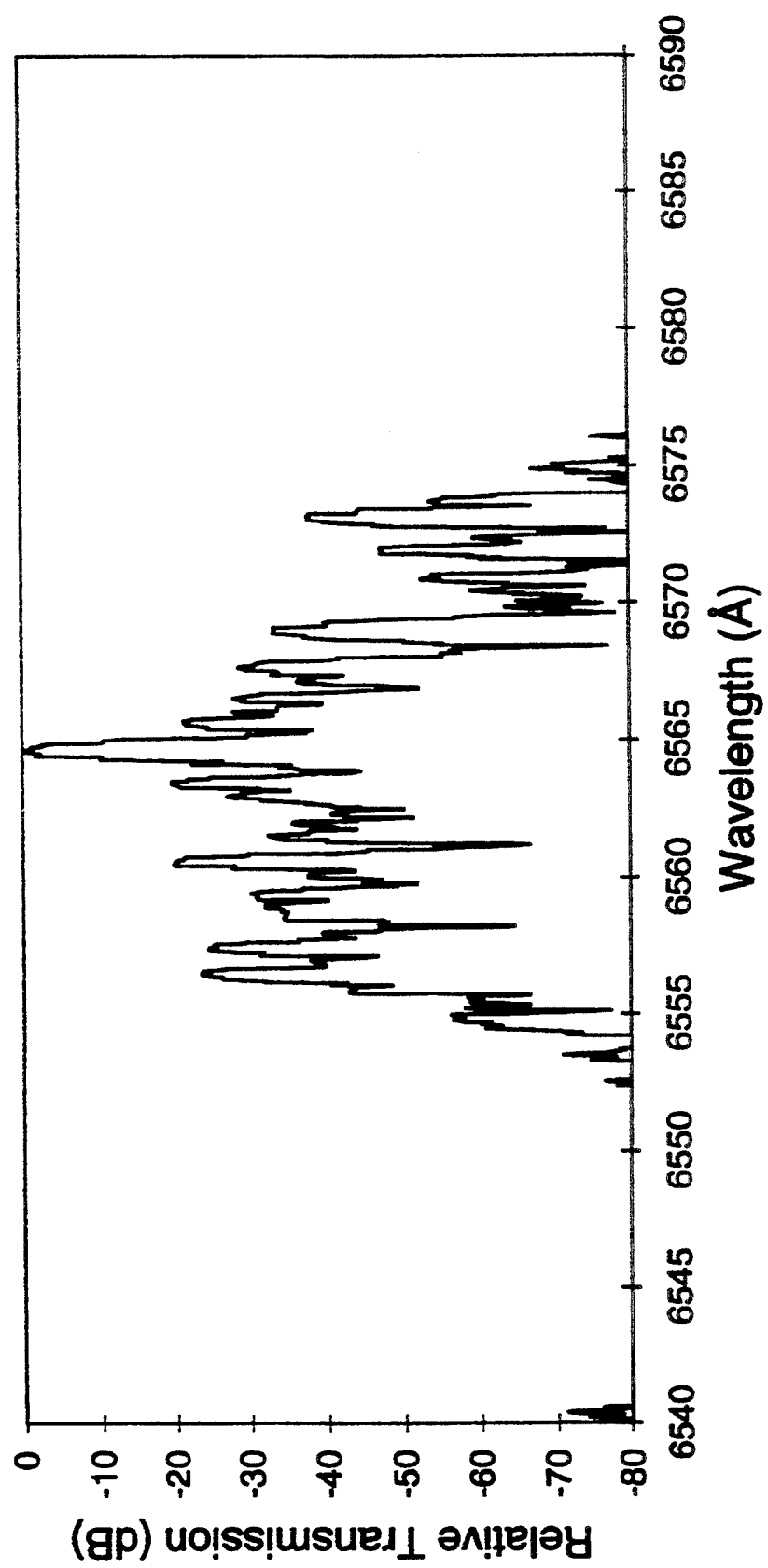
FIG. 21 is a plot of the measured spectral response of a Lyot filter for the $H_\alpha$ wavelength, which represents the best performance in the prior art.

FIGS. 20 and 21 compare the measured spectral response of the holographic filter in accordance with the invention with that of an expensive (approximately $100,000) Lyot filter which represents the current best in filter technology. Both filters have their center wavelengths at the $H_\alpha$ hydrogen emission line at 6562.8 Å (in air—6564.6 Å in vacuum). Using polarized light, the throughput of the holographic filter (percentage of incident light falling on the observer, after beamsplitter, absorption, scattering, and other losses) is 9%, which is comparable to the 11.6% throughput of the Lyot filter (which is a straight transmission device). At −3 dB from the peak, which is the half maximum level, the bandwidths of the Lyot and holographic filters are 0.45 Å and 0.32 Å, respectively, and at −15 dB, the bandwidths are 0.77 Å and 0.70 Å, respectively. Moreover, the holographic filter has higher sidelobe attenuation around the peak than the Lyot filter.

Figure 22:
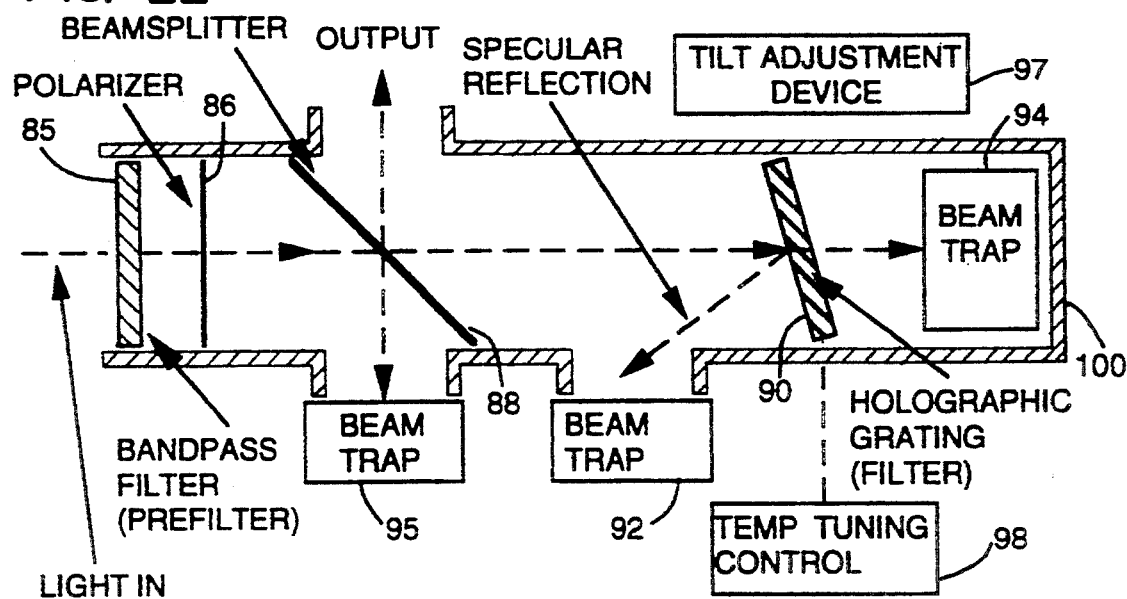
FIG. 22 is a combined perspective and schematic view of a wavelength selective holographic filter system for astronomical observations.

The configuration of a typical high efficiency filter system using a volume holographic grating is shown in FIG. 22. Here, the input light, which may be from a telescope or other optical system, passes through an optional prefilter 85 (about 10–20 Å bandpass) to improve contrast, a polarizer 86, and a beamsplitter 88. At the end of the beam path, light of the selected wavelength is reflected by a narrow bandwidth holographic filter 90, which again is a photorefractive crystal with a stored holographic reflection grating at the desired wavelength. The crystal 90 is preferably anti-reflection coated to reduce reflection loss and improve the signal-to-noise ratio. To further reduce specular reflection noise, the crystal 90 is tilted off-axis when writing the gratings so that they are tilted relative the crystal 90 surfaces. The crystal 90 is then mounted in the housing 100 with the grating planes at normal incidence to the incoming light, but with the surfaces tilted. This orientation directs the specular reflection off axis and into an adjacent beam trap 92. A beam trap 94 is also placed behind the holographic filter 90 to absorb transmitted light, and a third beam trap 95 is placed adjacent the beamsplitter 88 to absorb incoming light reflected off its surface. These beam traps 92, 94, 95 absorb unwanted light with minimal scattering to improve the signal-to-noise ratio and contrast of the reflected image. The crystal 90 is mounted in a tilt adjustment device 97, by means of which slight angle changes can be introduced to fine tune the center wavelength of the filter by changing its Bragg matching conditions. The polarizer 86 ensures there is only one reflection off the grating since the tilted (uniaxial) crystal now has two passbands. The reflected signal is directed out by the beamsplitter 88 to the observer or instrumentation. In addition to tilt adjustments of the crystal 90, there is a further tuning capability by a temperature control device 98, such as a thermoelectric device. Because of the extremely narrow wavelength selectivity of the filter, temperature control is used with high precision applications to avoid drifting off the desired wavelength. The elements are shielded from ambient light by a suitable housing 100.

The field of view of the filter is defined as the angular range corresponding to the FWHM of the filter reflectivity with constant $\lambda$. This is defined by the condition $$\Delta k = \frac{2\pi n_0}{\lambda} \left( \sqrt{1 - \frac{\cos^2(\theta - \Delta\theta)}{n_0^2}} - \sqrt{1 - \frac{\cos^2\theta}{n_0^2}} \right) = \frac{\pi}{L}, \quad (43)$$

where L is the thickness of the crystal, $\lambda$ is the wavelength, $n_0$ is the bulk index of refraction of the crystal, $\theta$ is the angle between the direction of the incident light and the crystal surface measured inside the crystal, and $2\Delta\theta$ is the field of view (full angle). Note that $\Delta\theta$ is largest for $\theta = \pi/2$, which is the counterpropagating geometry. For this case, $\Delta\theta = \sqrt{n_0\lambda/L} = 0.0275$ radians for $\lambda = 656$ nm and L = 2 mm, or a full angle of about 3°. For 1° off axis, this field of view drops to 1.7°. If field of view can be sacrificed, the holographic grating can be written for a slight off-axis reflection to eliminate the need for the beamsplitter, but for observational uses (such as with a telescope), the widest possible field of view is usually desirable, which typically calls for on-axis reflection and therefore indicates use of the beamsplitter despite the loss in throughput intensity.

These filters have considerable potential with possible applications in a number of fields requiring sub-Angstrom resolution, such as LIDAR, emission and absorption spectroscopy noise filtering, Raman spectroscopy, and remote sensing.

One specific application of these filters is in solar astronomy, where the previously mentioned $H_\alpha$ hydrogen line at 6562.8 Å (in air) is one of several solar absorption lines of considerable interest to astronomers. The filter system of FIG. 22 with a holographic grating for the $H_\alpha$ wavelength is for this purpose attached to a solar telescope to allow viewing solar flare and prominence activities in real time. In this application the prefilter 85 serves to attenuate excess out of band solar radiation. The field of view of the holographic gratings at the $H_\alpha$ wavelength in counterpropagating geometry is almost 3° full angle, which is considerably wider than the 0.6° arc of the full solar disk.

Figure 23:
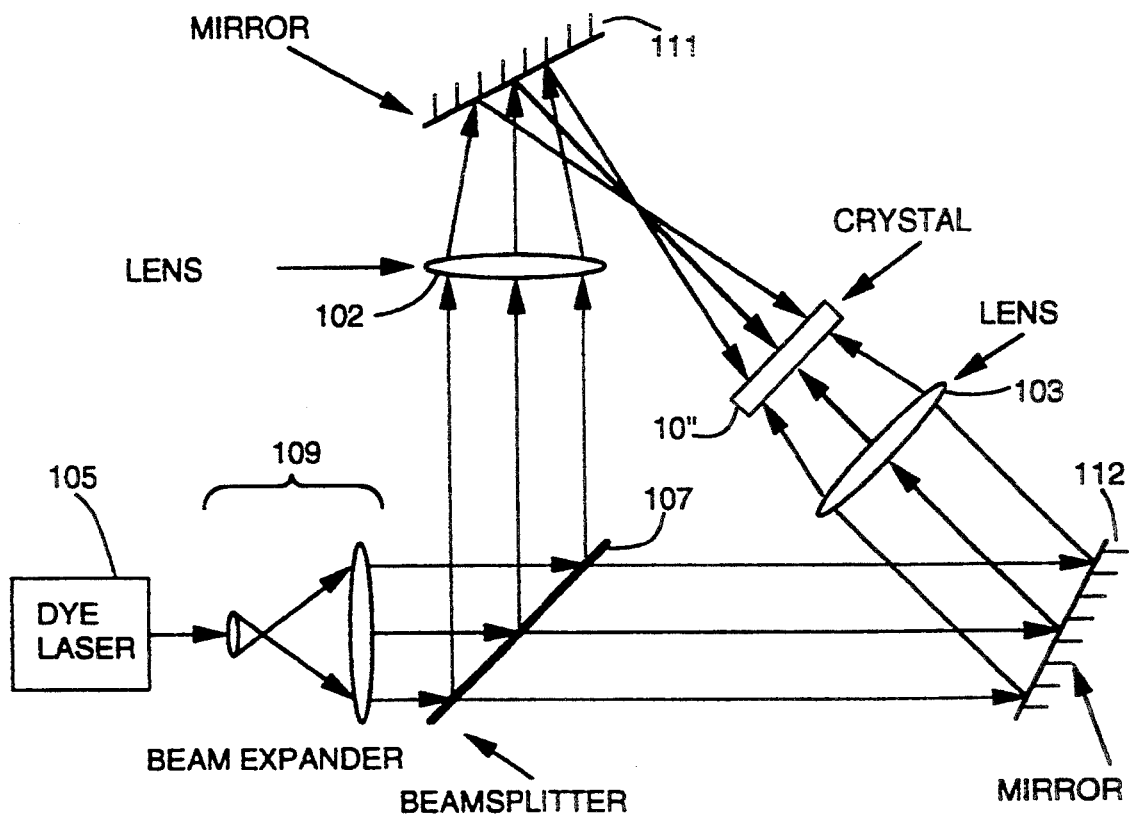
FIG. 23 is a schematic diagram showing one example of writing a holographic $H_\alpha$ filter as set forth in this invention.

Improved results may be obtained by writing the holographic grating with spherical, spatially unmodulated object and reference beams, to generate curved gratings in the crystal. The filters are fabricated with the optical configuration shown in FIG. 23, where a lithium niobate crystal 10″ is exposed with two counterpropagating spherical waves of the desired wavelength from two converging lenses 102, 103. A wavelength stabilized dye laser 105 running DCM Special dye is used as the coherent source. The converging lenses 102, 103 are identical and are placed so that their focal points coincide. A beamsplitter 107 following a beam expander 109 provides equal path lengths for two collimated beams directed off mirrors 111, 112 in counterpropagating relation to the crystal 10″. The f-number of the lenses 102, 103 is matched to the f-number of the telescope to be used, and the object wavefront is a converging spherical wavefront while the reference wavefront is diverging along the same beam path. Typically, lithium niobate disks of up to 35 mm diameter are used to store the holographic gratings, although larger crystals can be used in principle with corresponding longer exposure times or higher laser power requirements. For permanent storage of the gratings, the crystals are fixed and developed using the techniques described above.

With planar gratings, in order to deflect the specular reflection off axis, the original gratings are written with the crystal slightly tilted, which introduces small focus errors from differences in the optical path lengths across the surface of the crystal. Furthermore, the maximum field of view is obtained with the light rays at normal incidence to the grating, which is ensured with curved gratings matched to the f-number of the telescope. In addition, large telescope apertures tend to broaden the filter response (for plane grating filters) because the off-axis radiation is Bragg matched to a different wavelength. This places a limit on the maximum aperture (or minimum f-number) that can be used. (The f-number is defined as the focal length divided by the aperture diameter.) The curved gratings improve the tilt invariance of the filter system by re-focusing the reflected signal toward the same point over the entire crystal, thereby minimizing any wavelength broadening and focusing errors. The curvature of the gratings can be tailored to any f-number of the telescope, whereas planar grating filters are limited to higher f-numbers where the incident wavefronts can be approximated by plane waves. This is a new feature in solar filters.

There are a number of advantages to this filter in addition to simplicity. The reflection coefficient can be increased as the passband is decreased by increasing crystal thickness, which should be at least two orders of magnitude greater than the wavelength. The field of view of about 3° is considerably wider than the 0.6° angle of the sun. With the processing procedure taught here, the filtered image has high efficiency even though the normalized index of refraction variation in the hologram is about $10^{-5}$.

Figure 24:
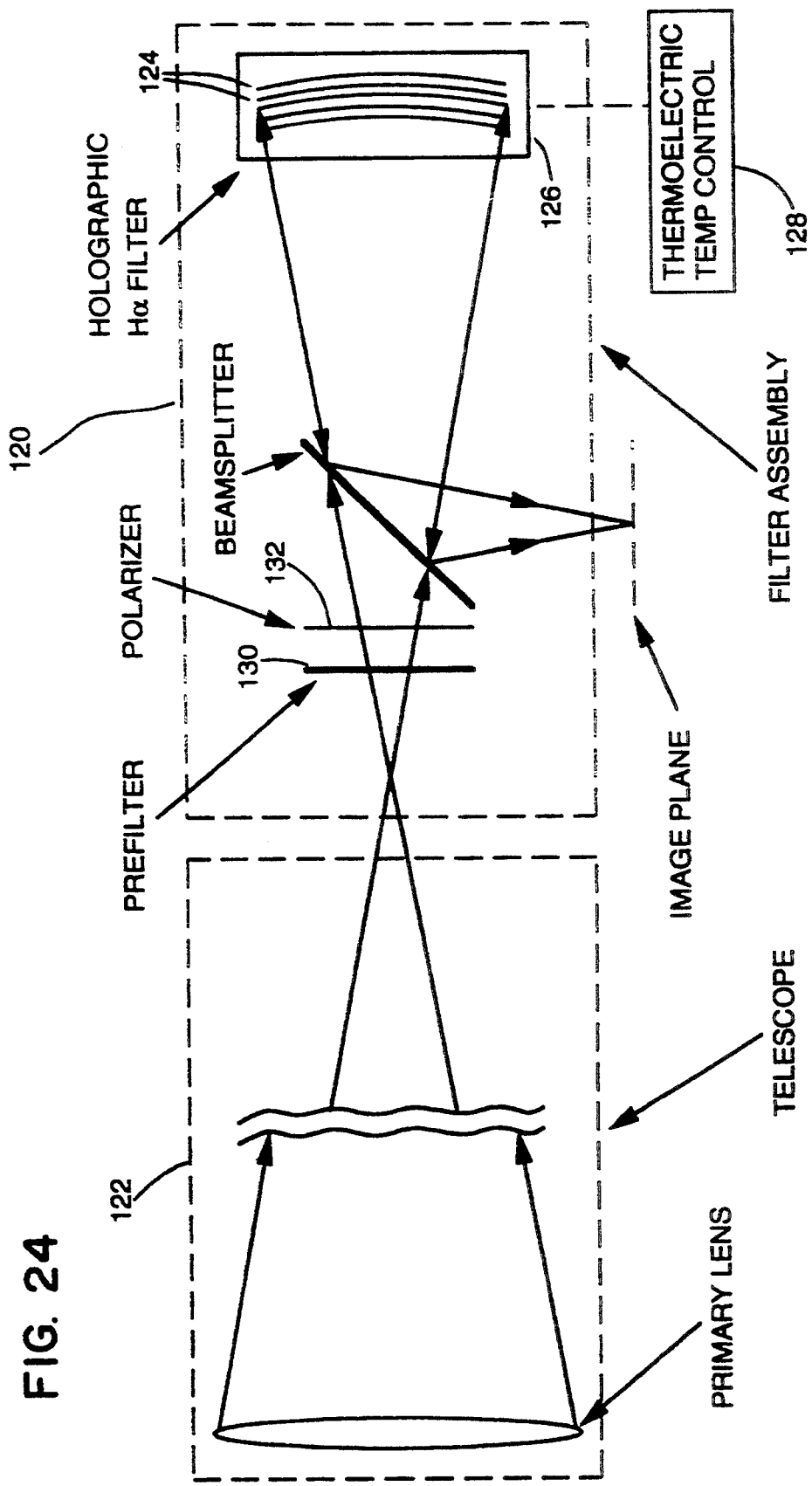
FIG. 24 illustrates how the filter system as set forth in this invention may be used with a telescope for astronomical observations.

The curved grating filter system 120 as used with a telescope 122 is shown in schematic form in FIG. 24. The holographic grating 124 (at the $H_\alpha$ wavelength in the example illustrated in the Figure) within the holographic filter 126 is fine tuned by controlling its temperature with a thermoelectric Peltier device 128. The f-number of the gratings 124 is matched to that of the telescope 122. A prefilter 130 precedes a polarizer 132 which is used to maintain a single unique solution to the Bragg conditions of the grating 124 when the filter 126 is tilted to direct specular reflections off-axis. The polarization direction is parallel to the axis of rotation of the grating. Other solar lines, for example Ca (3933.7 Å in air) and He (5876 Å) can be investigated by interchanging the holographic element 126 with one written at a different wavelength. One can also fabricate a filter with several wavelengths recorded in the same crystal provided the prefilters can accomodate the wavelengths of interest.

The images of the sun observed with this holographic $H_\alpha$ filter mounted in a telescope have contrast and resolution superior to Lyot and other expensive state of the art filters. In addition, this filter has multiline and off-axis reflection capabilities that cannot be realized with filters presently available.

Holographic Optical Elements

Another application of the technology used in the holographic filter is constructing holographic optical elements, i.e. storing converging or diverging mirrors, or any desired optical transfer function in the crystal. These holographic elements reflect only for the specific wavelengths used in writing the holograms, passing all other wavelength radiation.

The holographic mirrors are prepared in a similar method as the curved grating filters in the previous example. The desired incident and reflected wavefronts are used as the object and reference beams in writing the hologram. In the simplest example just presented for the curved grating $H_\alpha$ filter, the incident (reference) wavefront was a diverging spherical wave and the reflected (object) wavefront was a converging spherical wave retracing the incident wavefront. Two lenses were used in that example to generate the desired wavefronts. In general, any wavefront transfer function can be stored by using the appropriate incident and reflected wavefronts to record the holographic gratings. Off-axis (i.e. non-counterpropagating) writing beams can be used if the field of view can be sacrificed.

Figure 25:
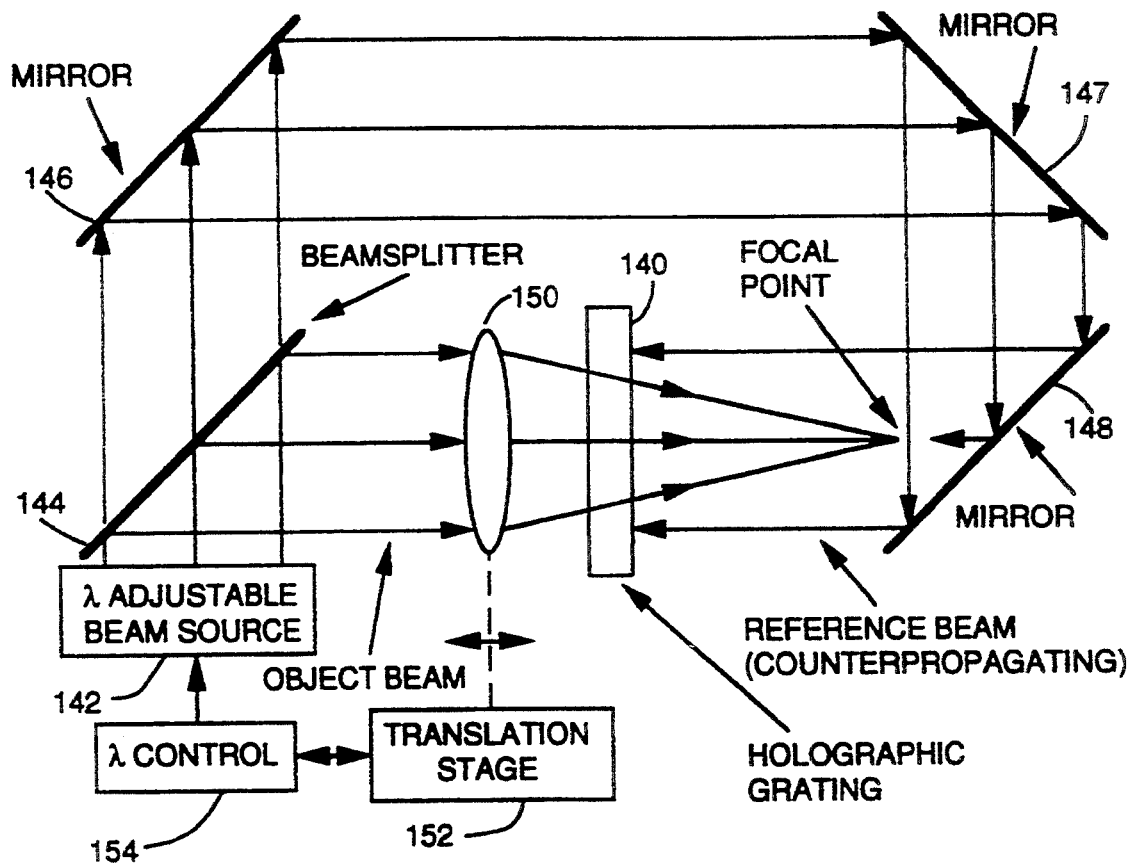
FIG. 25 is a combined schematic and block diagram representation of one manner in which a holographic lens with a wavelength-dependent focal point may be written.

Multiple wavelengths can be recorded in the same crystal, each with its own focal length and beam direction. A wavelength-dependent focal length holographic optical element 140, one that can be used to direct the readout laser in a compact disc player, for example, may be written by the assembly shown in FIG. 25. A plane reference wave and a converging and counterpropagating spherical wave are used so the element 140 reflects the incident plane wave and converges it to a focal point. Light from a wavelength-controlled coherent source 142 is divided by a beamsplitter 144 into two plane waves, with one being the reference beam and directed off a sequence of mirrors 146, 147, 148 onto the element 140 from one side. The other beam is directed through a lens 150 to be the object beam, impinging on the element 140 from the counterpropagating side. The planar and spherical waves provide reflective images that focus on a predetermined point for each position of the lens 150. The focal lengths of each grating of different wavelength are shifted by mounting the lens 150 on a translation stage 152 and moving it in small increments for each wavelength under control of a controller 154 which also steps the wavelength. In this way, the holographic element 140 comprises a mirror which is constructed with a progression of focal points, each with its own unique wavelength, along the optical axis of the lens 150. The holographic patterns are fixed and developed as previously discussed.

Figure 26:
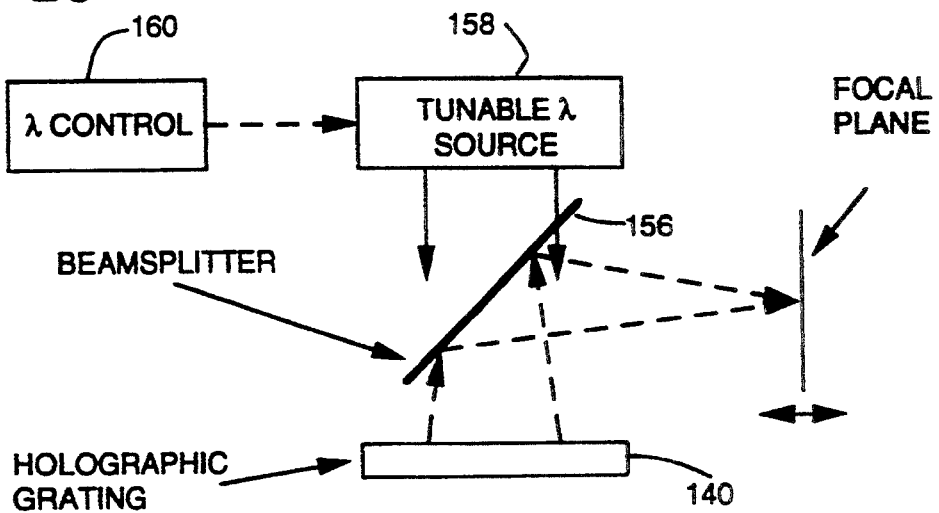
FIG. 26 is a simplified perspective view of a multi-hologram focusing lens system with electronic control of the focal point by varying the illumination wavelength.

In a readout operation, as shown in FIG. 26, the element or crystal 140 is illuminated through a beamsplitter 156 by a tunable wavelength source 158, which may for example be a laser diode whose wavelength depends on the drive current as determined by a wavelength control 160. The crystal 140 reflects the signal so it converges at one of the predetermined focal points. Thus this system provides an optical source with an electronically controllable variable focal point with no moving parts. This is useful in such applications as the focus servomechanism in a compact disc player.

Figure 27:
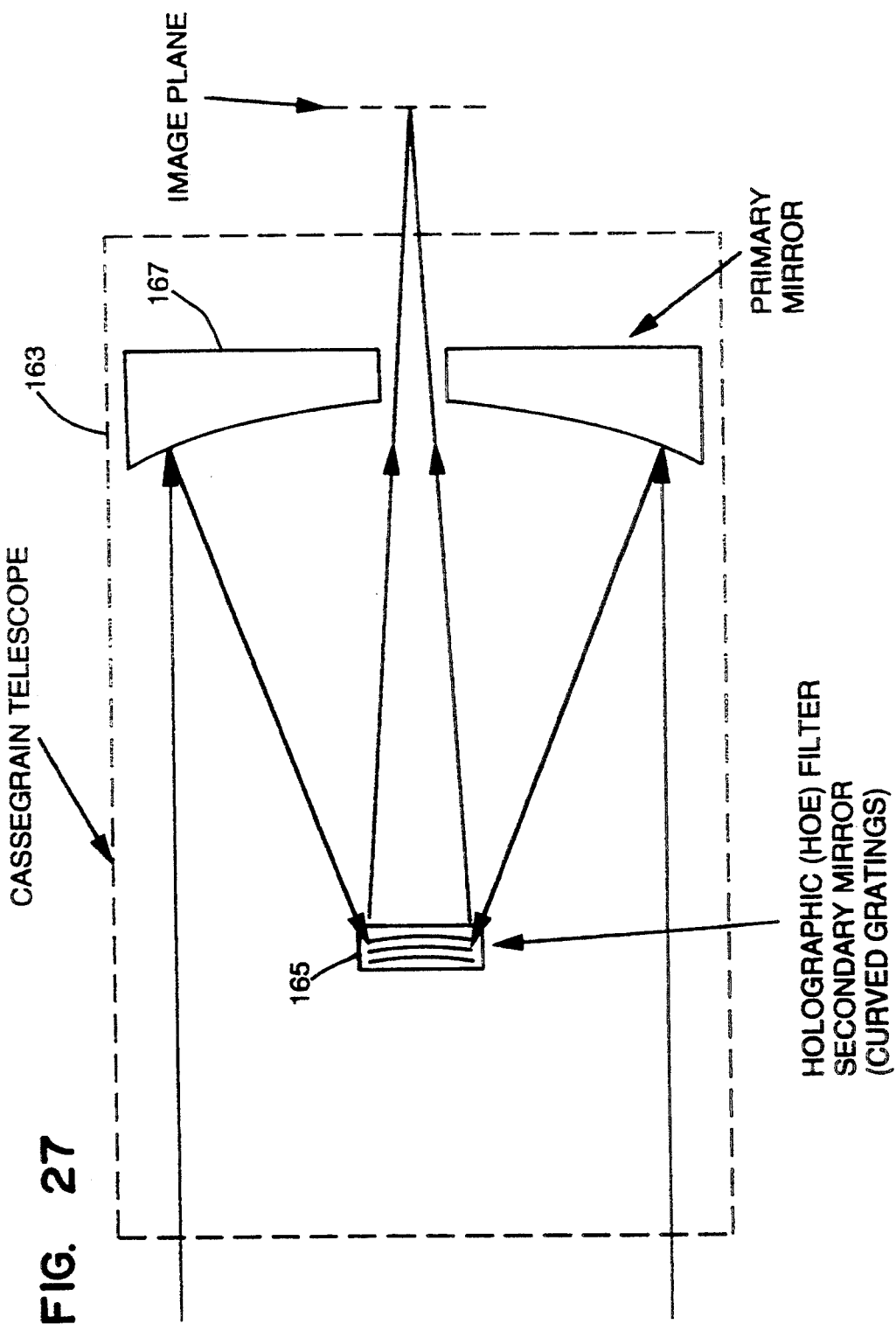
FIG. 27 is a schematic diagram of a portion of a Cassegrain telescope with an integrated holographic optical element which acts as a narrow band filter as well as a curved mirror.

Holographic optical elements in accordance with the invention are, if desired, extremely wavelength selective, reflecting only the wavelengths in a narrow band less than 1Å wide, depending on the thickness of the hologram. As noted before, such a system is not limited to generating a converging spherical wave, but can be encoded with any wavefront during recording. By combining this application with the previously described narrow band filter, the frequency selective holographic optical element can be used as one of the elements in a telescope, creating a fully self-contained narrow band observing system for astronomy, remote sensing, or other applications. An example of such a system is shown in FIG. 27, in which the secondary mirror in a Cassegrain telescope is replaced with a holographic mirror 165 with narrow wavelength response. Light off the primary mirror 167 is both filtered and reflected in to the image plane by the holographic secondary. This method also eliminates the need for the beamsplitter in the previously described holographic filter example, thereby increasing optical throughput by approximately a factor of four.

Precision Frequency Lasers

Figures 28, 29:
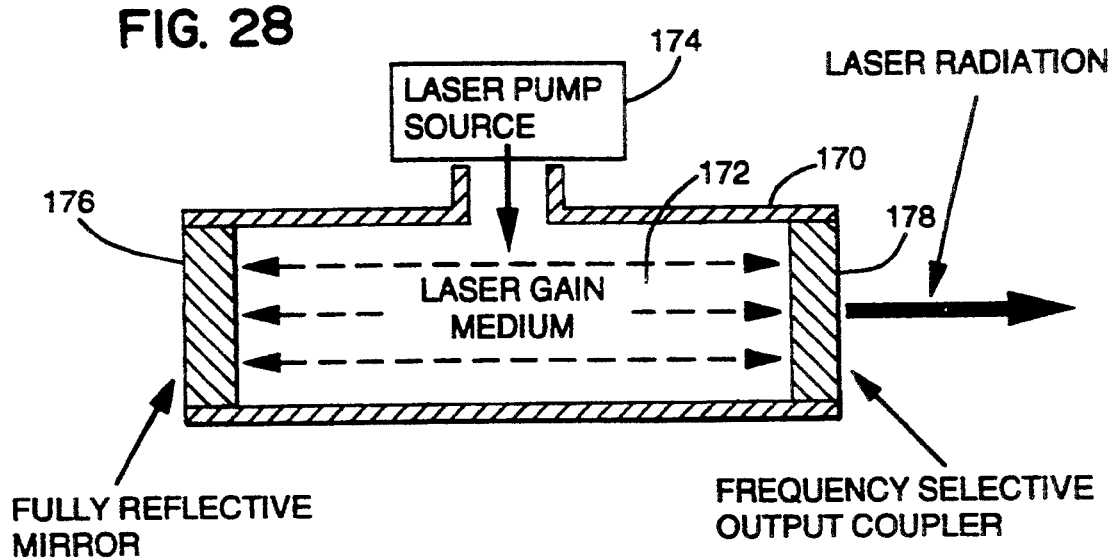
FIG. 28 is a simplified block diagram showing the use of a frequency selective output coupler in a laser system in accordance with this invention.
FIG. 29 is a diagram of a distributed feedback laser with the reflection gratings written in a photorefractive material, which is also doped to make it a gain medium for the laser.

A narrow linewidth holographic mirror is used to passively control and lock the output wavelength of a laser in this next example. Such a laser could be useful in spectroscopy, telecommunications, or other applications requiring precision wavelength sources. A generic schematic of a laser 170 (Fabry-Perot laser) is shown in FIG. 28. A laser gain medium 172 is pumped by an external source 174, creating an abundance of excited states and optical gain. Optical feedback in the cavity between a fully reflective mirror 176 and a partially reflective, frequency-selective holographic output coupler 178 induces stimulated emission of the excited atoms, resulting in a coherent laser output that is emitted through the output coupler 178. The frequency selective output coupler 178 incorporating a frequency selective hologram is used to accurately set the wavelength of the output over the gain spectrum of the gain medium.

Many applications require extremely narrow laser wavelength tolerances. The wide gain curve of most semiconductor lasers results in a wide range of wavelengths at which the laser can operate, so temperature or current variations (such as from modulating the laser) cause the output wavelength to change. The current art includes use of etalons, high Q cavities, and frequency selective gratings to narrow the linewidth of a laser and to lock its output to a precise wavelength. Many of these systems used today have disadvantages of complexity, low reliability, or high cost.

The frequency selective property of a holographic mirror is used to define and stabilize the wavelength of a laser and reduce its linewidth by replacing one of the output mirrors with the holographic element 178. The wavelength of the holographic element can be set to the desired point, and it will then reflect and hence induce lasing only within its narrow band. Therefore, the holographic element serves as both a reflector and wavelength defining device that provides the necessary reflection and transmission functions for lasing. The wavelength accuracy and tolerance of this device is considerably narrower than what could be achieved using current technology. Moreover, it is a simple device with no moving parts.

Another advantage of holographic mirrors for some lasers is reduced alignment requirements. In a conventional laser with standard reflective mirrors, each one needs to be aligned at just the right angle to define the cavity. With holographic mirrors, the system, including the gain media and photorefractive crystals, is assembled and the writing beams are directed along the cavity in the desired directions, where they write the reflection gratings in the photorefractive crystal so that they perfectly define the cavity.

An extension of the holographically coupled laser described previously is a fully self-contained, integrated laser 180 with photorefractive reflection gratings. The device, shown in FIG. 29, is a distributed feedback laser comprising a photorefractive crystal 182, such as Fe-doped $LiNbO_3$, with counterpropagating reflection mode gratings 184 running along its entire length. In addition, the material is doped with a substance, such as erbium (Er) or neodymium (Nd), which causes the host photorefractive material 182 to become an active laser gain medium as well so that it will lase when pumped by the optical radiation 186. With the addition of another dopant such as MgO, intracavity frequency doubling can also be performed simultaneously in the same package.

Wavelength Division Multiplexing

One of the most promising telecommunications technologies of the future is wavelength division multiplexing, or transmitting information over optical fibers with multiple, closely spaced wavelength channels in a single fiber. However, this method has been hampered by lack of a suitable filtering system to combine (multiplex) and separate (demultiplex) the various wavelength channels with sufficient stability and selectivity. Using current technology, a maximum of about 15 channels at wavelength separations of approximately 2 nm/channel have been successfully wavelength multiplexed so far in a single optical fiber. Volume holographic reflection gratings provide a new answer to this multiplexing/demultiplexing problem.

A series of reflection mode holograms at different wavelengths is written fixed, and developed in a photorefractive crystal 190 such as $LiNbO_3$. Each different wavelength hologram 192a, 192b, etc. at wavelengths $\lambda_1, \lambda_2, \ldots \lambda_n$, respectively, is recorded at a different position or with a different angle, as shown in schematic form in FIG. 30. Note that the optical sources and other equipment have been omitted from the diagram for simplicity. The reflection gratings 192a, 192b, etc. are written so that the reflected beams are collinear in the crystal 190. When inputs are supplied by a number of independently modulated lasers operating at these wavelengths $\lambda_1, \lambda_2, \ldots \lambda_n$, all of the input signals will be combined, or multiplexed, into a multi-wavelength, collinear beam which can be directed into an optical fiber by the fiber coupler 194. For the wavelength bands to be spaced very close together to take advantage of the capabilities of this invention, for example, 2 Å, accurate sources such as the holographic mirror semiconductor lasers just described are usefully employed.

At the receiver end, another fiber coupler 196 directs the light into a similar crystal 198 with spatially distributed holographic gratings 200a, 200b, etc., except that it is run in reverse to separate (demultiplex) the various wavelength components. Individual reflection mode gratings corresponding to the wavelengths $\lambda_1, \ldots \lambda_n$ are used to reflect their respective signals off axis and into their output ports. Since the holographic gratings have wavelength bandwidths on the order of 0.5 Å, they can resolve individual signals placed only a couple of Angstroms apart. This translates into very large information carrying capacity within the passband of the optical fiber, where hundreds or thousands of optical channels can be supported in a single fiber.

A different wavelength division multiplexing scheme is shown in FIG. 31. At the multiplexer end, wavelength multiplexed plane holograms are written with different reflection directions for each wavelength in a photorefractive crystal 202. Each different wavelength mode signal is provided by a precision frequency laser 204 such as the one described above, coupled through a collimating gradient-index (GRIN) lens 205. The lasers are mounted individually in a frame so that all of them will be directed at the photorefractive crystal multiplexer 202 with the proper individual orientation. The reflected multi-wavelength beam is directed into a single optical fiber link 208 by the GRIN lens 207.

At the receiver, another GRIN lens 210 is used to collimate the output signal from the fiber 208 and direct it to another photorefractive crystal 214 similar to the multiplexer, except that it is written with curved gratings as in the Hololographic Optical Element example to focus each reflected signal to its respective photodiode 216. The photodiodes are small, inexpensive, and arranged in a simple, standardized array that can be mass-produced on a single wafer, or any other array configuration that one desired.

Other Applications

Variations of the specific examples of photorefractive filters and reflectors just described can serve as the central characteristic element for a variety of other novel systems and applications. The orthogonal data storage device can be used as part of a high capacity digital memory system with parallel addressability. Digital data in the form of holograms is stored in the photorefractive crystal using the orthogonal data storage technique and read out by scanning through various wavelengths. Moreover, limitations imposed by the relatively limited resolutions of available spatial light modulators can be overcome by recording multiple, small surface area holograms across the face of the crystal. In this way, this system is not restricted to the limited resolution of presently available spatial light modulators. Similarly, detector arrays can be used that are well within current state of the art capability at reasonable cost. A number of techniques thus present themselves for reading out the multiple images at the different incremental areas. A single light source or an array of light sources can be used, although a capability for wavelength tuning within a chosen range will be required to take full advantage of the recording capacity. Relative movement between the recorded images on the one hand and the light source and detector array on the other can be effected by translation of the crystal by use of a beam deflection system, or by translation of the light source and detector, among other approaches. One hundred spatially multiplexed images can be recorded in about 1 $cm^2$ of crystal, the only spacing or guard band between the images being that required to allow for slight spreading of the images due to diffraction in the volumetric crystal.

The advantages of this high capacity data storage for entertainment-oriented recordings will be evident to those skilled in the art. Because such recordings are read out serially, and because data compression and decompression techniques can be used to increase capacity, a crystal 2 to 3 cm on each side can serve as the storage element for several hours of high definition television playback, with a relatively low cost readout system. Each image that is read out at a particular wavelength can, for example, be dumped into one of two buffers, the other of which is being read out for the real time display. This example assumes 1,000 holographic images of 100 incremental areas each, each containing $10^6$ bits of data with the data being compressed in a 10:1 ratio, and with a bit rate of $10^9$ per second.

The correlator system described earlier, which uses orthogonal data storage of Fourier transform holograms as the key storage element, can be used as part of an automatic target or object recognition system to compare input images with stored image "templates" and evaluate their degree of similarity with the stored templates through the correlation operation. Further applications of such systems include instrumentation for defect detection (such as in semiconductor device fabrication), area surveys, and pattern recognition.

The narrow linewidth filters fabricated from volume holograms, with their tuning capabilities, are the key elements to the availability of a new generation of spectrometers, laser spectrum analyzers, imaging spectrometers, instrumentation for materials analysis, and optical tuners for wavelength division multiplexing systems. The tuning properties of the gratings in these filters are controlled by changing the angle of incidence, the temperature, or the voltage across the crystal. A specific wavelength out of a multi-wavelength source with closely spaced wavelength channels can be selected using a volume holographic filter and conventional detector. The filter can also be used to select or reject a narrow band of light, such as in LIDAR (Laser Detection and Ranging), Raman spectroscopy, sensor protection, optical communication decryption, and noise filtering. Multiple filters with slight wavelength offsets can be written in a single volume to analyze wavelength shifts in sources such as laser diodes or to characterize emission lines in a spectrometer. These filters can also be used to lock the output wavelength of relatively inexpensive Fabry-Perot laser diodes to a fixed wavelength, achieving performances matched only by more expensive distributed feedback lasers.

Hololographic mirrors, which reflect at only the predetermined wavelength and wavefront pattern used during writing, can be used as frequency-selective optical elements or couplers. A laser using such a component as the output coupler has been described earlier. A common semiconductor diode laser can be converted to a high quality source by coupling it to an external cavity defined by a narrowband holographic mirror. The holographic mirror also can be used to construct lasers where the mirror alignment can be defined after fabrication by passing light from an external laser through the cavity in the desired paths to write the holographic reflection gratings. An example of a laser device that can benefit from this capability is a ring laser gyroscope or laser interferometer.

The wavelength multiplexing and demultiplexing system concept is central to a number of new computer and communications systems with channel loading and signal-to-noise characteristics that are superior to current systems. In digital cable TV, hundreds of wavelength channels can be carried in a single fiber and subsequently selected by using tunable, narrow linewidth (sub-Angstrom resolution) holographic filters. In local area or metropolitan area networks, these holographic filters will make possible true wavelength division multiplexing with hundreds of wavelength channels within the transmission bands of optical fibers and amplifiers. In undersea or long distance terrestrial fiber optic links, additional channel capacity can be added to existing systems by using the wavelength division multiplexing method set forth in this invention to multiply the current capacity by a factor of 10 or more. An optical computer communications bus, again with wavelength multiplexed data channels, can also be constructed using this technology.

The metastable holographic image written in a photorefractive crystal is useful even though it will attenuate gradually with time, under exposure to ambient light or readout illumination in a manner that varies monotonically in relation to temperature and light intensity. The wave energy needed to generate the hologram is of the order of 500 $J/cm^2$, and the resultant diffraction efficiency is at a peak because there is no attenuation due to fixing or developing. In comparison, the readout beam energy is of the range of 0.01 to 100 $W/cm^2$, and can be of short duration, such that the diffraction efficiency of the hologram is only fractionally diminished on each readout. A given crystal can therefore be prepared as a holographic filter at a chosen wavelength, used a number of times, and rewritten as a holographic filter at a different wavelength. Where a metastable hologram is to be strengthened or revised, as in a refresh operation for data storage, a recording as well as a readout capability is needed. However, more illumination energy is needed to revise the hologram than merely to restore its diffracted intensity after readout.

Although a number of variants and expedients have been mentioned above, it will be appreciated that the invention is not limited thereto but encompasses all forms and exemplifications within the scope of the appended claims.

What is claimed is:

1. The method of recording holograms in a photorefractive medium comprising the steps of:
    generating a plurality of different distributed electron charge reflection holograms at different non-harmonically related wavelengths in the medium; and
    converting the holograms into a plurality of spatially varying index of refraction patterns in the medium that cannot be erased by illumination.

2. The method as set forth in claim 1 above, wherein the holograms have a half-life at ambient temperature in excess of 50 years and a coupling coefficient $k_{FIXED}$ of greater than 1 cm$^{-1}$.

3. The method as set forth in claim 2 above, wherein the medium has a thickness dimension inversely proportioned to the wavelength separation and the holograms are generated by counterpropagating object and reference beams into the medium substantially normal to the thickness dimension.

4. The method as set forth in claim 3 above, wherein the holograms are further generated by modulating the object beam impinging on the medium with a selected image for each wavelength, and wherein the medium has a C-axis and the beams are counterpropagated parallel to the C-axis.

5. The method as set forth in claim 4 above, wherein the distributed electron charge holograms are generated with the medium being electrically shorted, and the holograms are then stabilized by first converting the distributed charges to ionic charge patterns while the medium is electrically shorted, and then developing the ionic charge patterns while the medium is electrically open.

6. The method of recording holograms in a photorefractive medium comprising the steps of:
    illuminating the medium at a given angle with a reference beam and an interactive subject beam to effect migration of charges in the medium into an interference grating, the reference beam and the subject beam being at a same first frequency; and
    repeating the illuminating step successively at the given angle with beams at other frequencies different from the first frequency to form other interference gratings, wherein the diffusion field $E_d$ is approximately equal to the limiting space charge field $E_q$.

7. The method as set forth in claim 6 above, wherein the reference beam and subject beam are directed into the medium in opposite directions, and wherein the method includes the step of converting the migrated charges to ionic displacements by heating the medium and neutralizing the migrated charges.

8. The method of recording data in a thick photorefractive crystal comprising the steps of:
    generating a plurality of holographic interference pattern images within the crystal, each of the interference patterns having a different wavelength, but the fringes defined by the interference patterns lying substantially parallel to a common axis, the amount of illumination energy varying in decreasing fashion as successive images are generated;
    fixing all the interference pattern images concurrently and
    developing the interference pattern images concurrently, such that all images provide substantially equal diffraction efficiency on readout.

9. The method as set forth in claim 8 above, wherein the illumination energy is varied by decreasing the illumination duration.

10. The method of generating an improved, stable, high diffraction efficiency volumetric hologram in a photorefractive crystal comprising the steps of:
    recording at least one electronic grating in the crystal while maintaining the crystal shorted;
    compensating the charge distribution of the electronic grating with an ionic grating while maintaining the field in the crystal shorted, and
    erasing the electronic grating while maintaining a large dc field in the crystal.

11. The method of claim 10 above, wherein the crystal is heated to a level at which ions are thermally mobile during the recording step such that the compensating step is effected simultaneously with recording.

12. The method of creating substantially permanent holograms in a photorefractive crystal comprising the steps of:
    electrically shorting the crystal;
    neutralizing space charge fields by heating the electrically shorted crystal;
    generating a metastable electronic space charge hologram by exposing the crystal to light in a selected pattern while maintaining the crystal electrically shorted;
    replicating the created metastable hologram in the form of a distributed ionic space charge pattern by heating the crystal while maintaining it electrically shorted; and
    illuminating the crystal with uniform high intensity electromagnetic wave energy while maintaining the crystal open circuited to erase the metastable hologram and leave only an optically readable ionic space charge pattern.

13. The method as set forth in claim 12 above, wherein the crystal is illuminated in the presence of an electrical field.

14. The method as set forth in claim 12 above, wherein the crystal geometry and electrical fields are such that the diffusion field is less than the limiting ionic space charge field and the limiting electronic space charge field is less than the sum of the photovoltaic field and the diffusion field.

15. The method as set forth in claim 14 above, wherein the crystal is chosen such that there are more than $10^{17}$ thermally mobile ions per cm$^3$ and dopant in excess of 0.01%.

16. The method as set forth in claim 15 above, wherein the metastable hologram is generated along the C-axis of the crystal by counterpropagating coherent monofrequency reference and image beams into the crystal.

17. The method as set forth in claim 16 above, wherein multiple holograms are generated by using successive monofrequency beams of varying frequency with respect to each respective generated hologram and having random phase relationships to each other.

18. The method as set forth in claim 17 above, wherein the monofrequency beams have bandwidths of less than 2 Å, wherein the successive beams are uncorrelated in phase relative to each other, and wherein the center frequencies of the monofrequency beams are separated by less than 10 Å.

19. The method as set forth in claim 18 above, wherein the holograms are generated by directing the image beam for each monofrequency through a transmissive optical pattern disposed adjacent the crystal.

20. The method as set forth in claim 14 above, wherein the crystal is chosen to have a concentration of donors in excess of $10^{17}$ per $cm^3$ and sufficient traps to generate photovoltaic fields of $>10$ kV/cm, and wherein the dopant level is in excess of 0.01%.

21. The method as set forth in claim 20 above, wherein in the neutralizing step the crystal is heated to approximately 230° C., wherein the step of electrically shorting the crystal when recording metastable holograms comprises coating the crystal with a conductive transparent material, wherein the step of replicating the metastable holograms comprises heating the crystal to about 130° C. and further including the step of illuminating the crystal while allowing a high level photovoltaic field to develop within the crystal.

22. The method as set forth in claim 12 above, wherein the steps of generating a metastable electronic space charge hologram and replicating the metastable hologram are carried out sequentially.

23. The method as set forth in claim 12 above, wherein the steps of generating and replicating the metastable hologram are carried out simultaneously.

24. The method of converting metastable gratings in a photorefractive medium to substantially permanent gratings comprising the steps of:
generating at least one electron charge grating in a medium having a geometry and dopant concentration and with electrical characteristics such that the limiting electronic space charge field $E_q$ is comparable to the diffusion field $E_d$;
fixing an ionic charge grating in the medium by heating the medium to a thermal state of ion mobility; and
developing the at least one grating by illuminating the medium with electromagnetic wave energy while maintaining $E_q$ comparable to $E_d$.

25. The method as set forth in claim 24 above, wherein the grating is generated by writing to form a distributed electron charge pattern, and then heating the medium for a time sufficient to establish an ionic charge pattern that equalizes the electron charge pattern.

26. The method as set forth in claim 25 above, wherein the writing is carried out with the medium in an electrically shorted condition, and wherein the medium is heated while being held in electrically shorted condition.

27. The method as set forth in claim 26 above, wherein the developing step is carried out with the medium in an open circuit condition and with an electric field.

28. The method as set forth in claim 27 above, wherein the substantial electrical field is generated internally within the crystal through the photovoltaic effect.

29. The method as set forth in claim 27 above, wherein an external electrical field is applied during the developing step, while the crystal is illuminated with light.

30. The method as set forth in claim 27 above, wherein the at least one grating is written in a transmission mode geometry.

31. The method as set forth in claim 27 above, wherein said at least one grating is written at ambient temperature in a reflection mode geometry.

32. The method as set forth in claim 31 above, wherein a number of gratings are written, each by the use of counter-propagating beams, and each at a different wavelength.

33. The method as set forth in claim 24 above, wherein the at least one grating is generated by writing the grating at an elevated temperature while the crystal is short circuited to simultaneously create an electron charge pattern and compensating ionic pattern.

34. The method as set forth in claim 24 above, including the steps of sequentially writing a number of gratings at different wavelengths in the medium, and then simultaneously fixing the gratings by heating the medium.

35. The method as set forth in claim 34 above, wherein the gratings are sequentially written with the medium in a shorted condition, and the gratings are then fixed in a shorted condition.

36. A method for generating permanent ionic gratings in a photorefractive material by the steps of:
generating at least one hologram in a reflection mode geometry by writing the hologram at an elevated fixing temperature while the crystal is short circuited to simultaneously create an electron charge pattern and compensating ionic pattern;
cooling the material down to below the fixing temperature; and
developing the at least one hologram by illuminating the medium with electromagnetic wave energy while maintaining $E_q$ comparable to $E_d$.

37. The method as set forth in claim 36 above, further including the step of inhibiting thermal currents in the path of the written hologram.

38. The method of achieving high conversion efficiency in converting a metastable holographic image, established by electron distribution, in a photorefractive medium to a permanent image, comprising the steps of:
heating the medium while shorted to a level at which ions in the medium are thermally mobile, maintaining the temperature of the medium until ions redistribute to a pattern compensating for the electron distribution, and developing the holographic image by illuminating the medium with radiant energy while establishing an electric field within the medium for a sufficient time to return the electrons to a homogeneous distribution.

39. A method as set forth in claim 38 above, wherein the medium is cooled to substantially ambient temperature after heating, and wherein the electric field is established by a photovoltaic effect in the medium generated in response to the illumination.

40. A method as set forth in claim 38 above, wherein the medium is a photorefractive crystal and the heating is effected while confining the crystal in an electrically conductive wrapping.

41. The method of forming an enhanced holographic image in a crystal which is photorefractively sensitive to electromagnetic wave energy in a predetermined range, comprising:

generating an electric field variation $E_1$ in the crystal by illuminating the crystal with beams of electromagnetic waves to form an interference pattern in the crystal;

concurrently maintaining the crystal in an electrically shorted state;

inducing maximum photovoltaic current in the crystal;

and migrating electrons within the crystal to trapping positions within the crystal until a space charge field is defined in accordance with the photorefractive property of the crystal.

42. A method as set forth in claim 41 above, wherein the crystal includes a dopant, geometry and photovoltaic property selected to provide a trap density $N_A$ and a photovoltaic constant such that the photovoltaic field developed in response to illumination is approximately equal to the limiting space charge field such that the coupling constant $\kappa$ increases substantially linearly with dopant level.

43. A method as set forth in claim 41 above, wherein the crystal is photorefractively sensitive to wavelengths $\lambda$ in the range of 400 to 800 nm, and the grating wavelength $\Lambda$ is approximately equal to $\lambda/2n_0$, wherein $n_0$ is the bulk index of refraction.

44. A method as set forth in claim 43 above, wherein the electric field variations are generated by counter propagating monochromatic beams of the same wavelength and substantially equal intensity.

45. A method as set forth in claim 41 above, wherein the step of generating an electric field variation is defined by the relation $$E_1 = m \frac{E_q (E_{pv} + iE_d)}{E_d + E_q},$$

wherein m is the modulation index, $E_q$ is the limiting space charge field and $E_d$ is the diffusion field, $E_{pv}$ is the photovoltaic field and $E_{pv}$ is greater than 1 kv/cm.

46. A method as set forth in claim 45 above, wherein $$E_d = \frac{k_B T K}{e},$$

with $k_B$=Boltzmann's constant, T=temperature in degrees Kelvin, e=the charge of an electron, $K=2\pi/\Lambda$, wherein $\Lambda$ is the grating wavelength and $E_d$ is approximately equal to $E_q$.

47. A method as set forth in claim 46 above, wherein $$E_q = \frac{eN_A}{K}\left(1 - \frac{N_A}{N_0}\right),$$

and $\epsilon$=permittivity, $N_A$=ion or trap density and $N_0$=the total density of photorefractive species, and wherein the ion or trap density $N_A$ is in excess of $10^{17}$ ions/cm$^3$.

48. The method of recording a holographic image in a photorefractive crystal comprising the steps of:

establishing steady state electric field potentials across the crystal;

generating an optical interference pattern within the crystal in the photorefractivity sensitivity band of the crystal to incident light, establishing $E_q$ approximately equal to $E_d$, wherein $E_q$ is a limiting space charge field and $E_d$ is a diffusion field at ambient temperature, and redistributing photoexcited electrons within the crystal until a space charge field is established.

49. The method as set forth in claim 48 above, wherein the material is a crystal having in excess of $10^{17}$/cm$^3$ electron donors and further comprising the steps of:

redistributing electrons in the crystal in response to the interference pattern until electron trapping sites are substantially occupied, and redistributing ionic charges within the crystal while inhibiting the existence of a dc field across the crystal.

50. The method as set forth in claim 49 above, further comprising the step of equalizing the electron distribution in the presence of an electric field.

51. The method of recording a hologram in a photorefractive member comprising the steps of:

covering the surface of the member with a transparent conductive coating, illuminating the interior of the member through the coating, and maintaining $E_{d \approx E_q}$ member, wherein $E_q$ is a limiting space charge field and $E_d$ is a diffusion field at ambient temperature.

52. A method as set forth in claim 51 above, wherein the illumination step comprises directing counterpropagating beams of the same wavelength at the photorefractive member.

53. A crystal of the photorefractive type, comprising: a density ($N_A$) of non-photoactive ions in excess of $10^{17}$ cm$^{-3}$, an electron donor density ($N_D$) in excess of $10^{17}$ cm$^{-3}$, an electron trap density ($N_D^+$) of less than $10^{19}$ cm$^{-3}$, and a hologram therein comprising at least one volumetrically distributed diffraction grating whose grating wavelength is substantially below the wavelength of operation.

54. A crystal as set forth in claim 53 above, wherein the grating has a coupling constant, $\kappa$, greater than 1 cm$^{-1}$, and a stable lifetime at ambient temperature in excess of 50 years.

55. A crystal as set forth in claim 54 above, wherein the crystal has a thickness, d, and contains a number, y, of diffraction gratings of different grating wavelengths coextensively distributed throughout the crystal in proportion to the thickness.

* * * * *

UNITED STATES PATENT AND TRADEMARK OFFICE
CERTIFICATE OF CORRECTION

PATENT NO. : 5,440,669

DATED : August 8, 1995

INVENTOR(S) : Rakuljic et al.

It is certified that error appears in the above-identified patent and that said Letters Patent is hereby corrected as shown below:

In column 3, line 43-44, " $(\frac{sI}{h\omega}+\beta)$ " should read, -- $(\frac{sI}{\hbar\omega}+\beta)$ --;

In column 3, line 60, "hw" should read --$\hbar$w--;

In column 13, line 22, "hw" should read --$\hbar$w--;

In column 19, line 26, delete "subs the" after the letter "(0)"

In column 19, line 26, insert --subscript denotes the dc term, and the-- after the letter "(0)"

In column 21, line 63, " $\frac{sI}{h\omega}$ " should read -- $\frac{sI}{\hbar\omega}$ --;

In column 22, line 11, " $\kappa p \nu \alpha I_0$ " should read --$k_{pv}\alpha I_0$--;

In column 30, line 57, "$K_i^{(0)} = -K_i^{(0)}$" should read --$k_i^{(0)} = -k_i^{(R)}$ for $k_i^{(0)}$--;

In column 31, line 19, "1" should read --2--;

UNITED STATES PATENT AND TRADEMARK OFFICE
CERTIFICATE OF CORRECTION

PATENT NO. : 5,440,669

DATED : August 8, 1995

INVENTOR(S) : Rakuljic et al.

It is certified that error appears in the above-identified patent and that said Letters Patent is hereby corrected as shown below:

In column 35, line 64, "i(kxx+kyy)" should read --i($k_x$x+$k_y$y)--;

In column 36, lines 4 & 6, "i(kxx+kyy)" should read --i($k_x$x+$k_y$y)--;

In column 47, claim 47, lines 55 & 56, " $\frac{eN_A}{K}$ " should read -- $\frac{eN_A}{\underline{E}K}$ --;

In column 50, claim 51, line 34, "$E_d \cong Eq$ member" should read --$E_d \cong E_q$ in the member--.

Signed and Sealed this

Twenty-first Day of September, 1999

Attest:

Q. TODD DICKINSON

*Attesting Officer*     Acting Commissioner of Patents and Trademarks